US012787540B2

(12) United States Patent
Li et al.

(10) Patent No.: US 12,787,540 B2
(45) Date of Patent: Nov. 3, 2026

(54) ORGANIC ELECTROLUMINESCENT DEVICE AND DISPLAY APPARATUS

(71) Applicant: Kunshan New Flat Panel Display Technology Center Co., Ltd., Kunshan (CN)

(72) Inventors: Guomeng Li, Kunshan (CN); Zhaoyang Xi, Kunshan (CN); Xiaoyu Gao, Kunshan (CN); Lei Sun, Kunshan (CN); Chao Xu, Kunshan (CN); Mengzhen Li, Kunshan (CN)

(73) Assignee: Kunshan New Flat Panel Display Technology Center Co., Ltd., Kunshan (CN)

(*) Notice: Subject to any disclaimer, the term of this patent is extended or adjusted under 35 U.S.C. 154(b) by 1057 days.

(21) Appl. No.: 17/965,251

(22) Filed: Oct. 13, 2022

(65) Prior Publication Data

US 2023/0100309 A1 Mar. 30, 2023

Related U.S. Application Data

(63) Continuation of application No. PCT/CN2021/095371, filed on May 24, 2021.

(30) Foreign Application Priority Data

Aug. 19, 2020 (CN) ........................ 202010839727.4

(51) Int. Cl.
*H10K 50/19* (2023.01)
*H10K 50/12* (2023.01)
(Continued)

(52) U.S. Cl.
CPC .......... *H10K 50/19* (2023.02); *H10K 50/121* (2023.02); *H10K 59/32* (2023.02); *H10K 85/615* (2023.02);
(Continued)

(58) Field of Classification Search
None
See application file for complete search history.

(56) References Cited

U.S. PATENT DOCUMENTS

2016/0308162 A1* 10/2016 Yoo .................... H01L 51/5237
2017/0062750 A1 3/2017 Jung et al.
(Continued)

FOREIGN PATENT DOCUMENTS

CN 105794321 A 7/2016
CN 106206958 A 12/2016
(Continued)

OTHER PUBLICATIONS

The material properties of TBPE by Ossila, screen capture of website, https://www.ossila.com/products/tbpe?_pos=1&_sid=885fcfe40&_ss=r (Year: 2025).*
(Continued)

*Primary Examiner* — Seokmin Jeon
(74) *Attorney, Agent, or Firm* — Maier & Maier, PLLC

(57) ABSTRACT

An organic electroluminescent device and a display apparatus. The organic electroluminescent device includes a first electrode, a second electrode and at least two organic electroluminescent units located between the first electrode and the second electrode. The at least two organic electroluminescent units are arranged in a stacked manner. The at least two organic electroluminescent units include a first organic electroluminescent unit. The first organic electroluminescent unit includes a first light-emitting layer. The first light-emitting layer contains a first host material, a thermally activated delayed fluorescence sensitizer and a first fluorescent dye.

12 Claims, 4 Drawing Sheets

(51) Int. Cl.

| | |
|---|---|
| ***H10K 59/32*** | (2023.01) |
| ***H10K 85/60*** | (2023.01) |
| ***H10K 101/20*** | (2023.01) |
| ***H10K 101/30*** | (2023.01) |
| ***H10K 101/40*** | (2023.01) |

(52) U.S. Cl.

CPC ......... *H10K 85/622* (2023.02); *H10K 85/623* (2023.02); *H10K 85/624* (2023.02); *H10K 85/633* (2023.02); *H10K 85/636* (2023.02); *H10K 85/653* (2023.02); *H10K 85/6572* (2023.02); *H10K 85/658* (2023.02); *H10K 2101/20* (2023.02); *H10K 2101/30* (2023.02); *H10K 2101/40* (2023.02)

(56) References Cited

U.S. PATENT DOCUMENTS

| | | | | |
|---|---|---|---|---|
| 2018/0375058 | A1* | 12/2018 | Kawamura | H01L 51/5221 |
| 2019/0319209 | A1* | 10/2019 | Tanaka | H01L 51/504 |
| 2020/0185616 | A1 | 6/2020 | Baek et al. | |
| 2020/0303656 | A1* | 9/2020 | Fluegge | H01L 51/0067 |
| 2023/0225203 | A1* | 7/2023 | Kakizoe | H10K 85/6572 |

FOREIGN PATENT DOCUMENTS

| | | | |
|---|---|---|---|
| CN | 109378392 | A | 2/2019 |
| CN | 110265562 | A | 9/2019 |
| CN | 110911575 | A | 3/2020 |
| CN | 110911576 | A | 3/2020 |
| CN | 110931649 | A | 3/2020 |
| CN | 110957435 | A | 4/2020 |
| CN | 111916573 | A | 11/2020 |
| TW | I595074 | B | 8/2017 |

OTHER PUBLICATIONS

English translation of KR 2018/0078637 A and the original KR 2018/0078637 A, HeeYeol Kim, Jul. 10, 2018 (Year: 2018).*

International Search Report mailed on Aug. 30, 2021, in corresponding International Application No. PCT/CN2021/095371; 5 pages (with English Translation).

The First Office Action dated Nov. 3, 2021, in corresponding Chinese Application No. 202010839727.4, 16 pages (with Machine-Generated English Translation).

* cited by examiner

ORGANIC ELECTROLUMINESCENT DEVICE AND DISPLAY APPARATUS

CROSS-REFERENCE TO RELATED APPLICATION

This is a continuation of International Patent Application No. PCT/CN2021/095371, filed on May 24, 2021, which claims priority to a Chinese patent application No. 202010839727.4 filed on Aug. 19, 2020, disclosure of which is incorporated herein by reference in its entirety.

TECHNICAL FIELD

The present disclosure relates to the field of organic electroluminescent technologies and, in particular, to an organic electroluminescent device and a display apparatus.

BACKGROUND

Thermally activated sensitized fluorescence (TASF) means that when a thermally activated delayed fluorescence (TADF) material is used as a sensitizer, the energy of a host material is transferred to the TADF material, and then the triplet energy of the host material is returned to the singlet state through a reverse intersystem crossing (RISC) process, thereby transferring the energy to a doped fluorescent dye to emit light. In this manner, a complete energy transfer from the host to dye molecules can be achieved so that traditional fluorescent doped dyes can exceed an internal quantum efficiency limit of 25%.

However, at present, there are serious efficiency and service life decay problems in TASF devices.

SUMMARY

An embodiment of the present disclosure provides an organic electroluminescent device and, in particular, a stacked organic electroluminescent device. Compared with a single-layer device, the stacked organic electroluminescent device can significantly reduce the current density under the same luminance and can obtain a higher efficiency and a longer service life under the condition of a higher luminance.

In a first aspect, an embodiment of the present disclosure provides an organic electroluminescent device. The organic electroluminescent device includes a first electrode, a second electrode and at least two organic electroluminescent units located between the first electrode and the second electrode. The at least two organic electroluminescent units are arranged in a stacked manner.

The at least two organic electroluminescent units include a first organic electroluminescent unit (first OLED unit). The first organic electroluminescent unit includes a first light-emitting layer (EML-1). The first light-emitting layer contains a first host material, a thermally activated delayed fluorescence sensitizer and a first fluorescent dye.

In an embodiment, the at least two organic electroluminescent units further include a second organic electroluminescent unit (second OLED unit). The second organic electroluminescent unit includes a second light-emitting layer (EML-2). The second light-emitting layer contains a second host material and a second fluorescent dye. The second host material is a triplet-triplet annihilation (TTA) material.

In a second aspect, an embodiment of the present disclosure provides a display apparatus. The display apparatus includes the organic electroluminescent device in the first aspect.

The organic electroluminescent device provided by an embodiment of the present disclosure contains at least two organic electroluminescent units arranged in a stacked manner. The at least two organic electroluminescent units include a first organic electroluminescent unit. The first organic electroluminescent unit includes a first host material, a thermally activated delayed fluorescence sensitizer and a first fluorescent dye. That is, the first organic electroluminescent unit is a TASF unit. Compared with a single-layer luminescent device having a TASF unit, the organic electroluminescent device provided by the embodiment of the present disclosure can effectively reduce the current density under the same luminance and avoid the problems of efficiency roll-off and exciton diffusion in a light-emitting layer caused by a high current density, thereby improving the efficiency and service life of the device.

DETAILED DESCRIPTION

Figure 1:
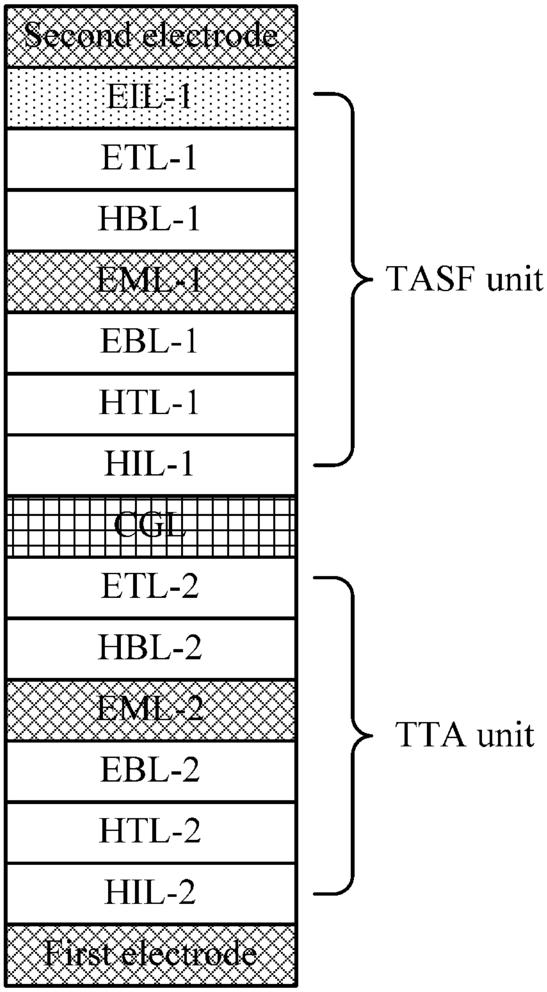
FIG. 1 is a diagram illustrating the structure of an organic electroluminescent device according to embodiment one of the present disclosure, where a first organic electroluminescent unit is closer to a second electrode.

For a better understanding of the present disclosure, embodiments of the present disclosure are listed below. It is to be understood by those skilled in the art that the embodiments described herein are used for a better understanding of the present disclosure and are not to be construed as limitations to the present disclosure.

At present, TASF devices often have serious efficiency and service life decay problems. It is found that there are two main reasons for this phenomenon: (1) the light-emitting layer in a TASF device is prone to serious efficiency roll-off under a high current density, resulting in shortened service life of the device; (2) the high current density also leads to the problem that the light-emitting layer in the TASF device is prone to exciton diffusion, further resulting in shortened service life of device.

In view of the above, an embodiment of the present disclosure provides an organic electroluminescent device. The organic electroluminescent device includes a first electrode, a second electrode and at least two organic electroluminescent units located between the first electrode and the second electrode. The at least two organic electroluminescent units are arranged in a stacked manner.

The at least two organic electroluminescent units include a first organic electroluminescent unit. The first organic electroluminescent unit includes a first light-emitting layer. The first light-emitting layer contains a first host material, a thermally activated delayed fluorescence sensitizer and a first fluorescent dye.

The organic electroluminescent device provided by an embodiment of the present disclosure includes at least two OLED units, but is not limited to two OLED units, and may include three, four, five or more OLED units. The present disclosure does not limit the upper limit of the number of OLED units.

The organic electroluminescent device provided by an embodiment of the present disclosure includes at least two organic electroluminescent units arranged in a stacked manner. The at least two organic electroluminescent units includes a first organic electroluminescent unit. The first organic electroluminescent unit includes a first host material, a thermally activated delayed fluorescence sensitizer and a first fluorescent dye. That is, the first organic electroluminescent unit is a TASF unit. Compared with a single-layer luminescent device having a TASF unit, the organic electroluminescent device provided by an embodiment of the present disclosure can effectively reduce the current density under the same luminance and avoid the problems of efficiency roll-off and exciton diffusion in a light-emitting layer caused by a high current density, thereby improving the efficiency and service life of the device.

In an alternative embodiment, the at least two organic electroluminescent units further include a second organic electroluminescent unit. The second organic electroluminescent unit includes a second light-emitting layer. The second light-emitting layer contains a second host material and a second fluorescent dye. The second host material is a triplet-triplet annihilation material.

The TASF unit (that is, the first OLED unit) and a TTA unit (that is, the second OLED unit) are arranged in a stacked manner in the organic electroluminescent device of an embodiment of the present disclosure. Compared with a single-layer TASF device, the two types of OLED units arranged in a stacked manner can further reduce the current density of the device under the same luminance and avoid the problems of efficiency roll-off and exciton diffusion in the light-emitting layer caused by a high current density, thereby further improving the efficiency and service life of the device.

In an alternative embodiment, the first fluorescent dye and the second fluorescent dye are selected from the same material.

In the organic electroluminescent device of an embodiment of the present disclosure, two OLED units use the same fluorescent dye so that the emission wavelength of the device can be fixed without multipeak emission, thereby ensuring the luminous color purity and ensuring the efficiency and service life of the device.

In an alternative embodiment, the triplet energy level of the first host material is greater than the triplet energy level of the first fluorescent dye.

In an alternative embodiment, the triplet energy level of the second host material is less than the triplet energy level of the second fluorescent dye.

In an alternative embodiment, the triplet energy level of the first host material is greater than the triplet energy level of the second host material.

The organic electroluminescent device of an embodiment of the present disclosure employs the preceding triplet energy level relationship of the first host material (the host material of TASF), the first fluorescent dye, the second host material (the host material of TTA) and the second fluorescent dye and optimizes the device structure by matching the energy level relationship of the first host material, the first fluorescent dye, the second host material and the second fluorescent dye, thereby further improving the efficiency and service life of the device.

In an alternative embodiment, the first fluorescent dye and the second fluorescent dye are each selected from any one of compounds F-1 to F-58:

(F-1)

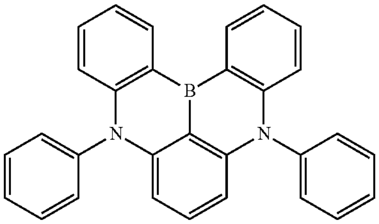

(F-2)

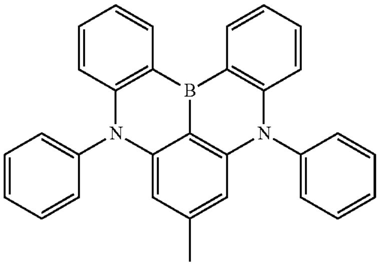

(F-3)

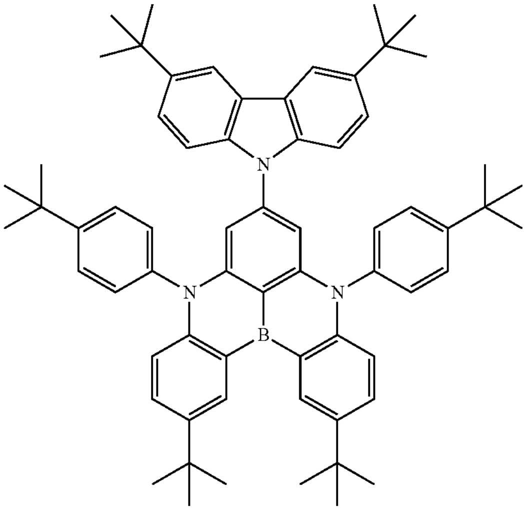

(F-4)

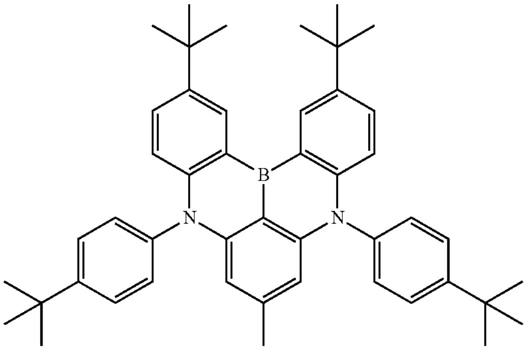

-continued
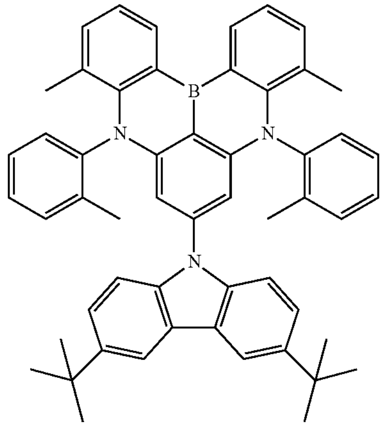
(F-5)
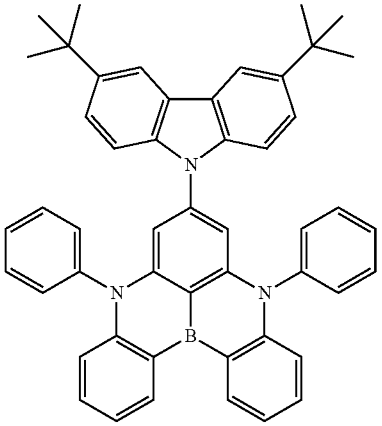
(F-6)
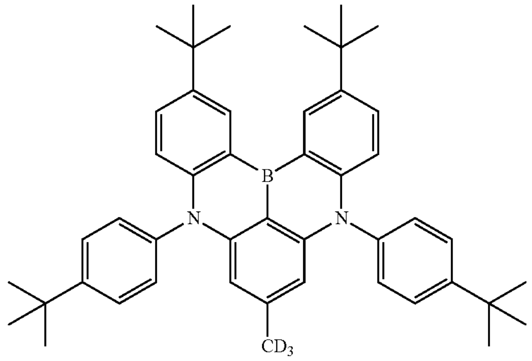
(F-7)
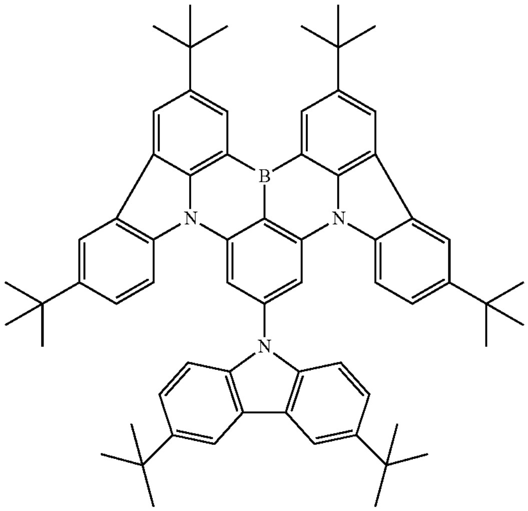
(F-8)
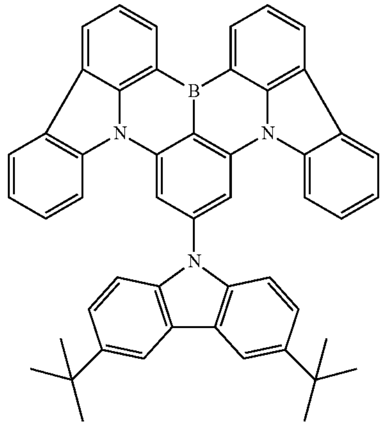
(F-9)
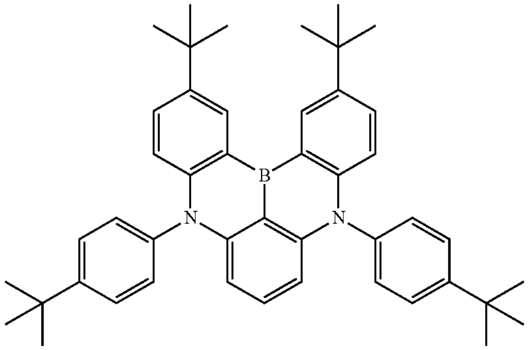
(F-10)

-continued
(F-11)
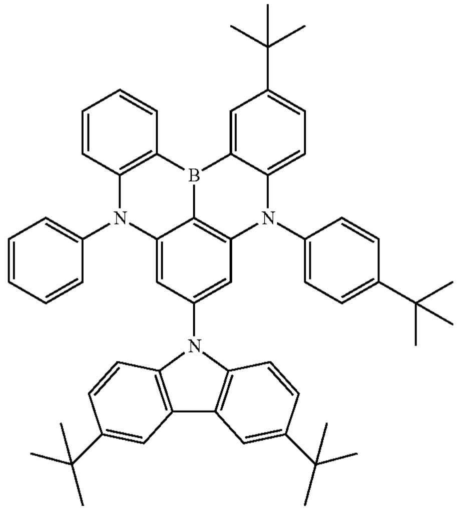
(F-12)
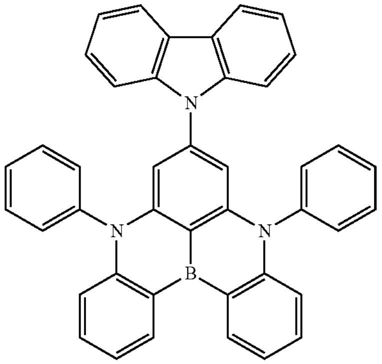
(F-13)
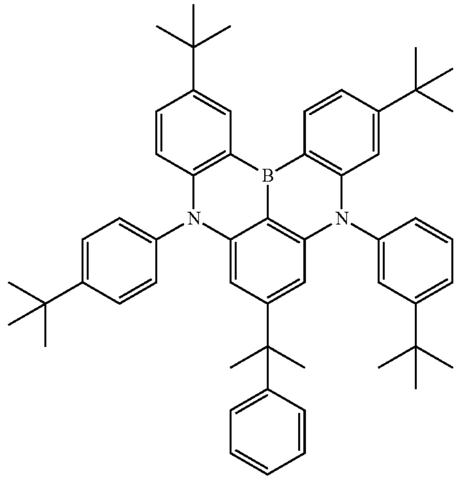
(F-14)
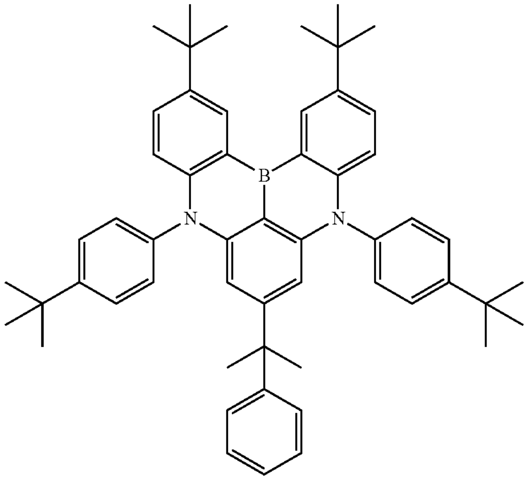
(F-15)
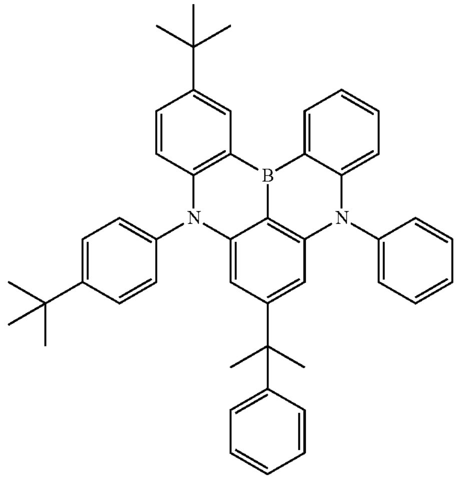
(F-16)
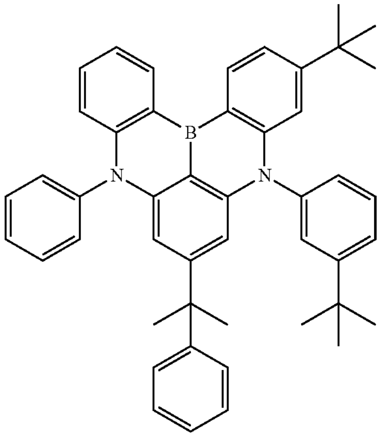

-continued
(F-17)
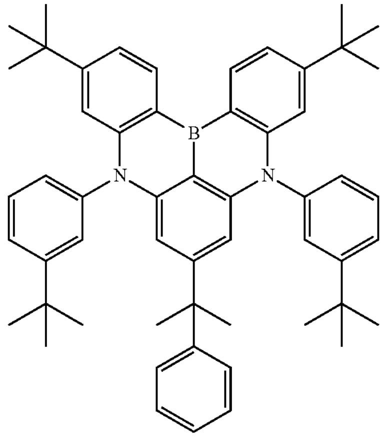
(F-18)
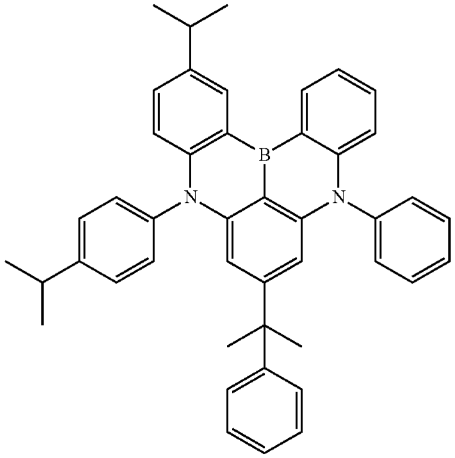
(F-19)
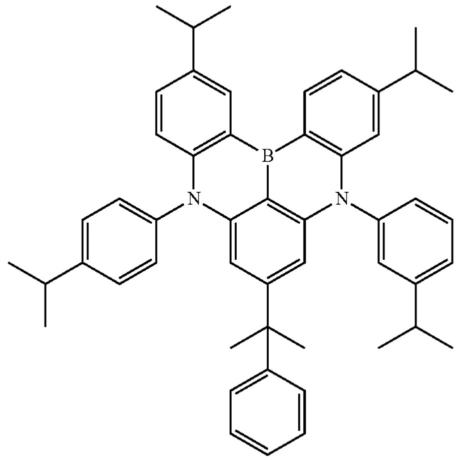
(F-20)
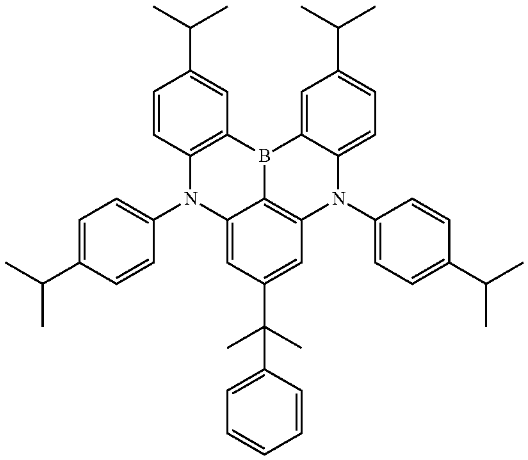
(F-21)
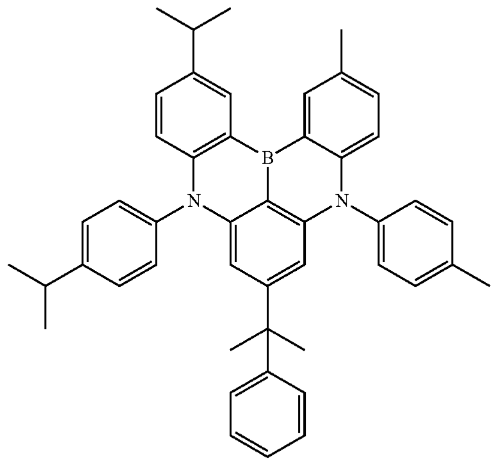
(F-22)
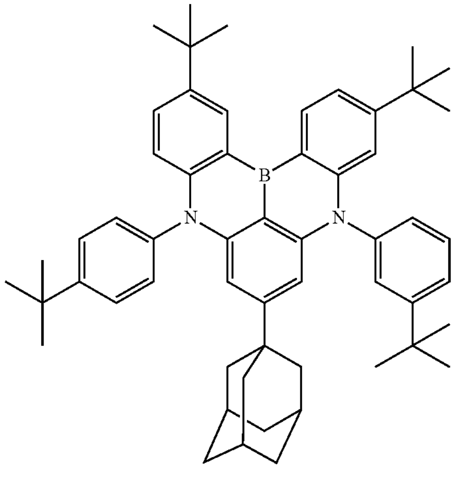

-continued
(F-23)
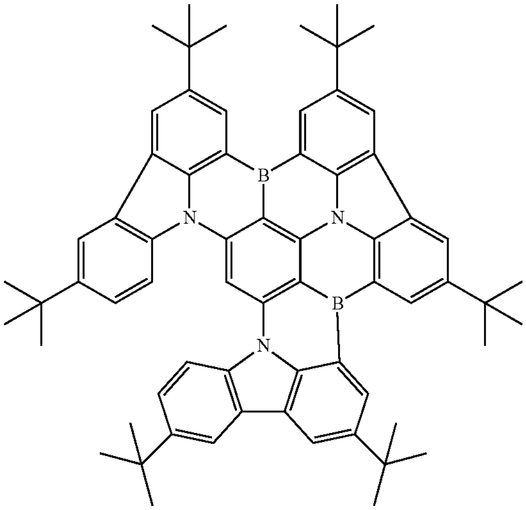
(F-24)
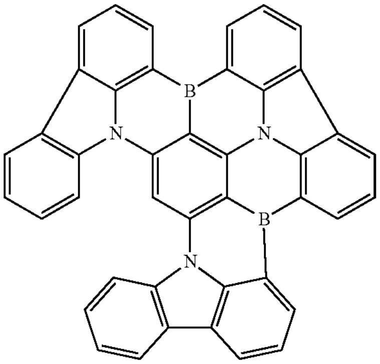
(F-25)
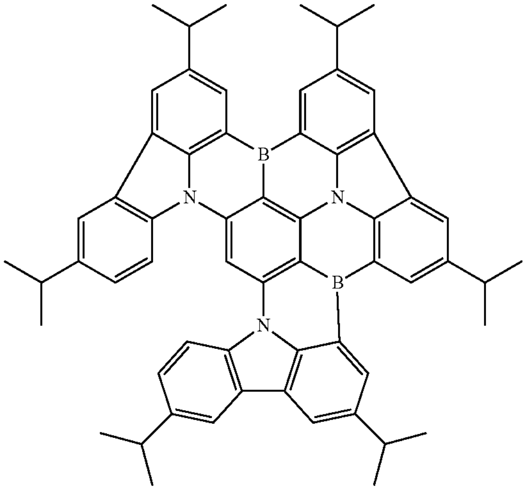
(F-26)
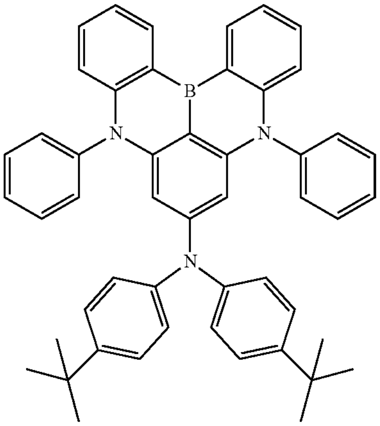
(F-27)
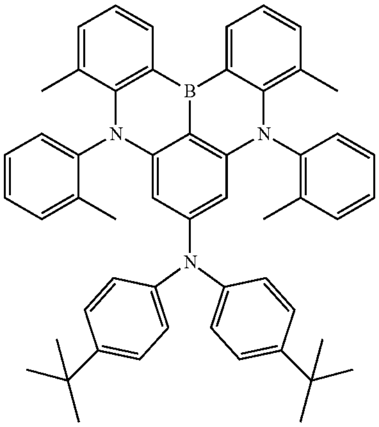
(F-28)
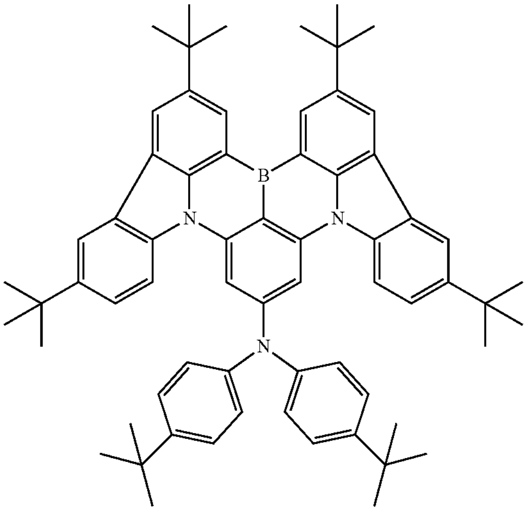

-continued
(F-29)
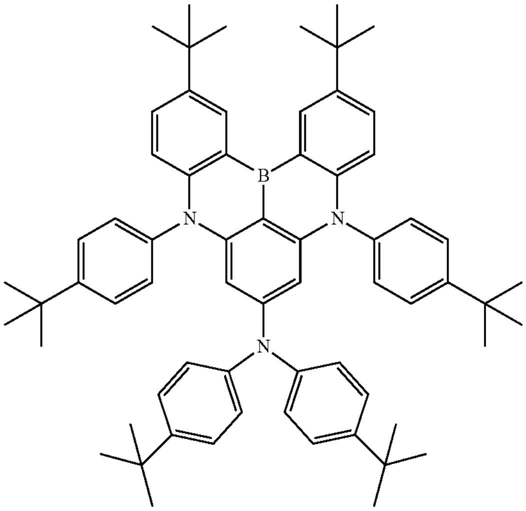
(F-30)
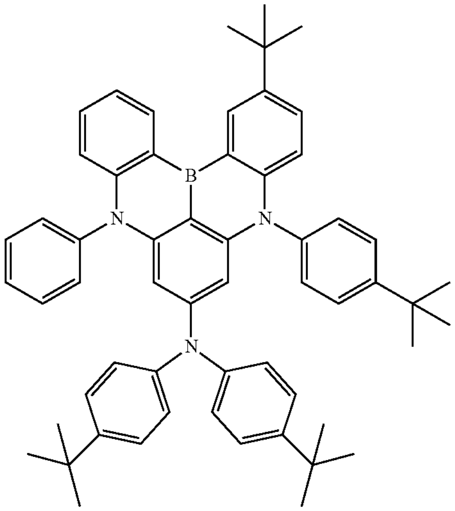
(F-31)
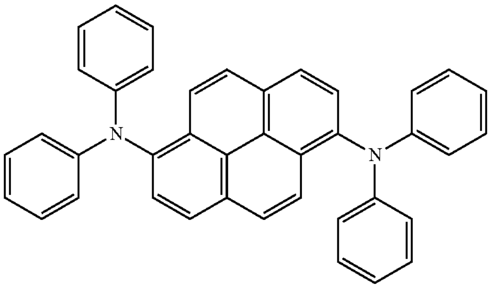
(F-32)
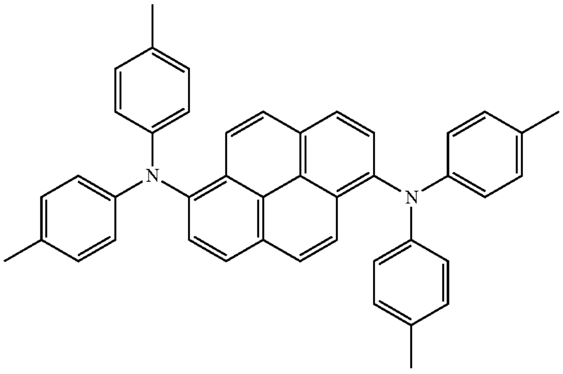
(F-33)
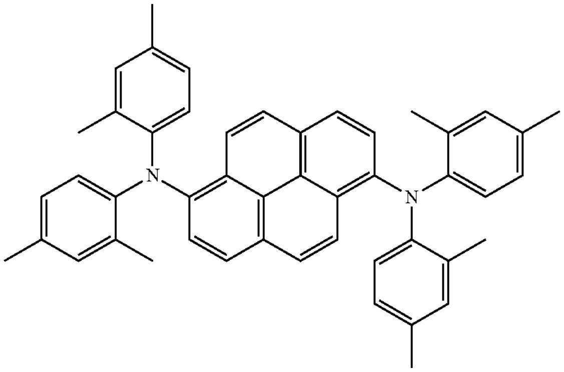
(F-34)
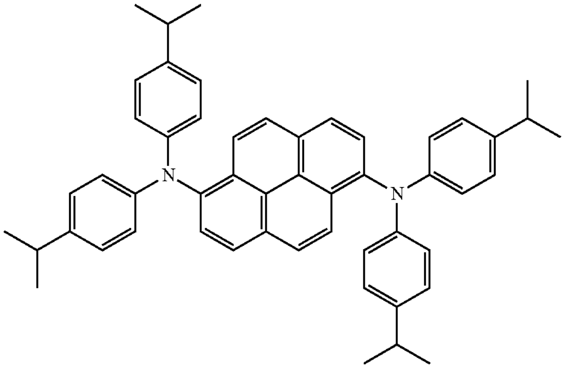

-continued
(F-35)
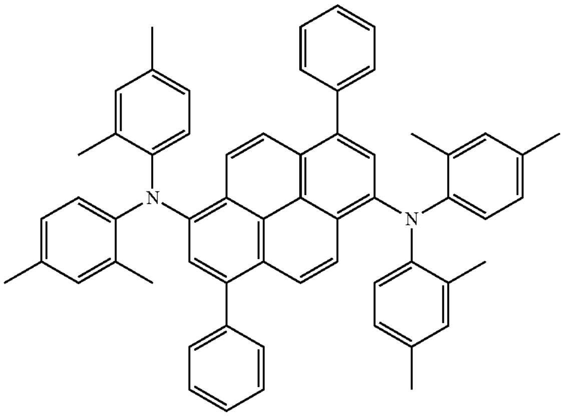
(F-36)
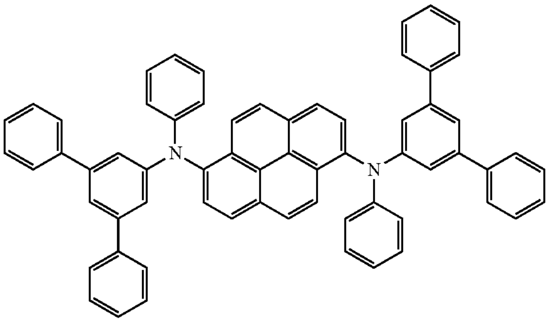
(F-37)
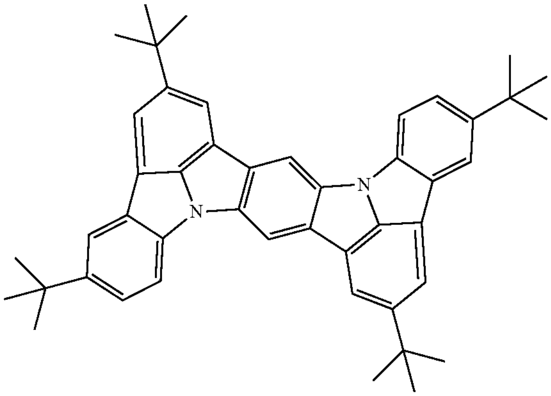
(F-38)
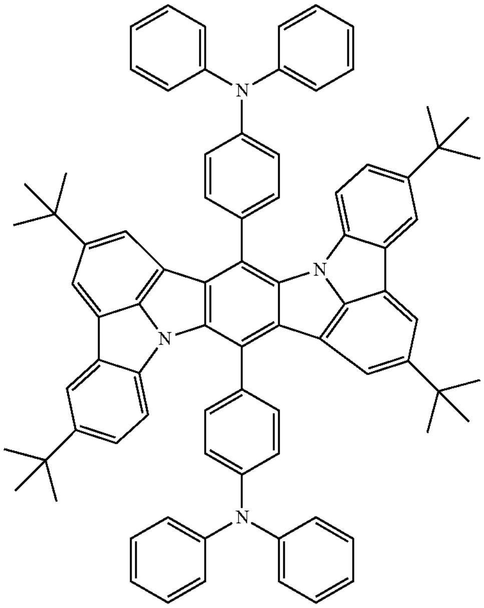
(F-39)
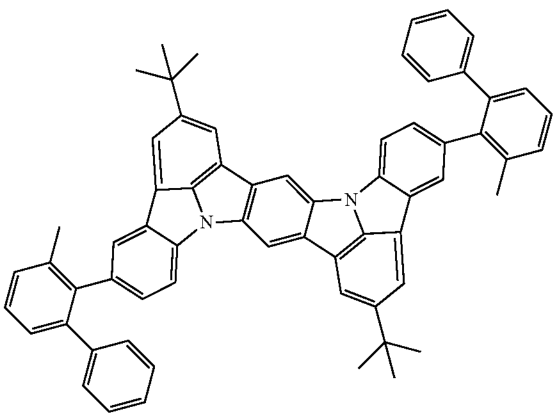
(F-40)
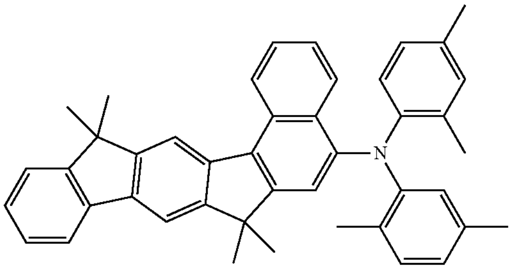

-continued
(F-41)
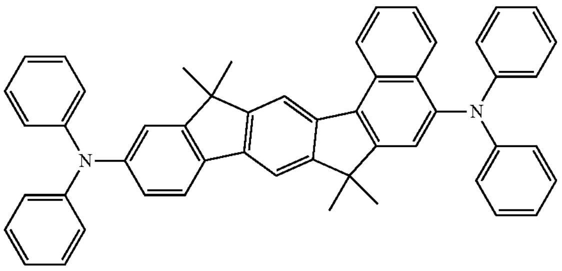
(F-42)
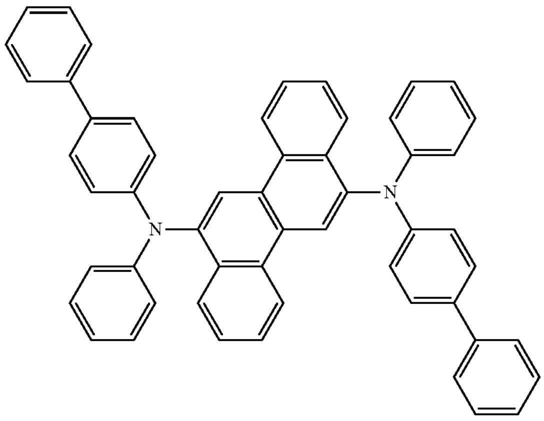
(F-43)
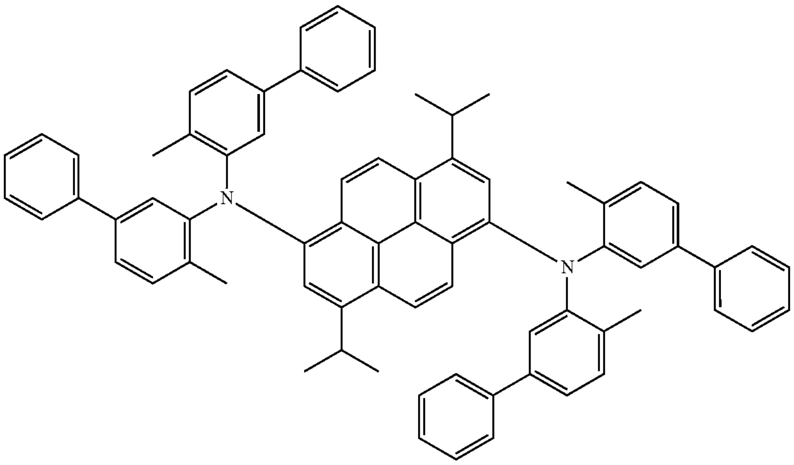
(F-44)
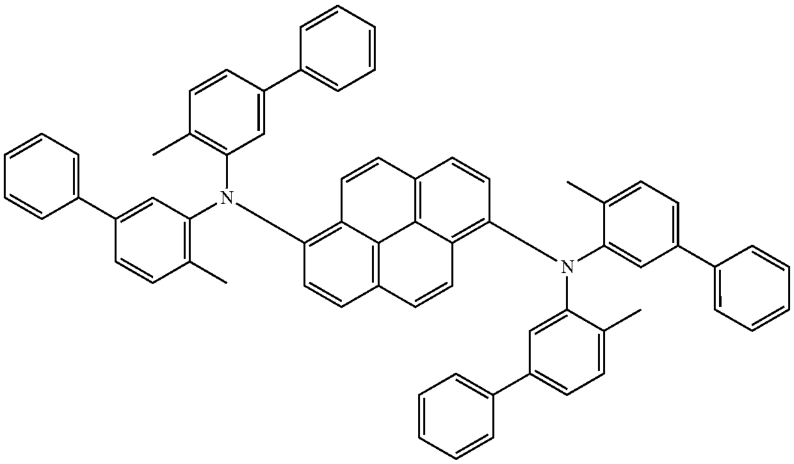

-continued
(F-45)
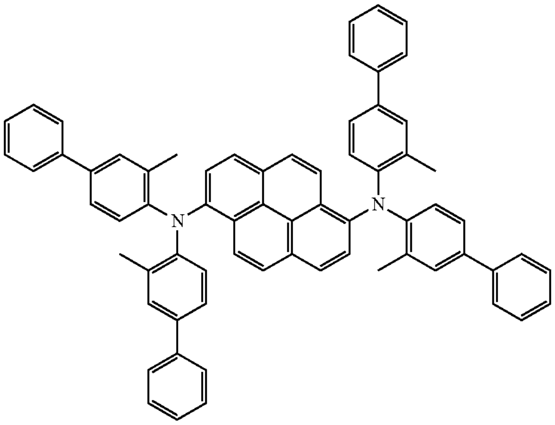
(F-46)
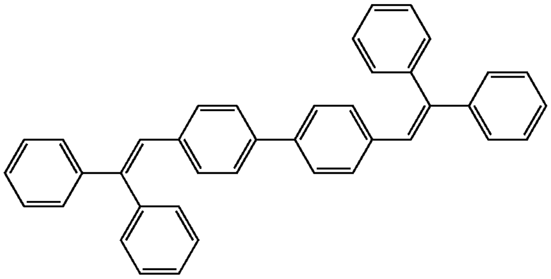
(F-47)
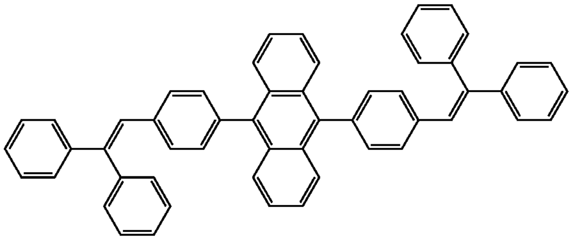
(F-48)
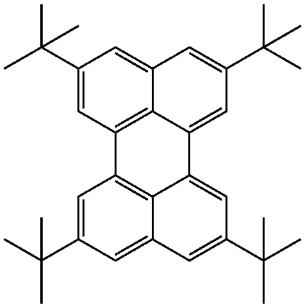
(F-49)
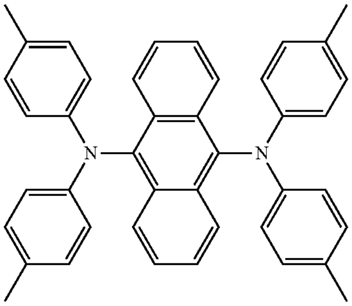
(F-50)
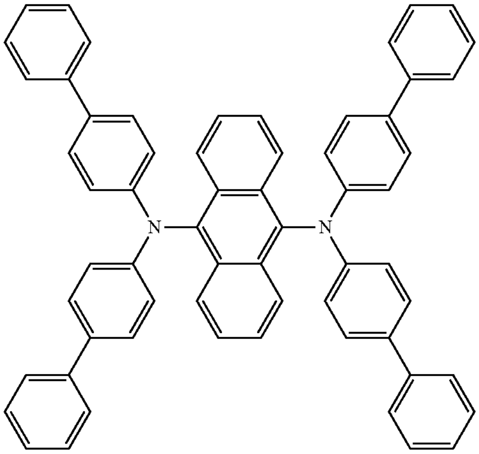

-continued
(F-51)
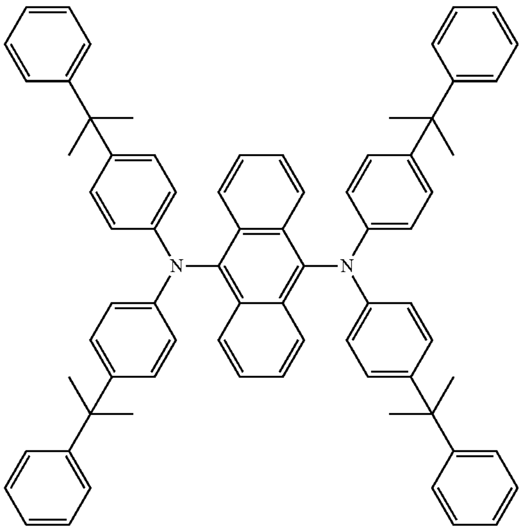
(F-52)
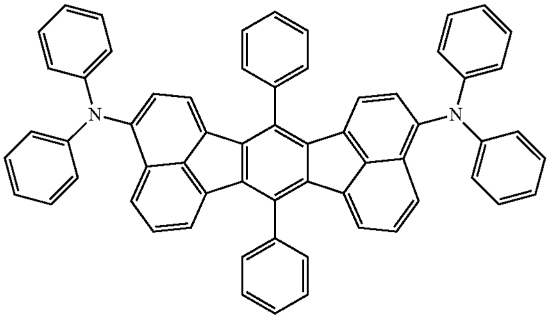
(F-53)
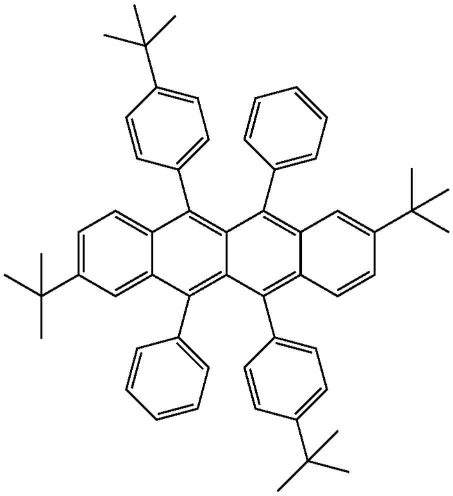
(F-54)
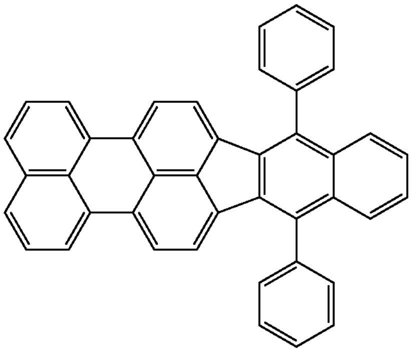
(F-55)
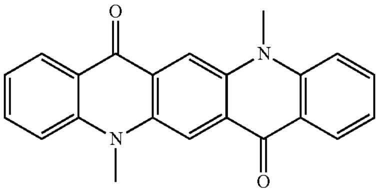
(F-56)
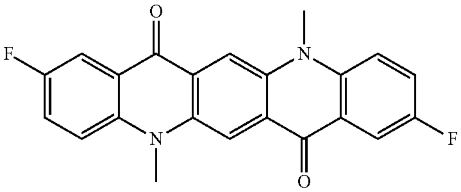
(F-57)
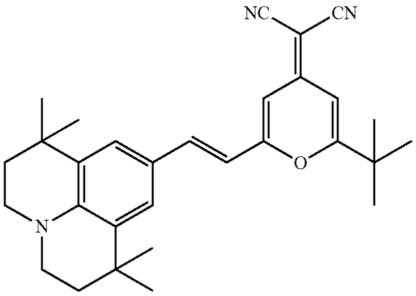
(F-58)
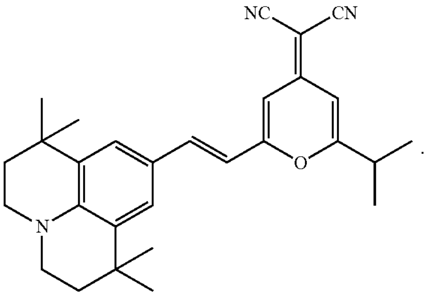

Figure 2:
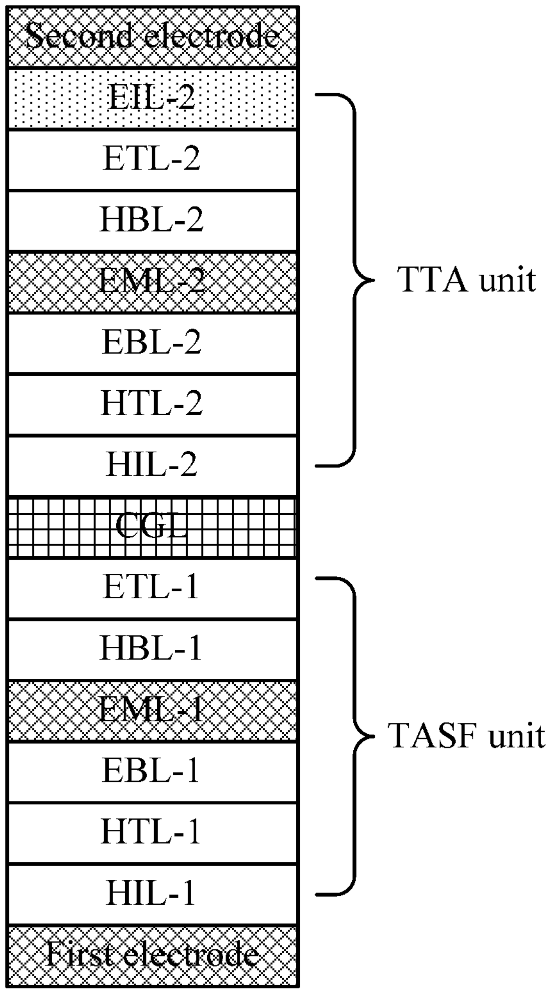
FIG. 2 is a diagram illustrating the structure of an organic electroluminescent device according to embodiment two of the present disclosure, where a first organic electroluminescent unit is closer to a first electrode.

In an alternative embodiment, a charge generation layer (CGL) is disposed between the first organic electroluminescent unit and the second organic electroluminescent unit. In an alternative embodiment, the first organic electroluminescent unit and the second organic electroluminescent unit are connected by the CGL layer in the stacked organic electroluminescent device, as shown in FIG. 1 or FIG. 2.

In an alternative embodiment, the first electrode is an anode, and the second electrode is a cathode. Moreover, the first organic electroluminescent unit is closer to the second electrode than the second organic electroluminescent unit, and the second organic electroluminescent unit is closer to the first electrode than the first organic electroluminescent unit.

In an embodiment of the present disclosure, the TASF unit is closer to the second electrode and the TTA unit is closer to the first electrode. It is found that when the TASF unit is closer to the second electrode, the efficiency roll-off phenomenon can be further avoided, and the efficiency of the organic electroluminescent device can be improved.

In an alternative embodiment, the thickness of the first light-emitting layer is greater than or equal to the thickness of the second light-emitting layer.

In an embodiment of the present disclosure, the thickness of the light-emitting layer in the TASF unit is greater than or equal to the thickness of the light-emitting layer in the TTA unit, and the exciton energy level of the light-emitting layer in the TASF unit is generally higher than the exciton energy level of the light-emitting layer in the TTA unit. Therefore, in the device of the embodiment of the present disclosure, increasing the thickness of the light-emitting layer in the TASF unit can enlarge the exciton recombination zone of the light-emitting layer in the TASF unit and avoid the problem of device service life attenuation due to exciton diffusion, thereby further improving the efficiency and service life of the entire device. Provided that the thickness of the light-emitting layer in the TASF unit is less than the thickness of the light-emitting layer in the TTA unit, excitons in the TASF unit easily diffuse to other zones, resulting in low efficiency and short service life of the stacked device.

The applicant has found through research that a too large thickness of the first light-emitting layer will results in unfavorable factors such as an increase in device voltage and a decrease in efficiency. Therefore, in an alternative embodiment, it is preferable that the thickness of the first light-emitting layer is 1 to 3 times the thickness of the second light-emitting layer. With this arrangement, the device service life attenuation caused by exciton diffusion and the device voltage increase can be avoided at the same time, and the efficiency and service life of the entire device can be improved.

In an alternative embodiment, the first organic electroluminescent unit further includes any one or at least two of a first hole injection layer (HIL-1), a first hole transport layer (HTL-1), a first electron blocking layer (EBL-1), a first hole blocking layer (HBL-1), a first electron transport layer (ETL-1) or a first electron injection layer (EIL-1).

Moreover or alternatively, the second organic electroluminescent unit further includes any one or at least two of a second hole injection layer (HIL-2), a second hole transport layer (HTL-2), a second electron blocking layer (EBL-2), a second hole blocking layer (HBL-2), a second electron transport layer (ETL-2) or a second electron injection layer (EIL-2).

In an alternative embodiment, the first host material in the first light-emitting layer (EML-1) is a host material having a wider band gap and may be selected from any one or a combination of at least two of compounds TDH-1 to TDH-47 (for example, a combination of TDH-1 and TDH-7 or a combination of TDH-8, TDH-10 and TDH-30):

TDH-1

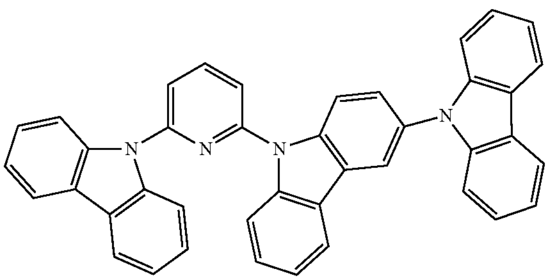

TDH-2

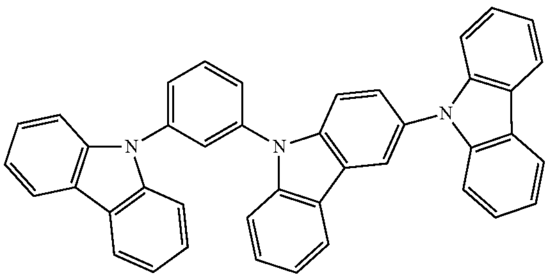

TDH-3

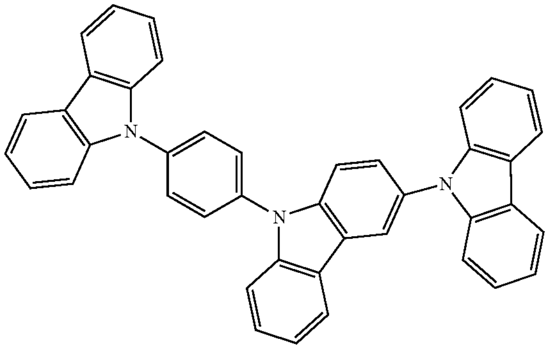

TDH-4

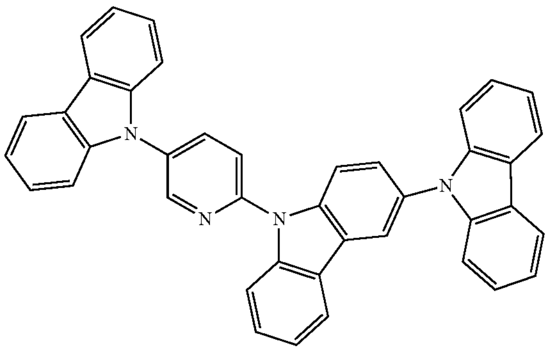

-continued
TDH-5
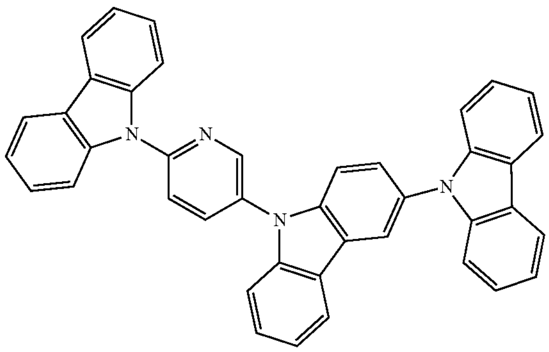
TDH-6
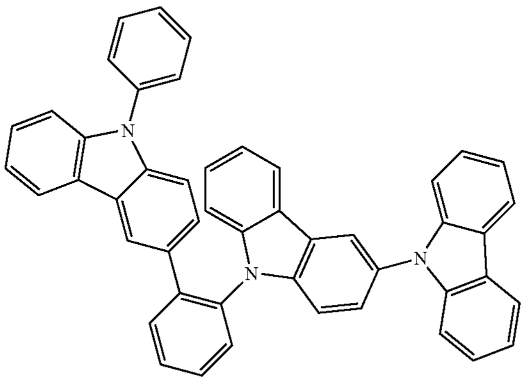
TDH-7
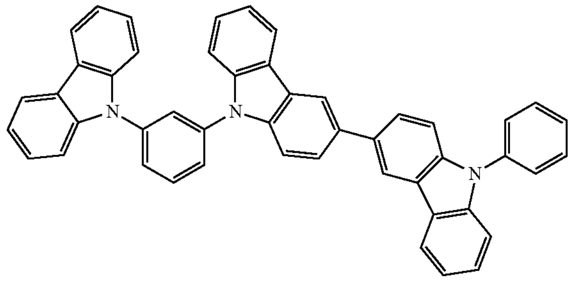
TDH-8
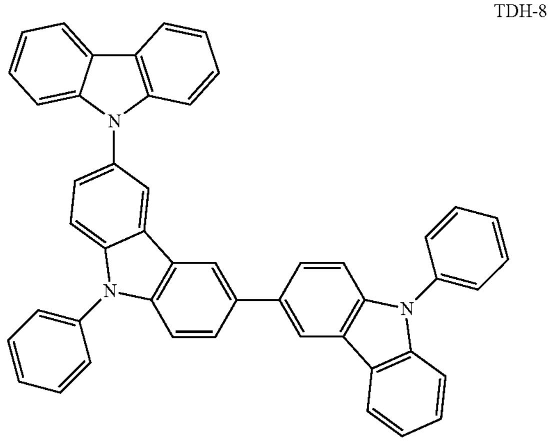
-continued
TDH-9
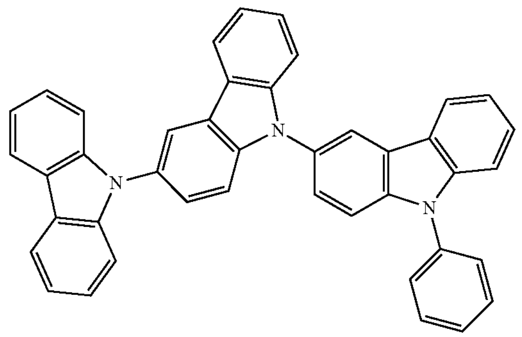
TDH-10
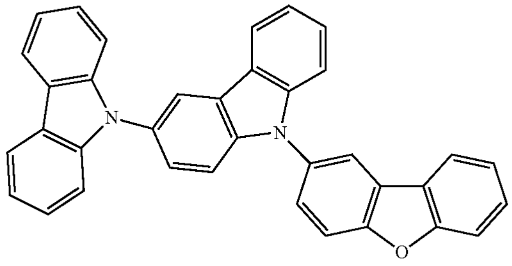
TDH-11
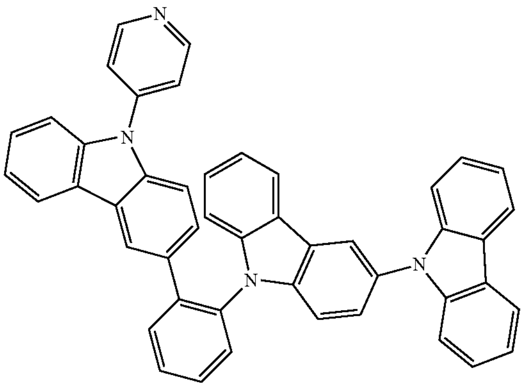
TDH-12
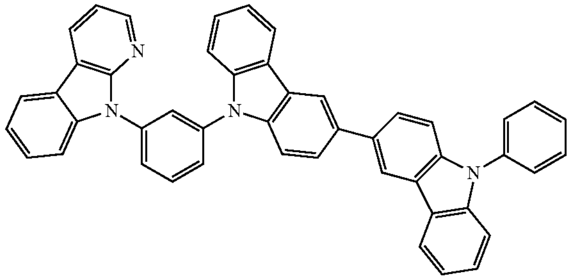
TDH-13
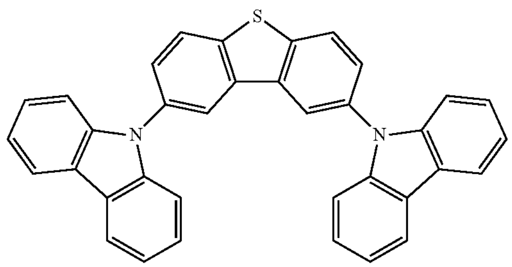

-continued
TDH-14
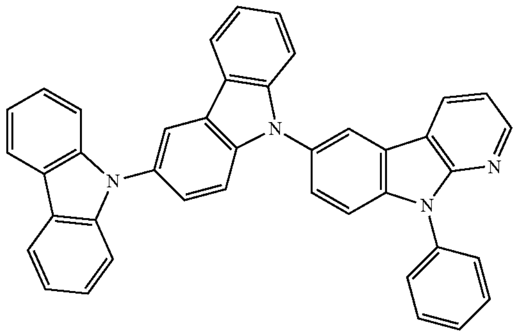
TDH-15
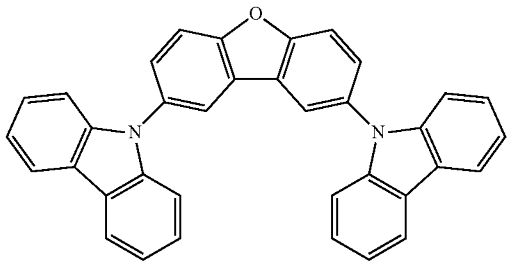
TDH-16
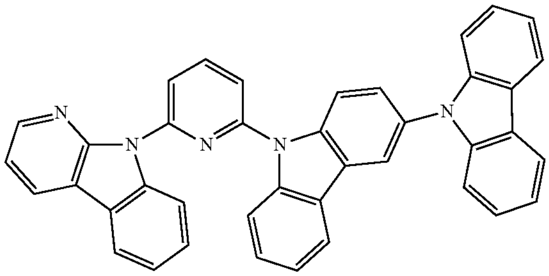
TDH-17
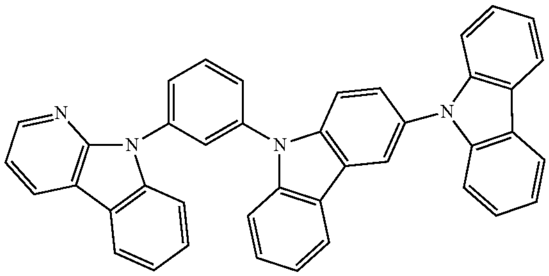
TDH-18
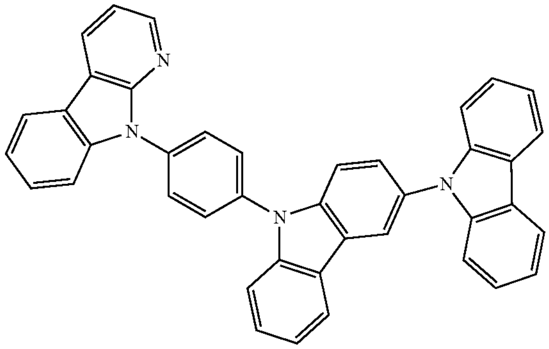
-continued
TDH-19
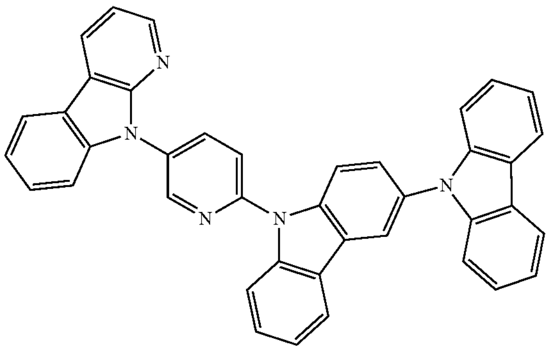
TDH-20
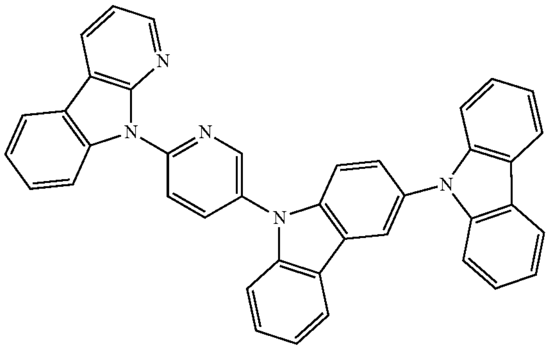
TDH-21
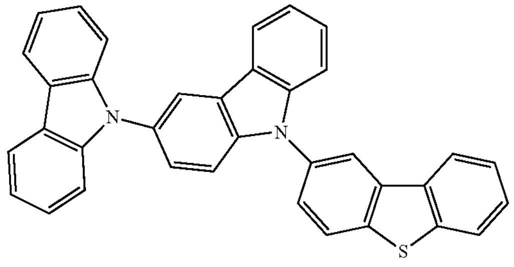
TDH-22
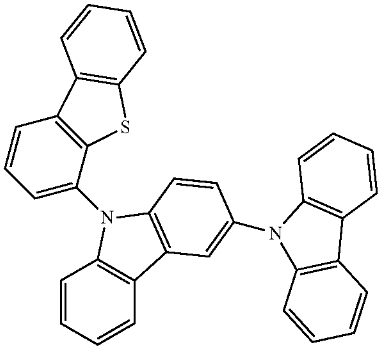

-continued
TDH-23
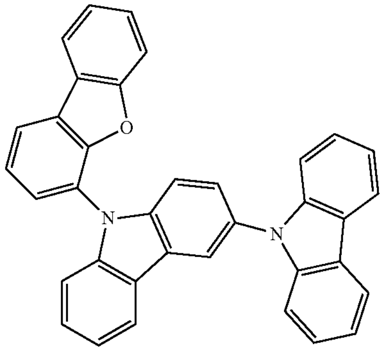
TDH-24
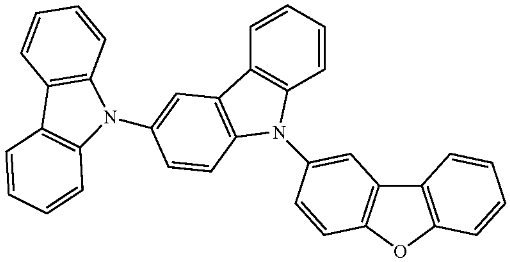
TDH-25
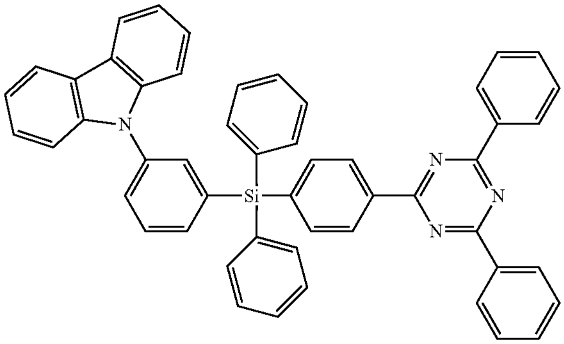
TDH-26
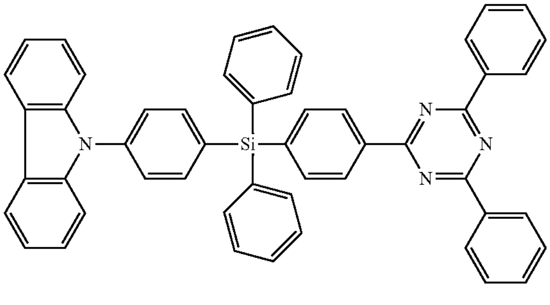
-continued
TDH-27
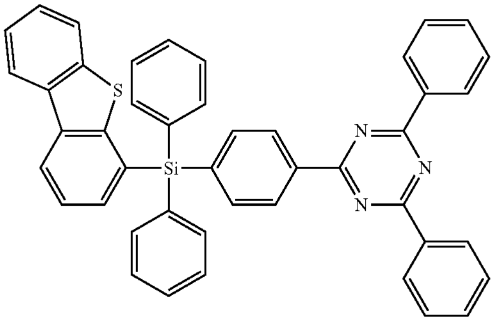
TDH-28
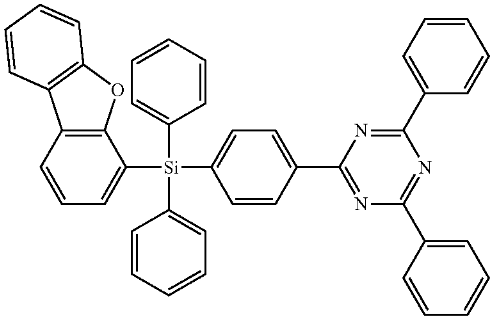
TDH-29
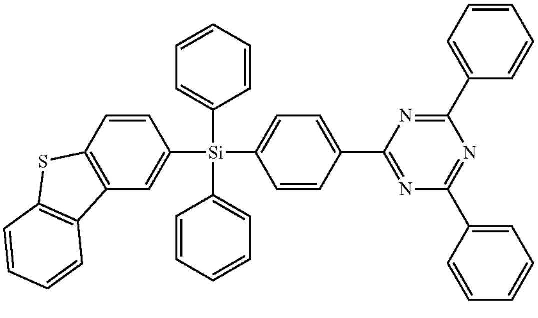
TDH-30
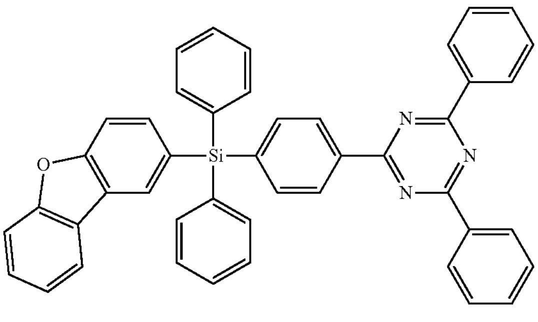

-continued
TDH-31
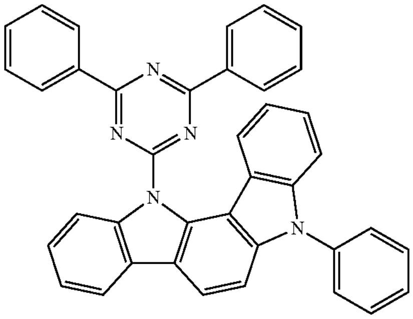
TDH-32
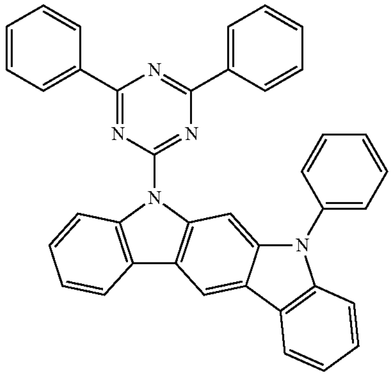
TDH-33
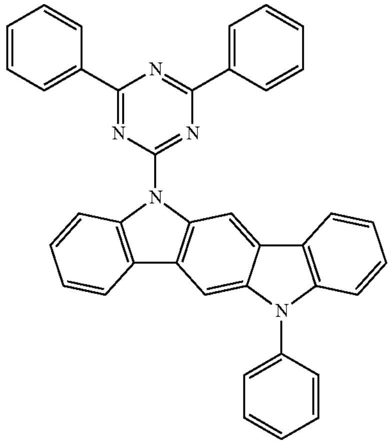
TDH-34
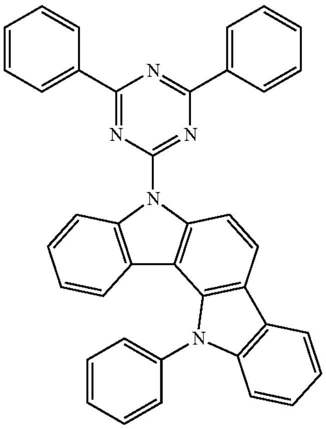
-continued
TDH-35
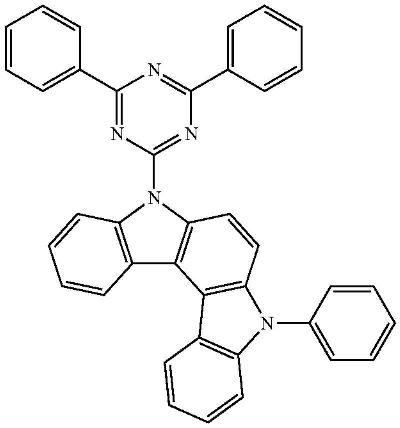
TDH-36
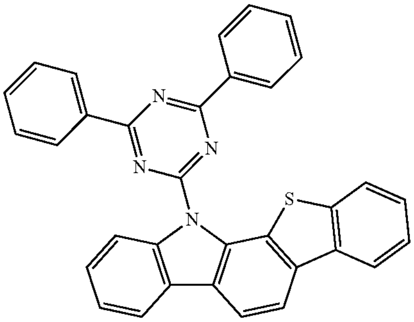
TDH-37
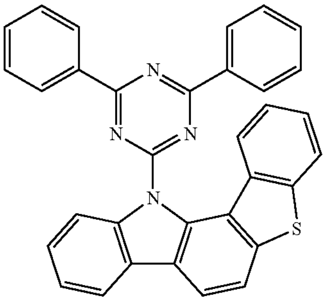
TDH-38
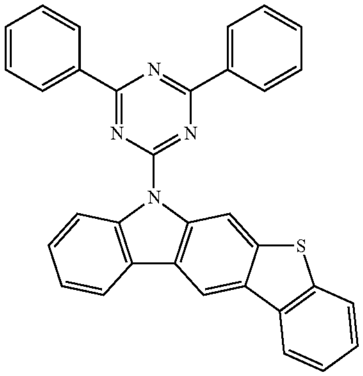

-continued
TDH-39
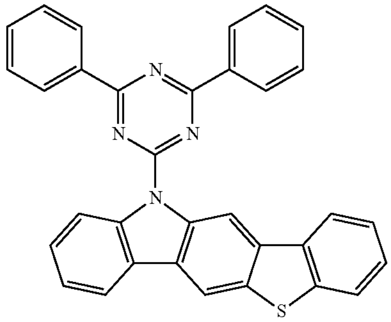
TDH-40
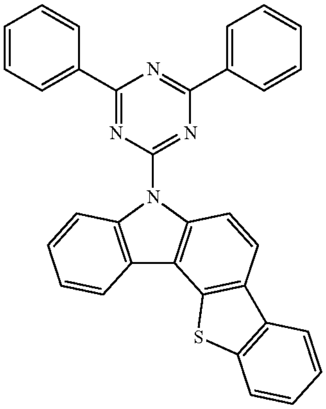
TDH-41
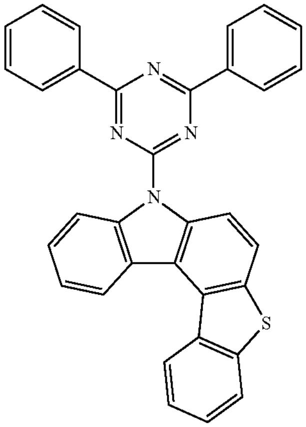
TDH-42
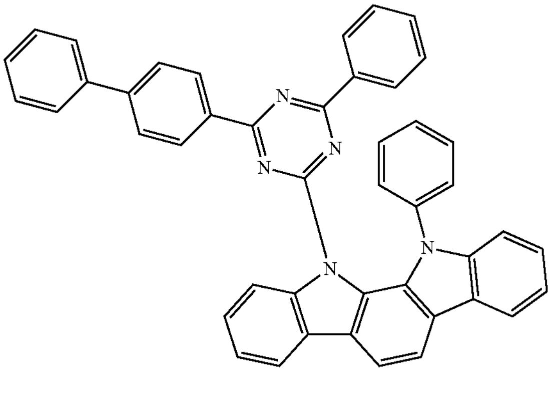
-continued
TDH-43
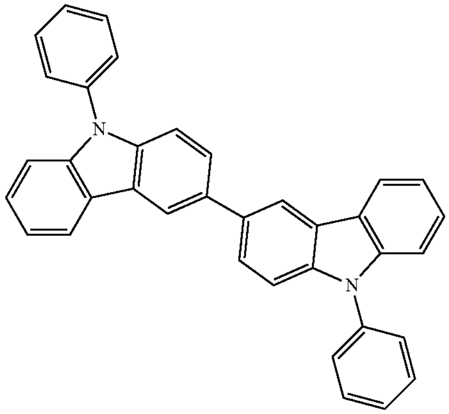
TDH-44
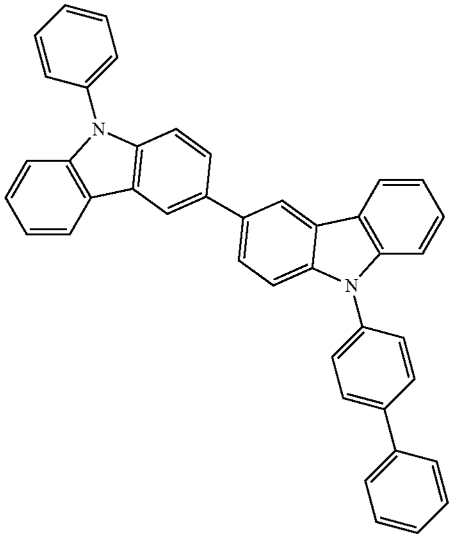
TDH-45
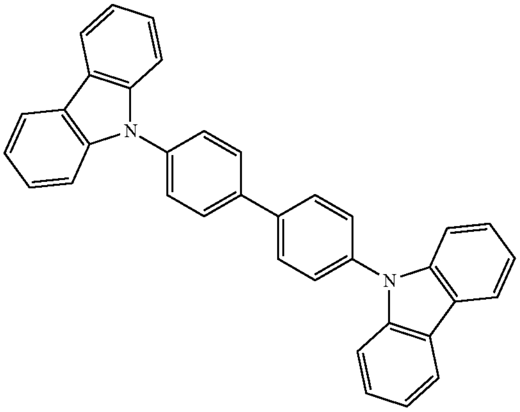

-continued
TDH-46
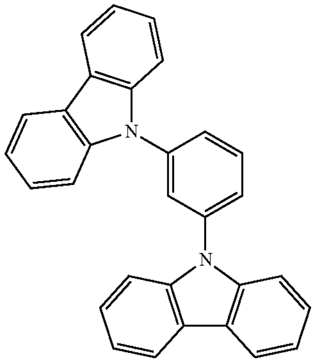
-continued
TDH-47
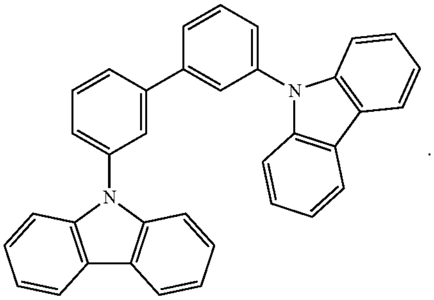
In an alternative embodiment, the thermally activated delayed fluorescence sensitizer in the first light-emitting layer (EML-1) is a material with thermally activated delayed fluorescence properties and may be selected from one or a combination of at least two of compounds TDE1 to TDE45:
TDE1
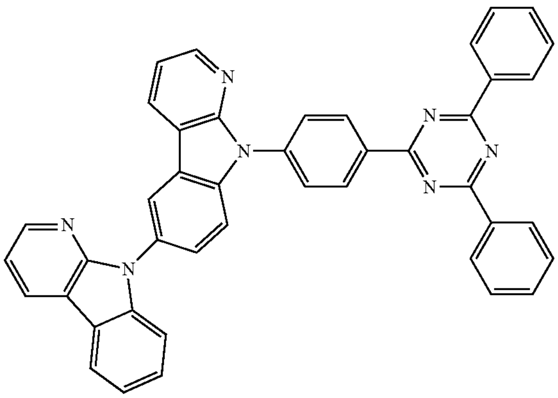
TDE2
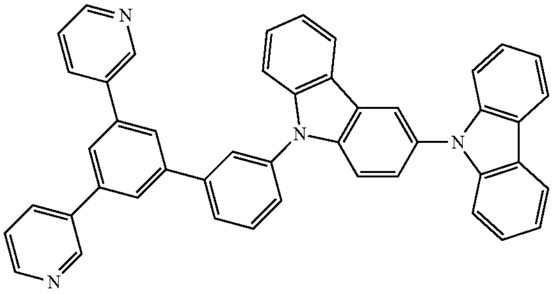
TDE3
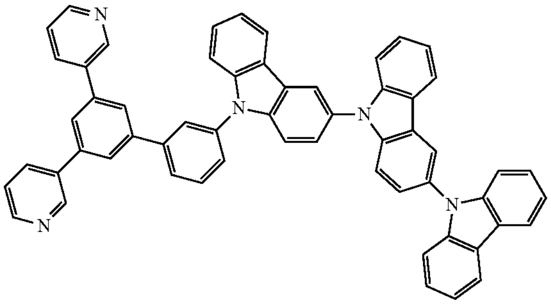
TDE4
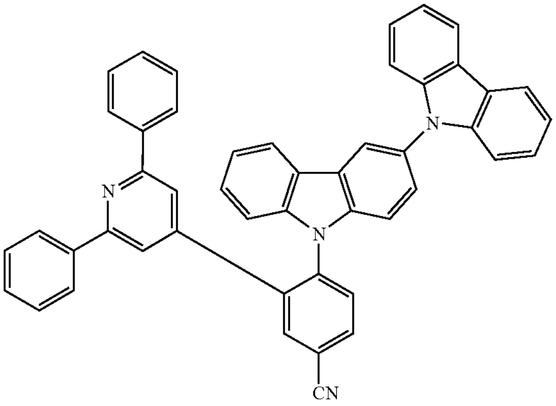

-continued
TDE5
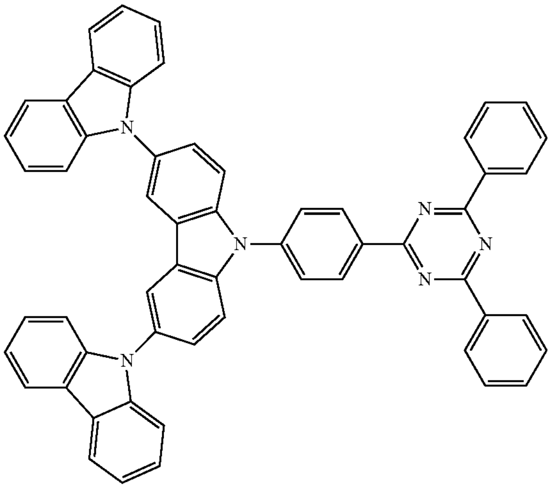
TDE6
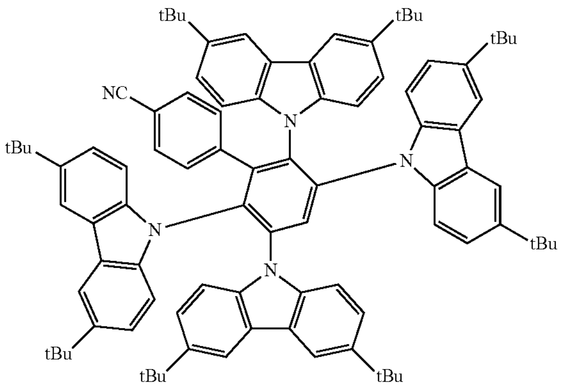
TDE7
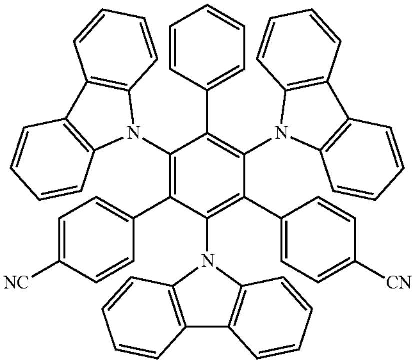
TDE8
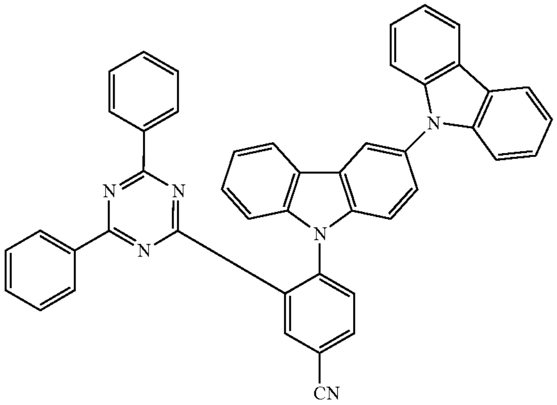
TDE9
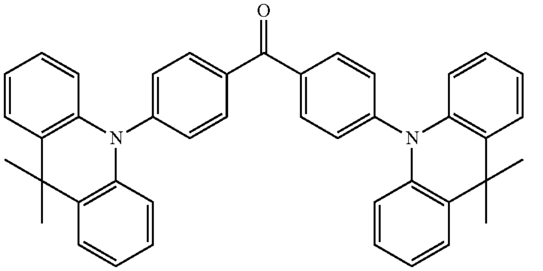
TDE10
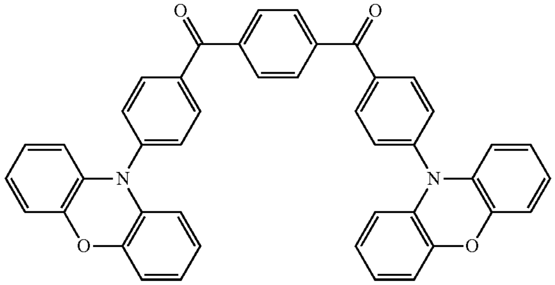
TDE11
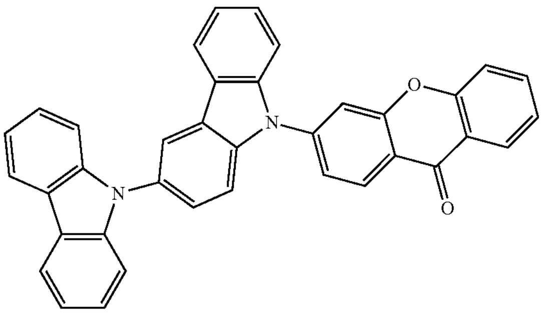
TDE12
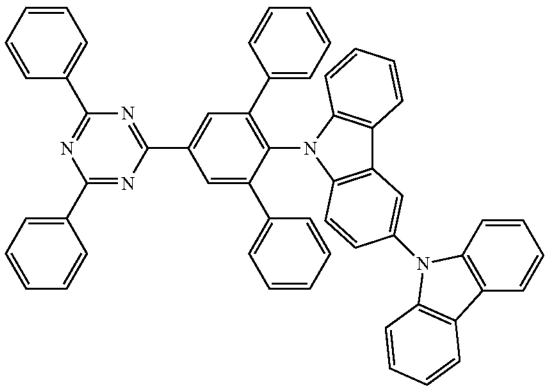

-continued
TDE13
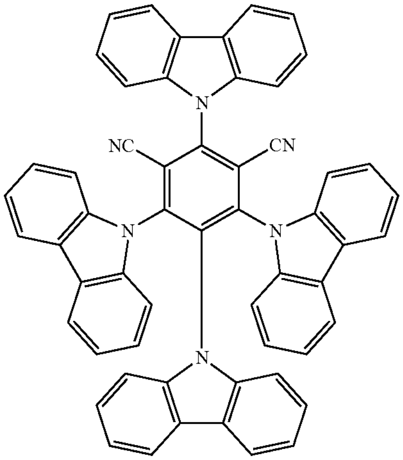
TDE14
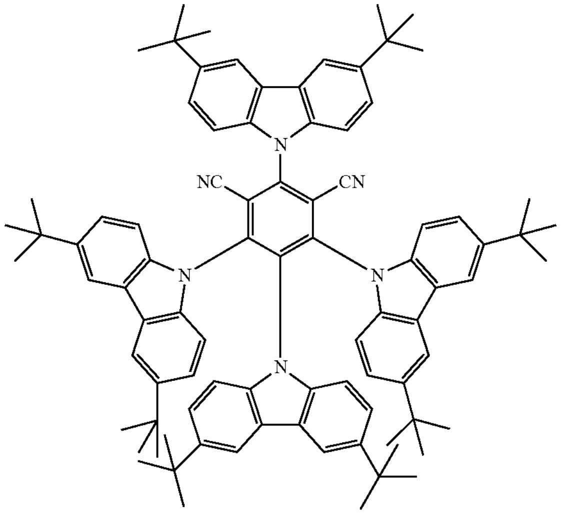
TDE15
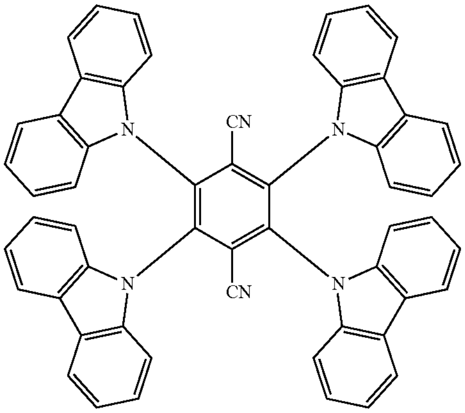
TDE16
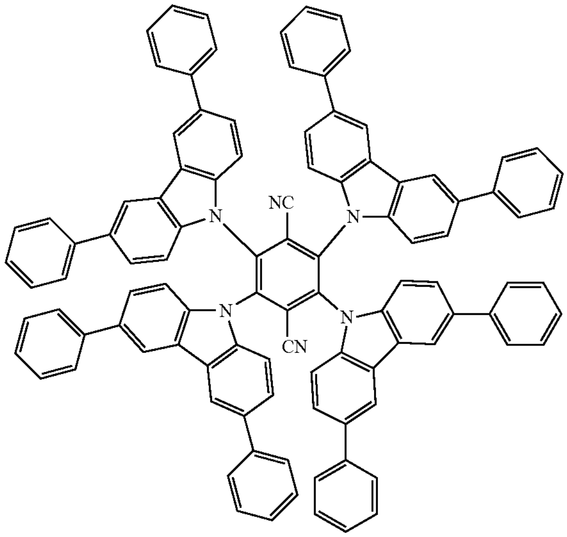
TDE17
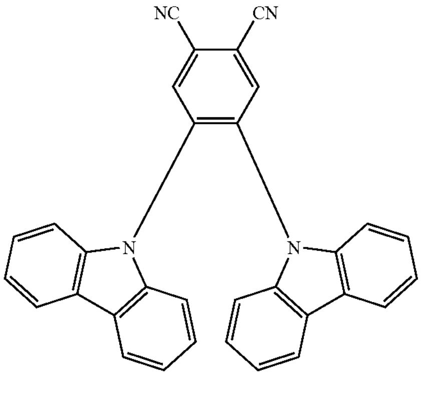
TDE18
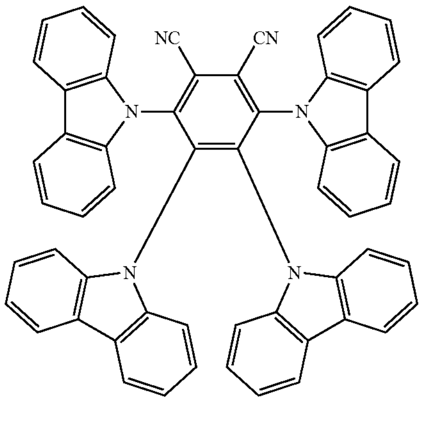

-continued
TDE19
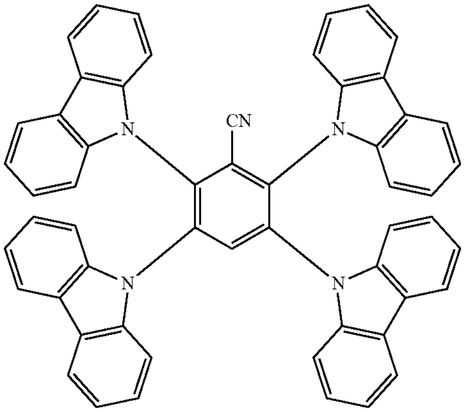
TDE20
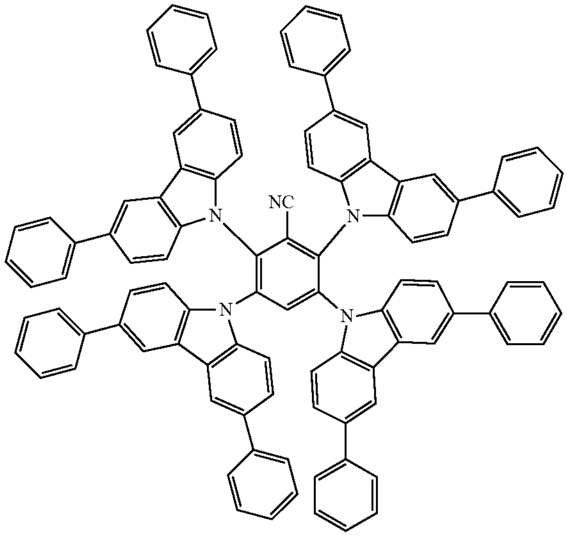
TDE21
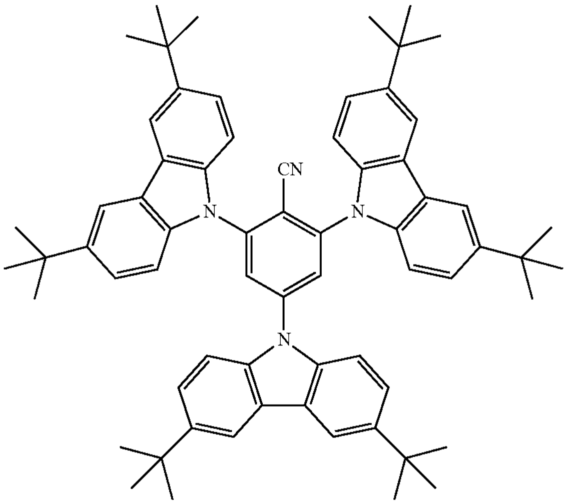
TDE22
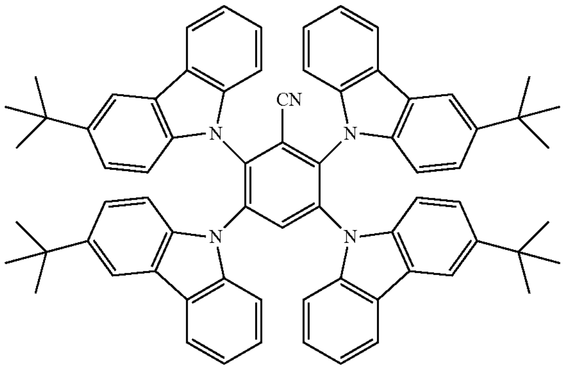
TDE23
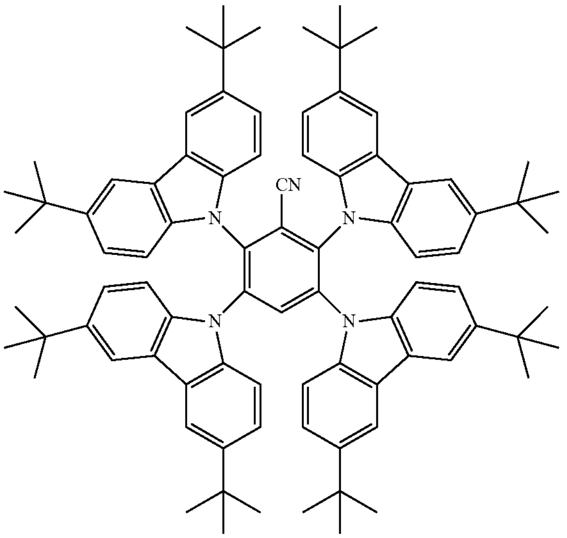
TDE24
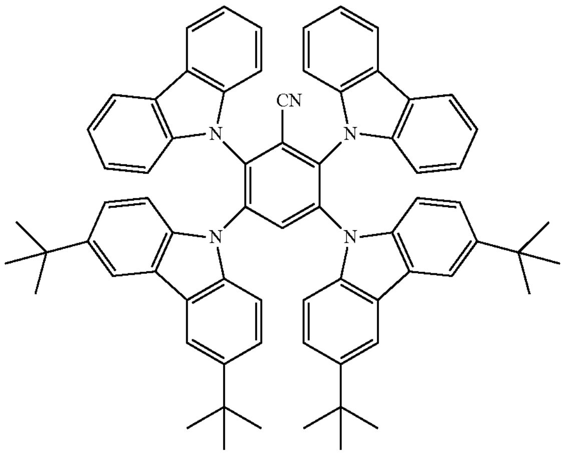

-continued
TDE25
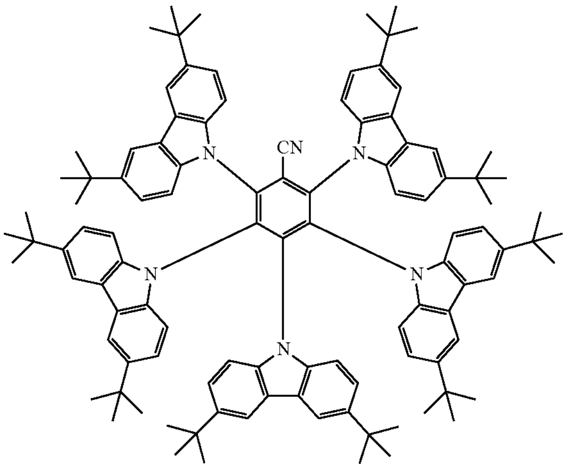
TDE26
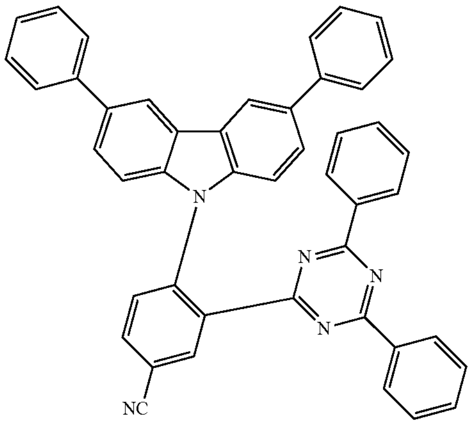
TDE27
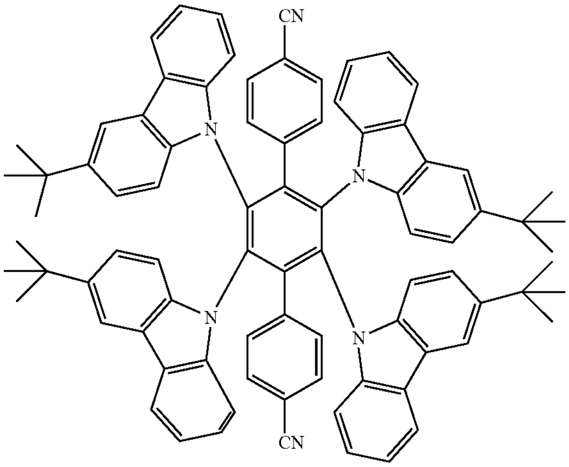
TDE28
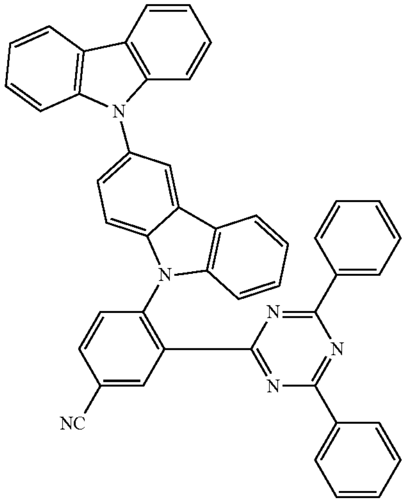
TDE29
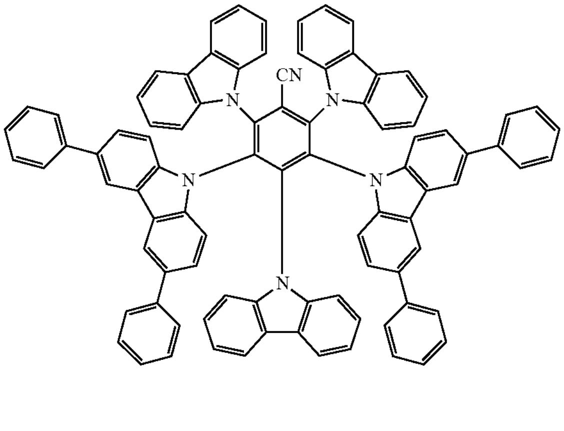
TDE30
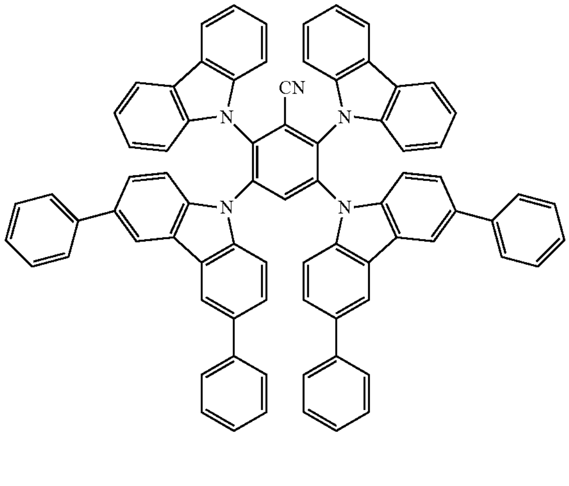

-continued
TDE31
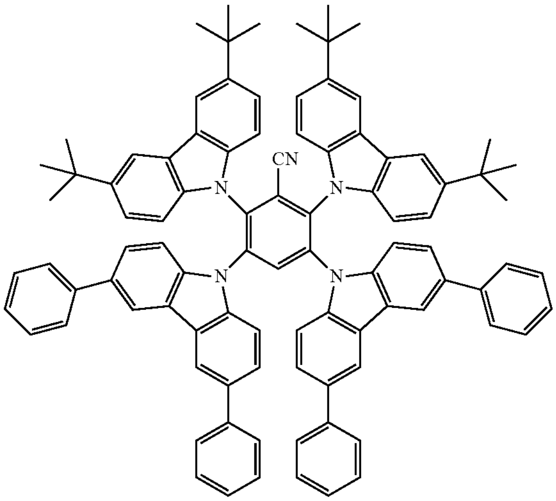
TDE32
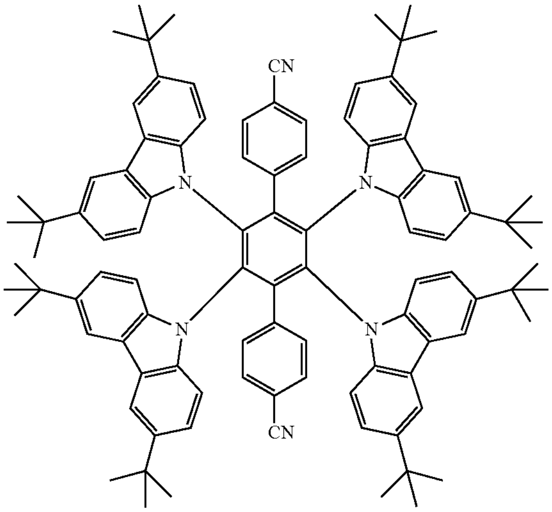
TDE33
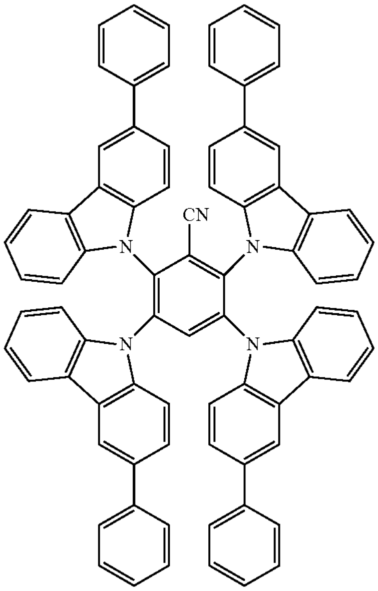
TDE34
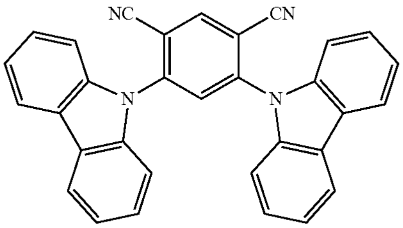

-continued
TDE35
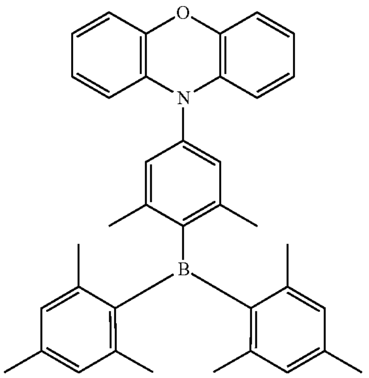
TDE36
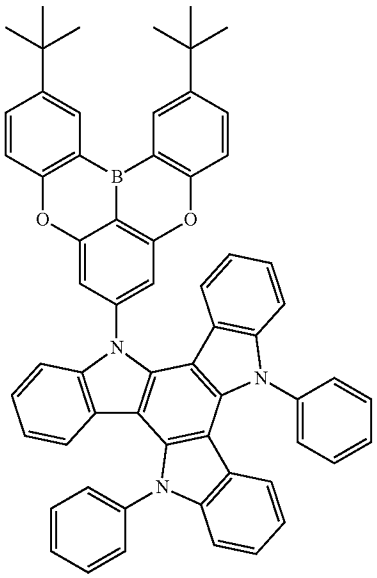
TDE37
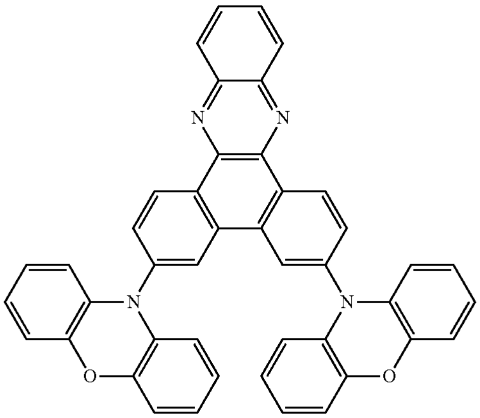
TDE38
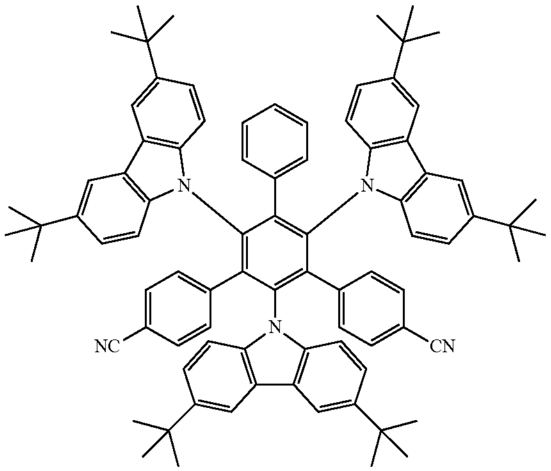
TDE39
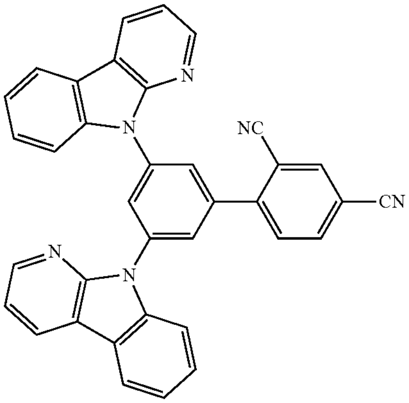
TDE40
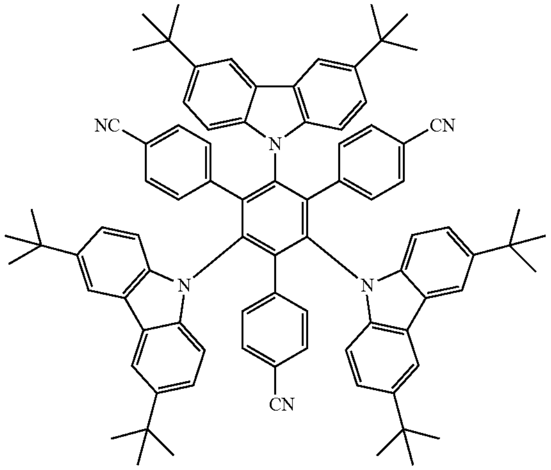

-continued
TDE41
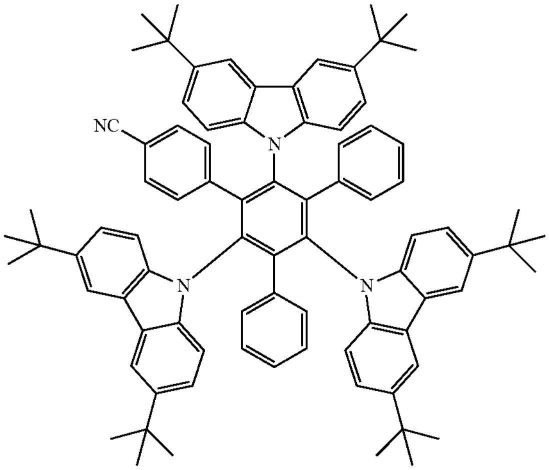
TDE42
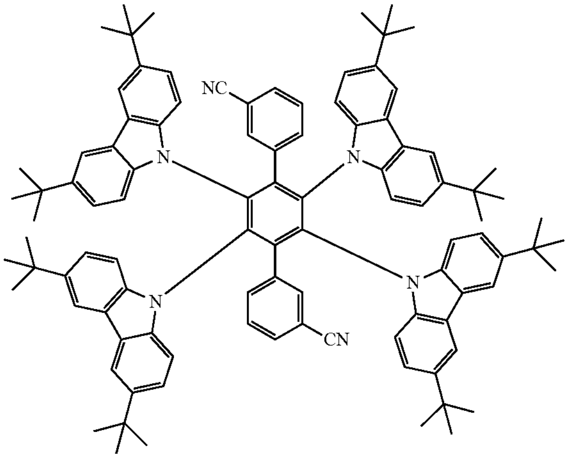
TDE43
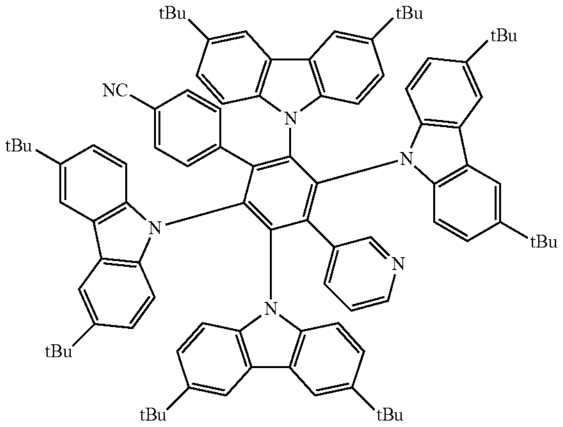
TDE44
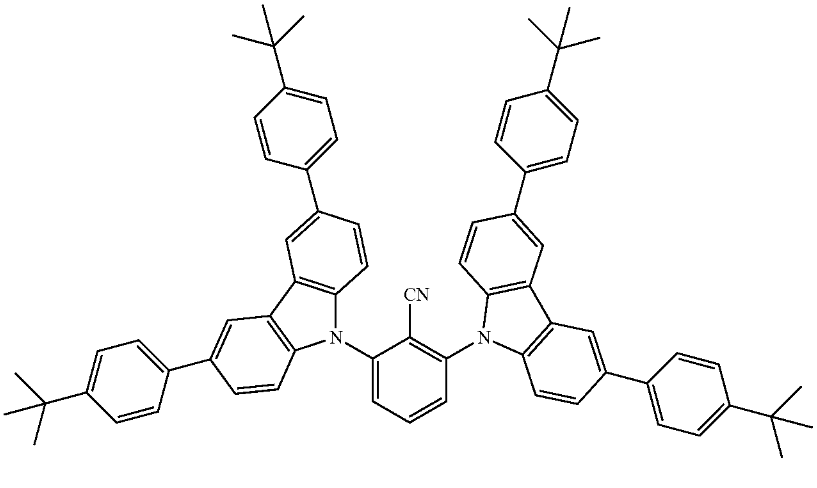

-continued
TDE45
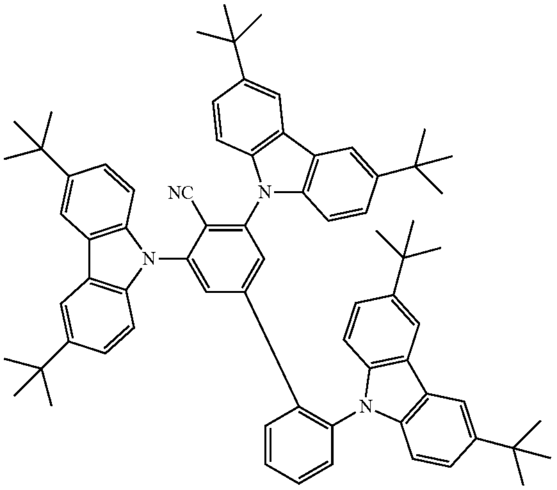
In an alternative embodiment, the second host material in the second light-emitting layer (EML-2) is a triplet-triplet annihilation host material and may be selected from one or a combination of at least two of compounds H1 to H55:
H1
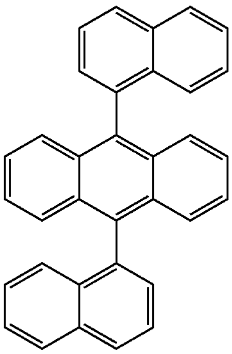
H2
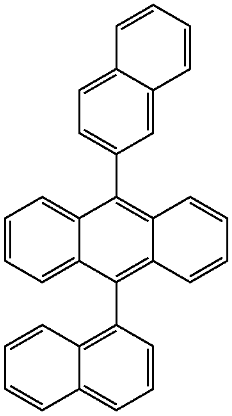
-continued
H3
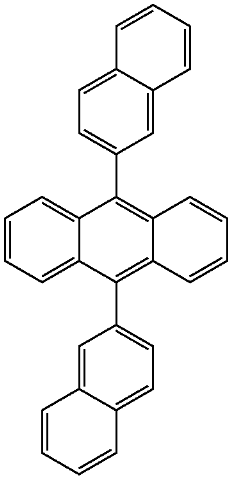
H4
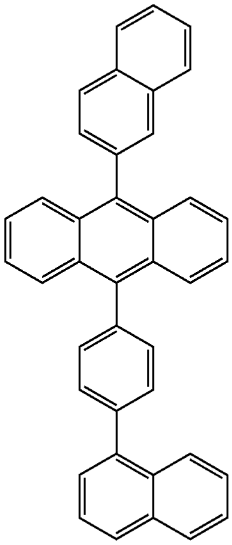

-continued
H5
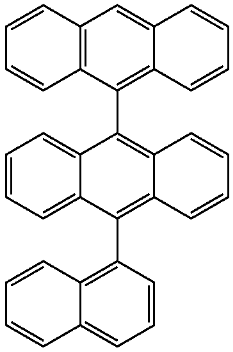
H6
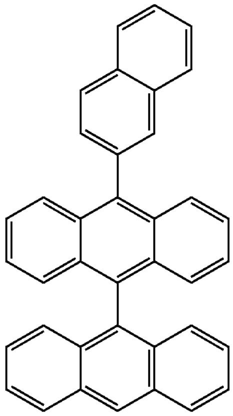
H7
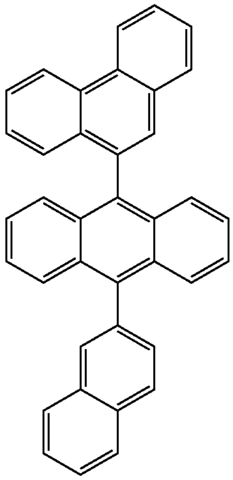
-continued
H8
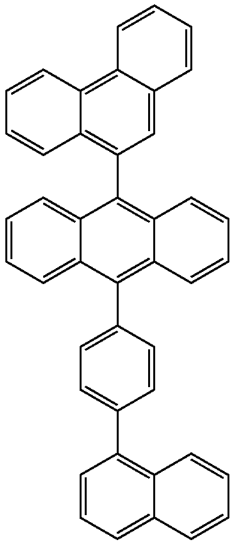
H9
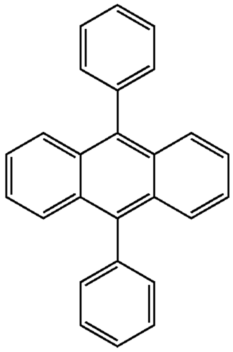
H10
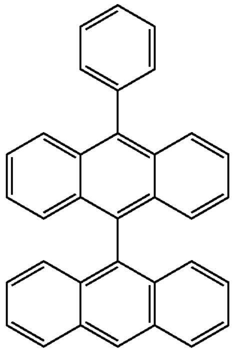

-continued
H11
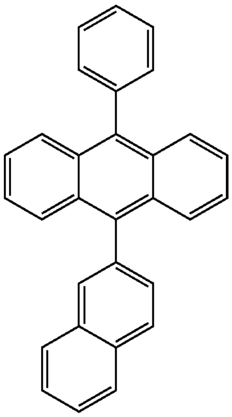
H12
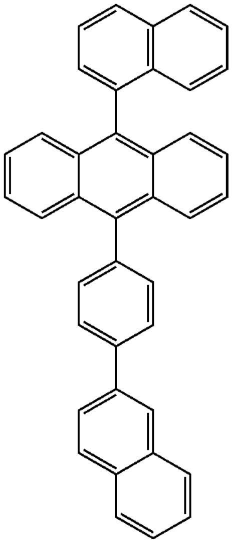
H13
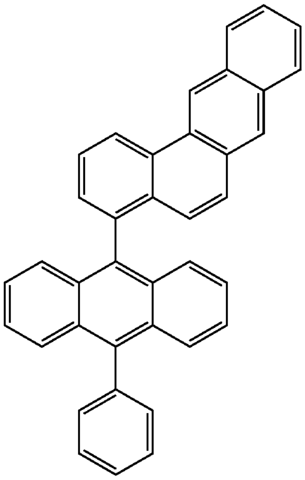
-continued
H14
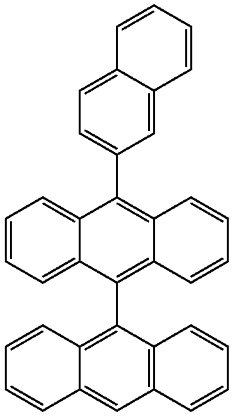
H15
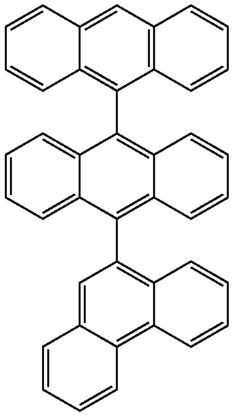
H16
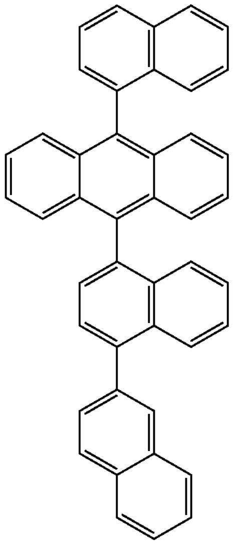

-continued
H17
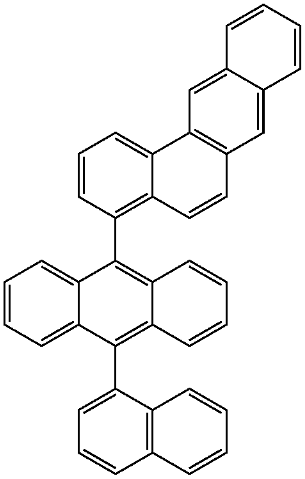
H18
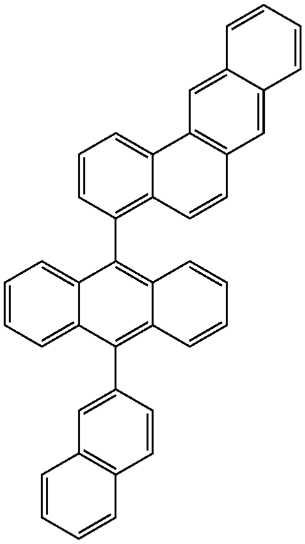
H19
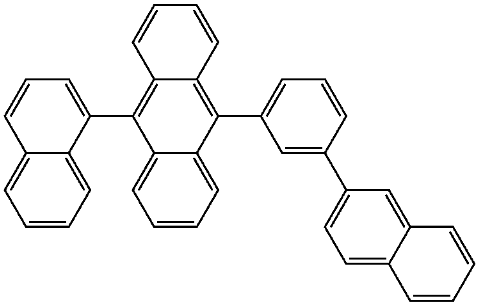
H20
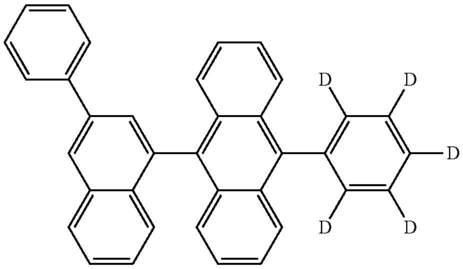
-continued
H21
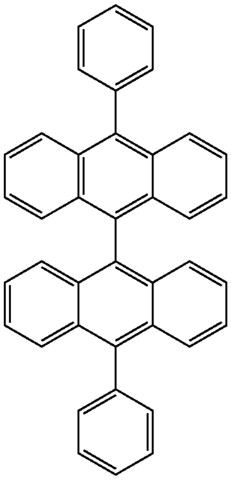
H22
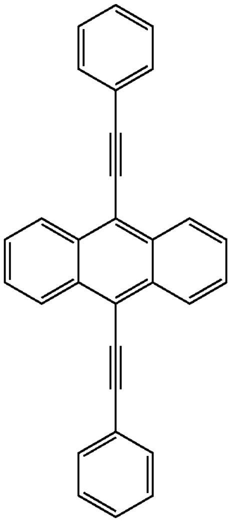
H23
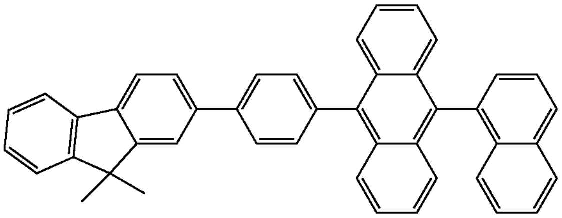
H24
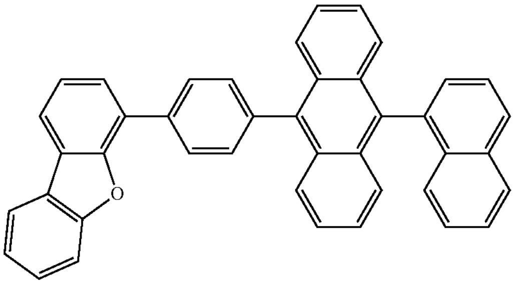

-continued
H25
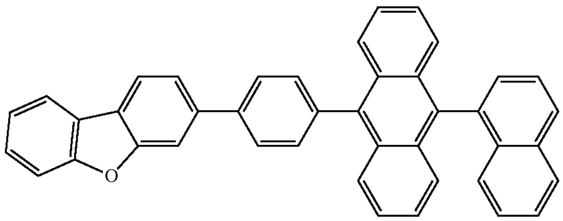
H26
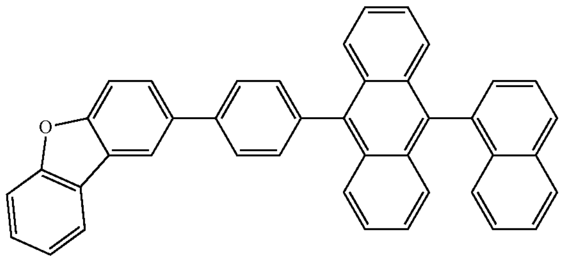
H27
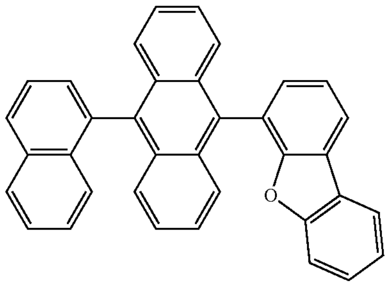
H28
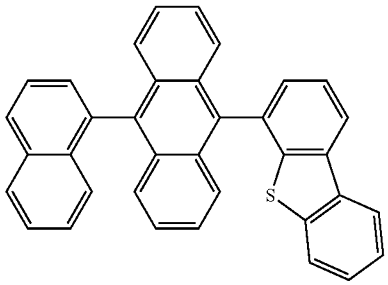
H29
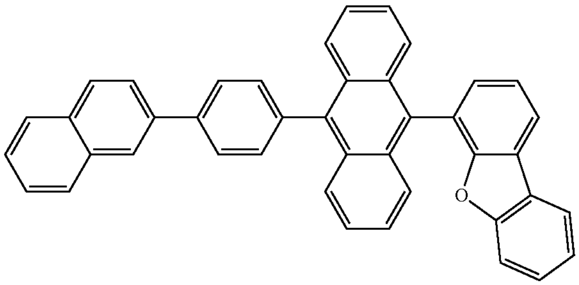
-continued
H30
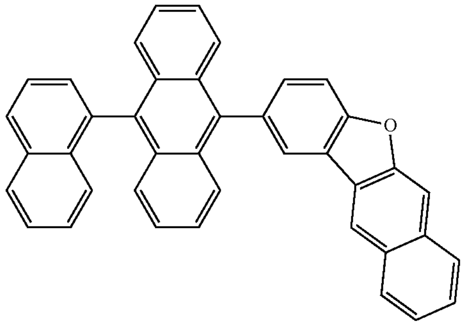
H31
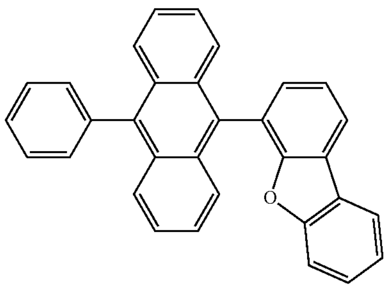
H32
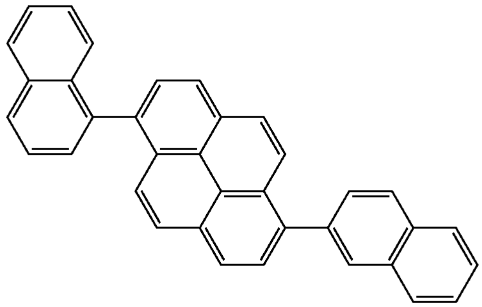
H33
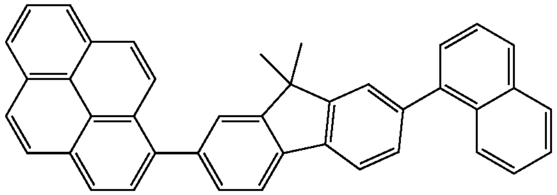
H34
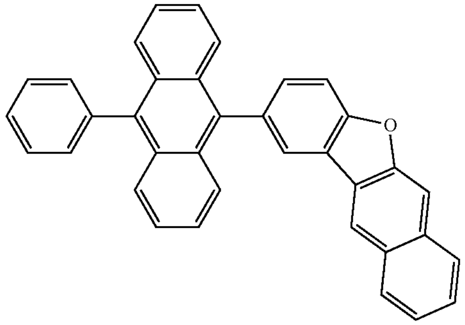

-continued
H35
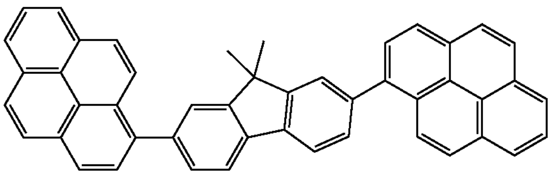
H36
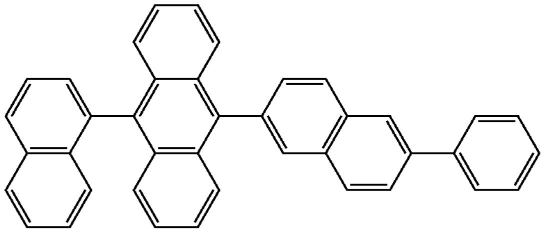
H37
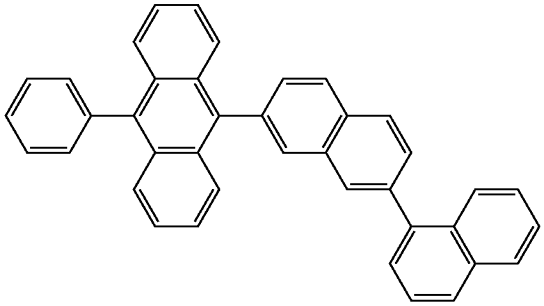
H38
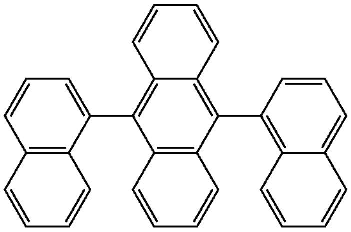
H39
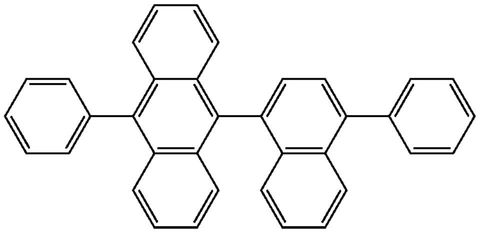
H40
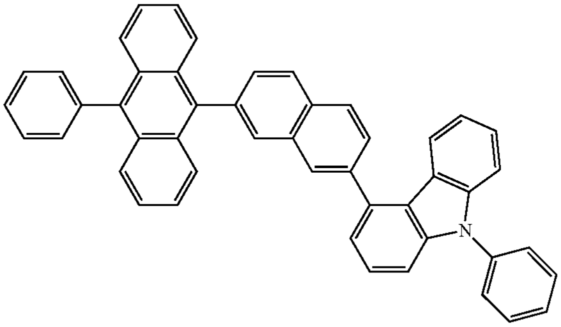
-continued
H41
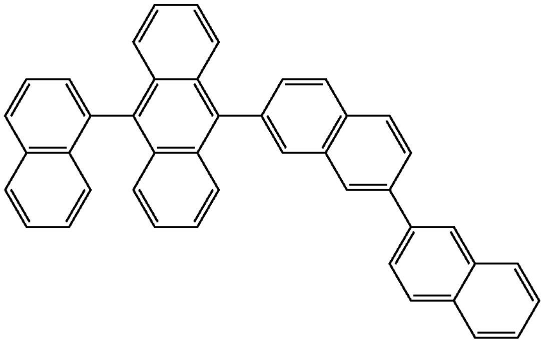
H42
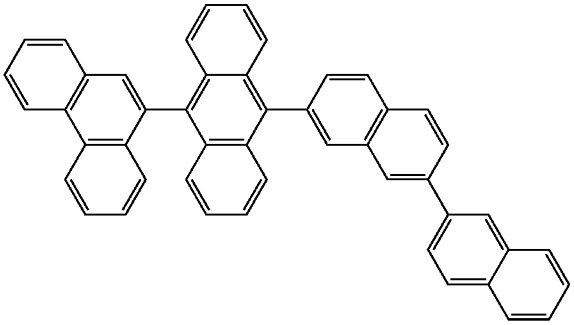
H43
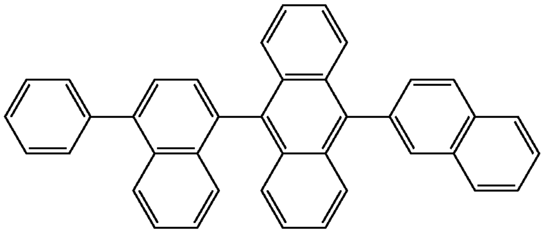
H44
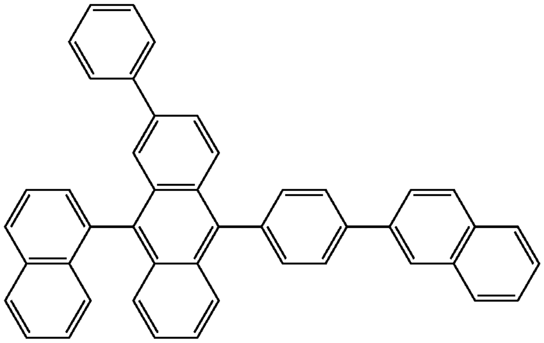
H45
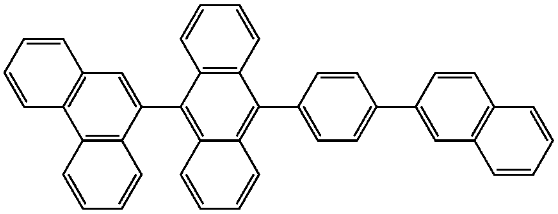

-continued

H46

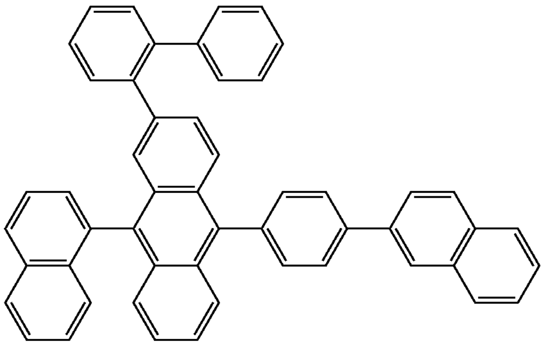

H47

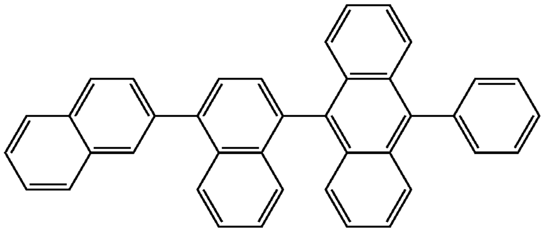

H48

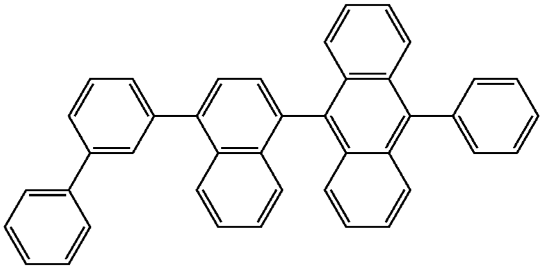

H49

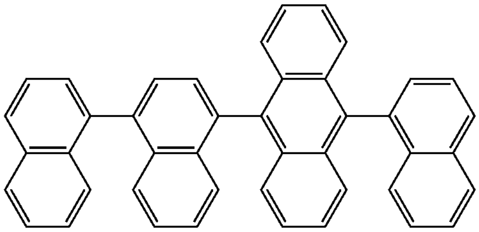

H50

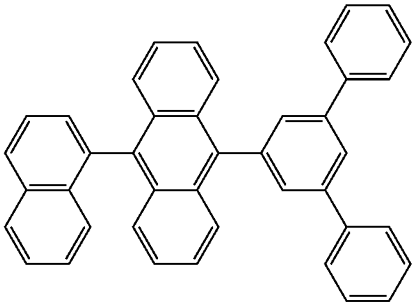

-continued

H51

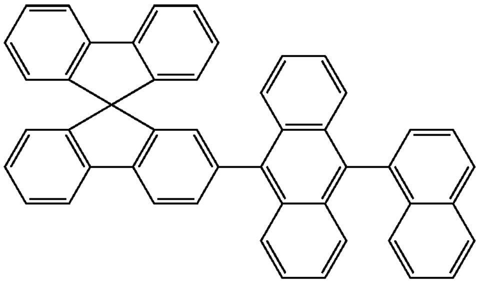

H52

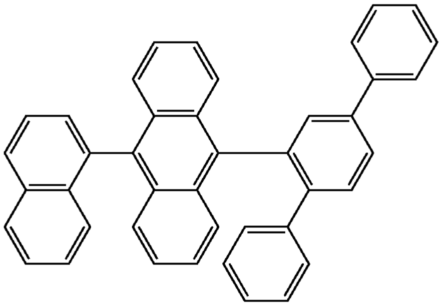

H53

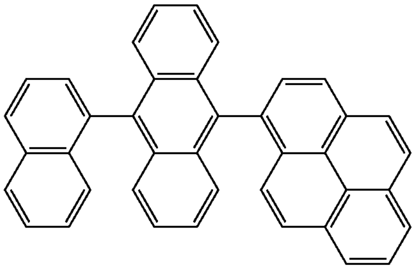

H54

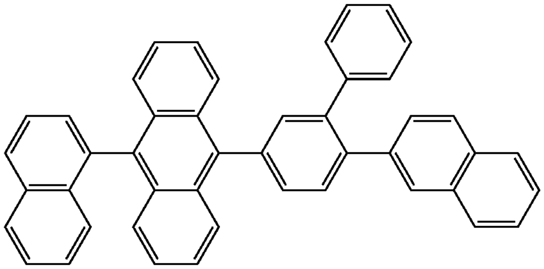

H55

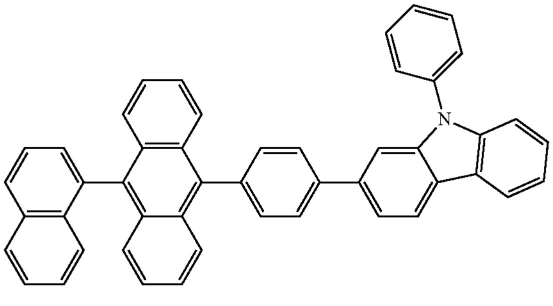

.

Materials of the first hole transport layer (HTL-1), the second hole transport layer (HTL-2), the first electron blocking layer (EBL-1) and the second electron blocking layer (EBL-2) may each be independently selected from, but not limited to, phthalocyanine derivatives such as CuPc, conductive polymers, polymers containing conductive dopants such as poly (p-phenylene polyaniline/dodecyl benzenesulfonic acid (PANI/DBSA), poly(3,4-vinylene), ethylenedioxythiophene)/poly (sodium 4-styrenesulfonate) (PEDOT/PSS), polyaniline/camphorsulfonic acid (PANI/CSA) or polyaniline/poly (sodium 4-styrenesulfonate) (PANI/PSS), or aromatic amine derivatives. The aromatic amine derivatives are compounds HT-1 to HT-51 as shown below or any combination thereof (for example, a combination of HT-3 and HT-23 or a combination of HT-6, HT-5 and HT-12).

HT-1

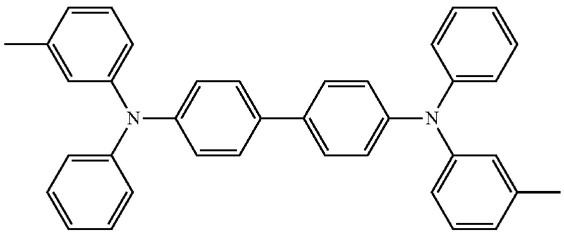

HT-2

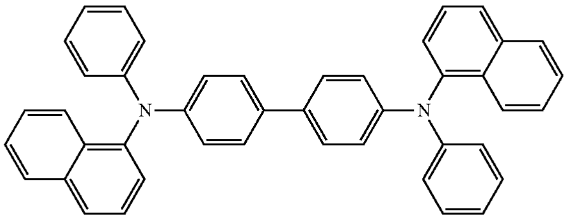

HT-3

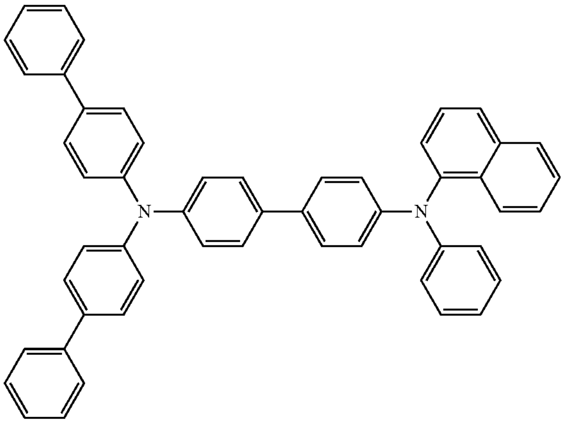

-continued

HT-4

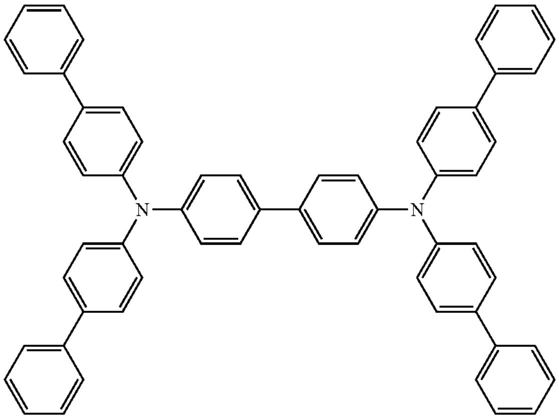

HT-5

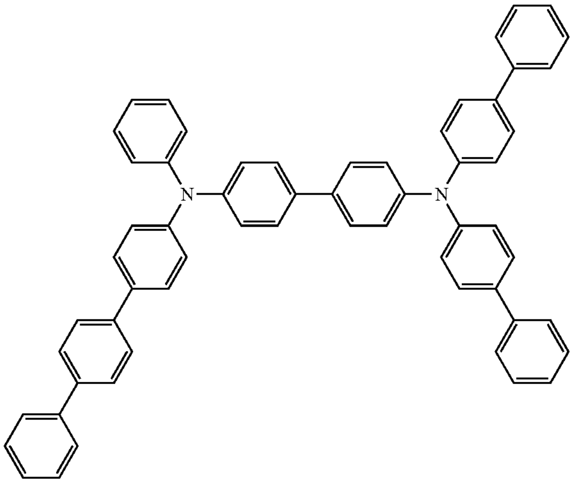

HT-6

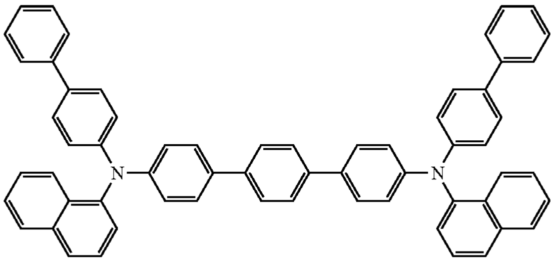

HT-7

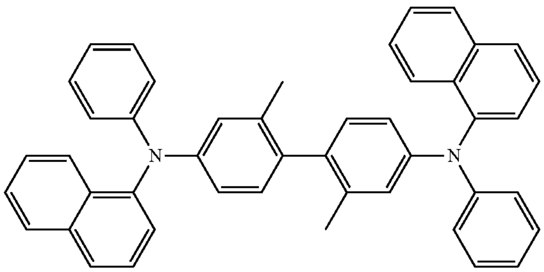

-continued
HT-8
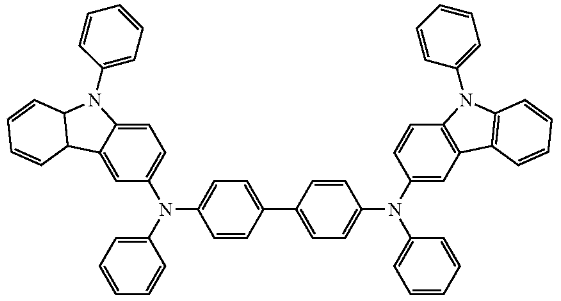
HT-9
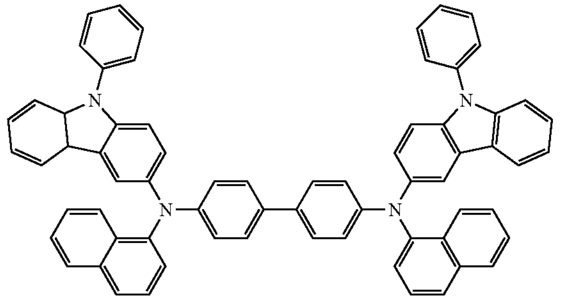
HT-10
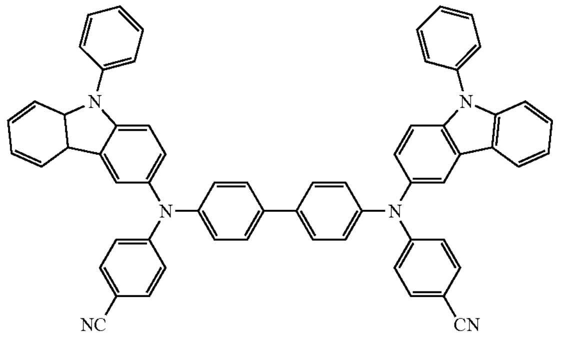
HT-11
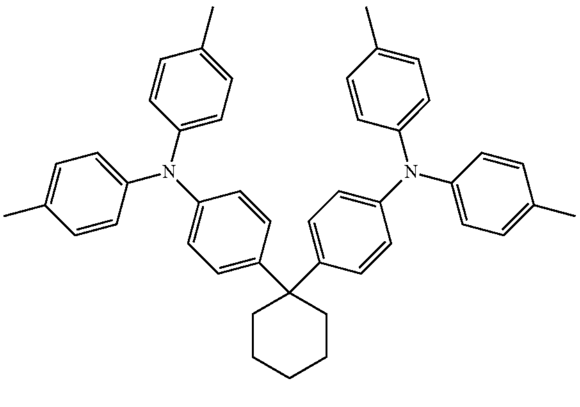
-continued
HT-12
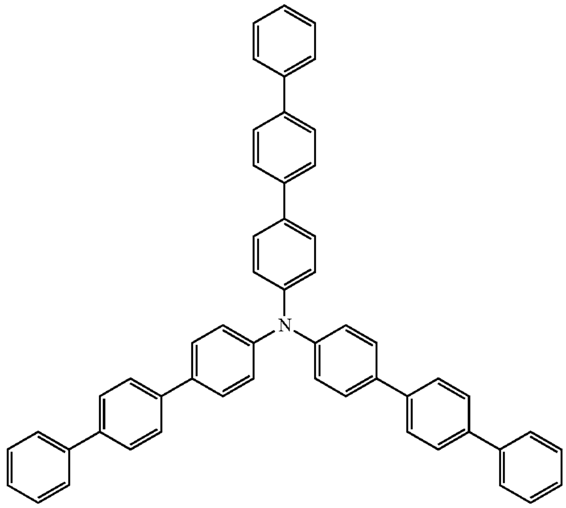
HT-13
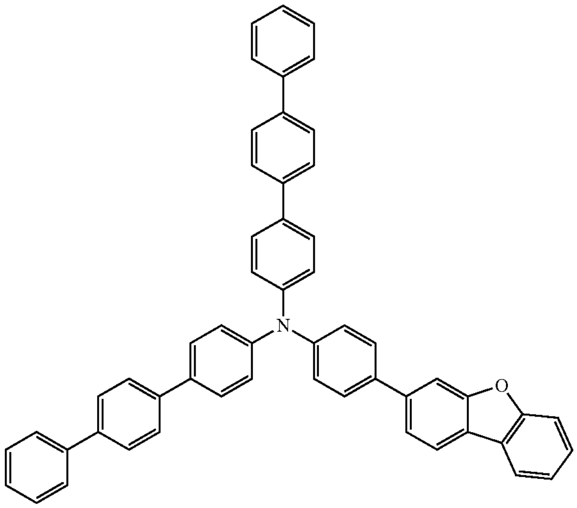
HT-14
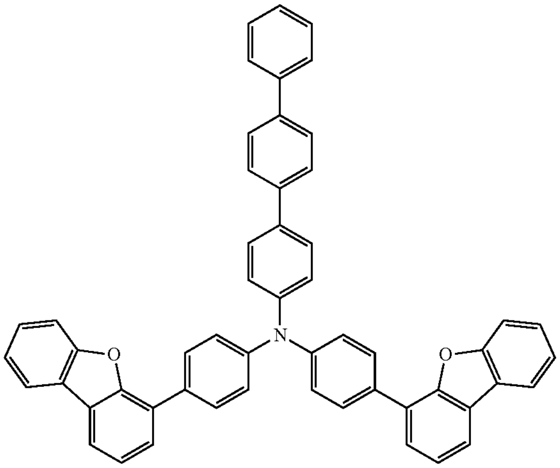

-continued
HT-15
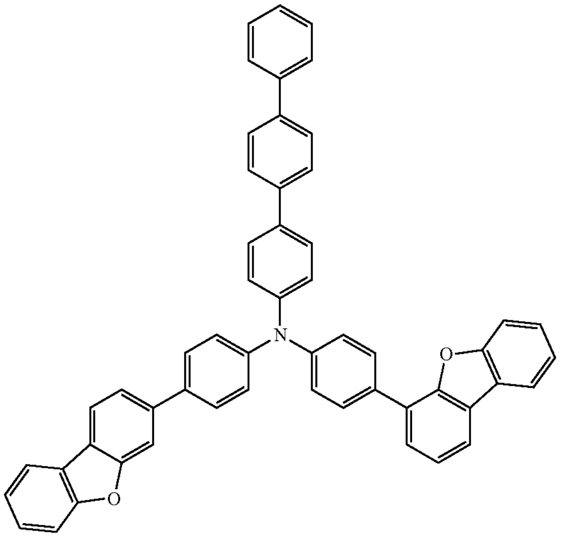
HT-16
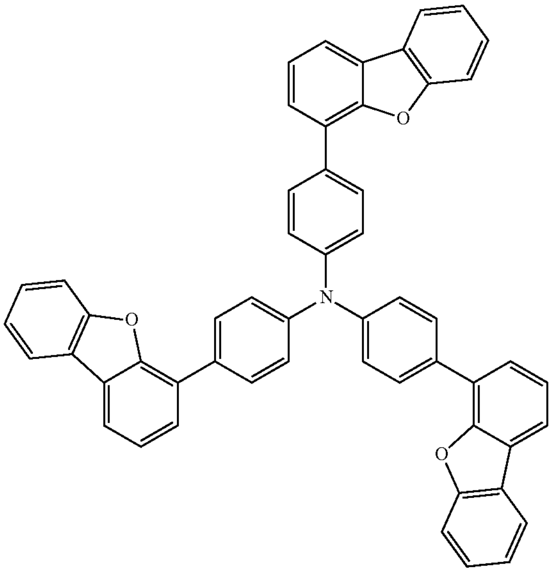
HT-17
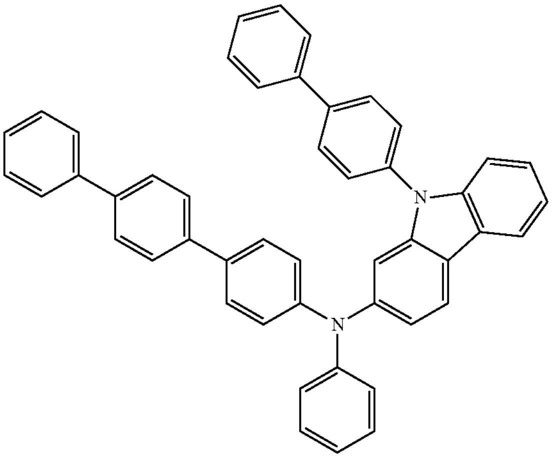
-continued
HT-18
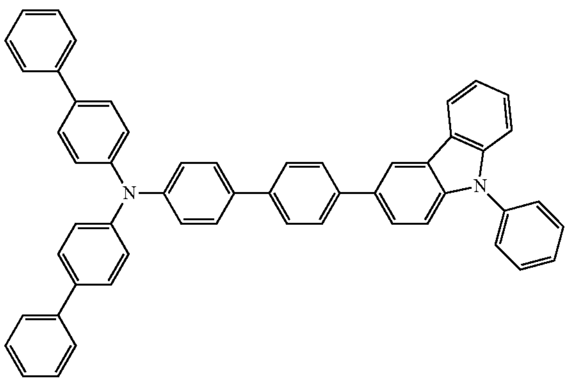
HT-19
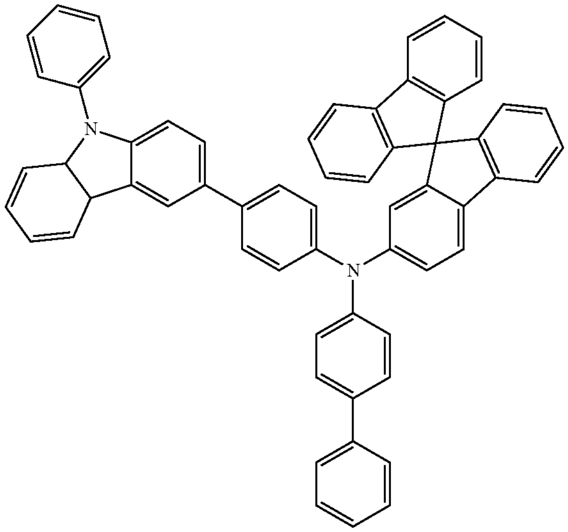
HT-20
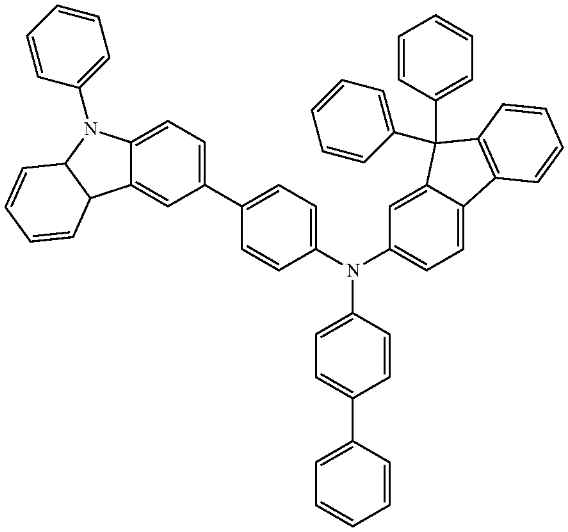

-continued
HT-21
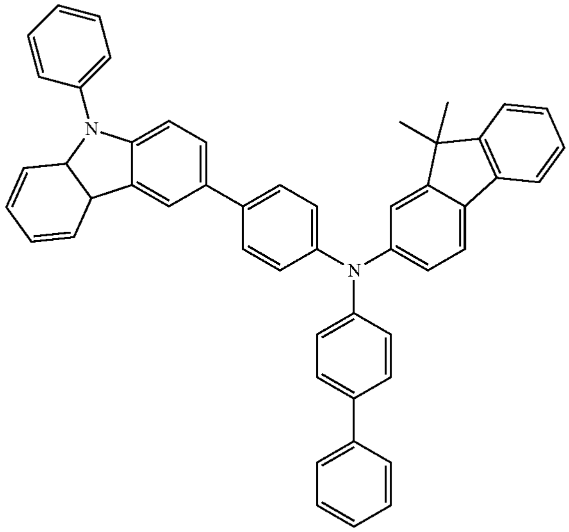
HT-22
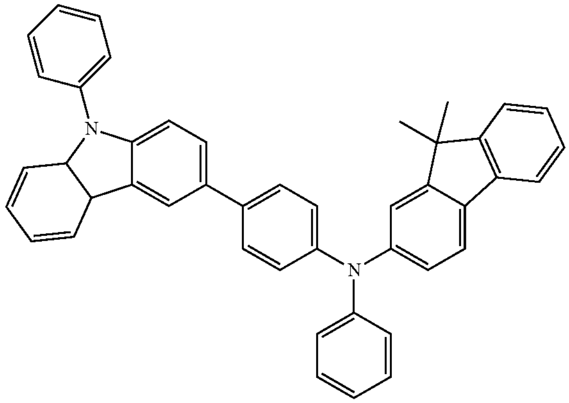
HT-23
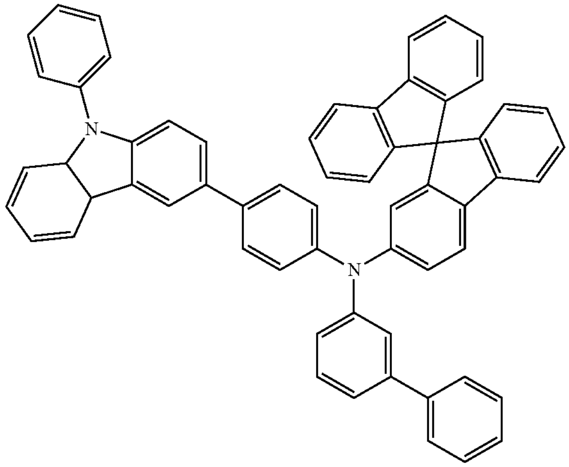
-continued
HT-24
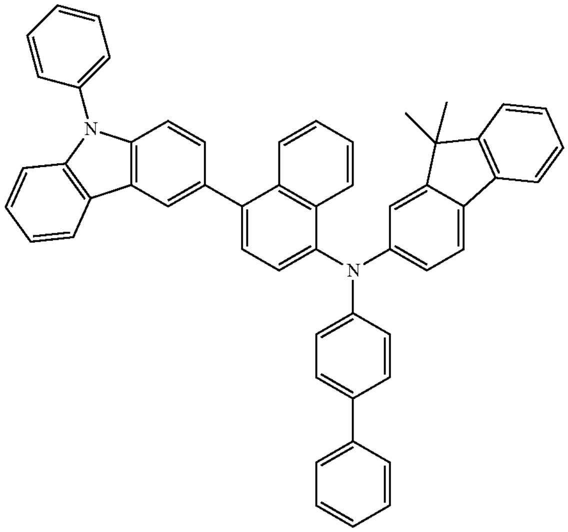
HT-25
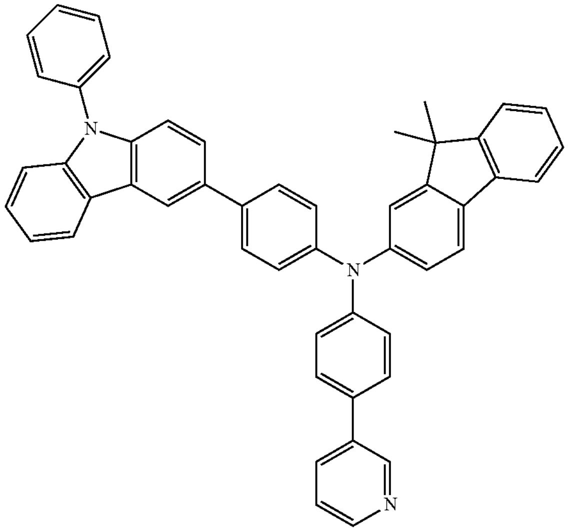
HT-26
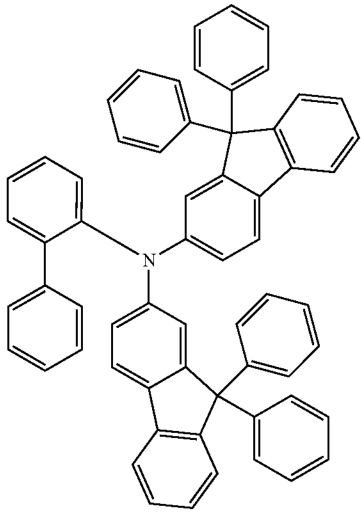

-continued
HT-27
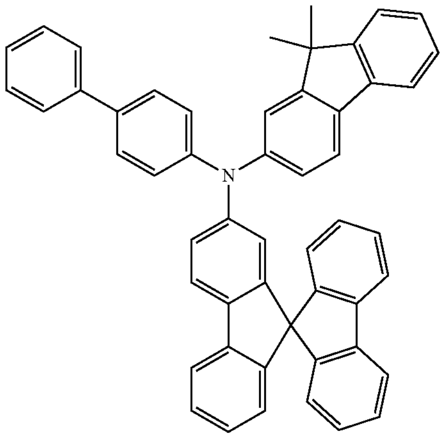
HT-28
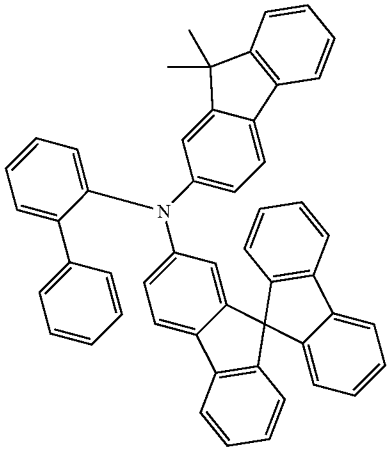
HT-29
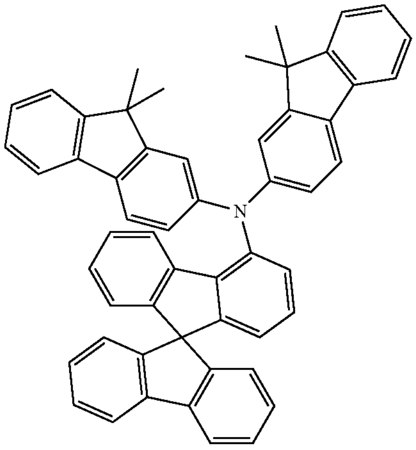
-continued
HT-30
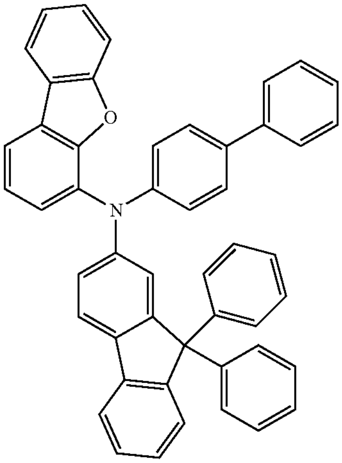
HT-31
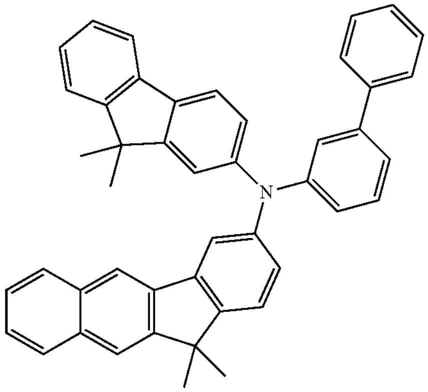
HT-32
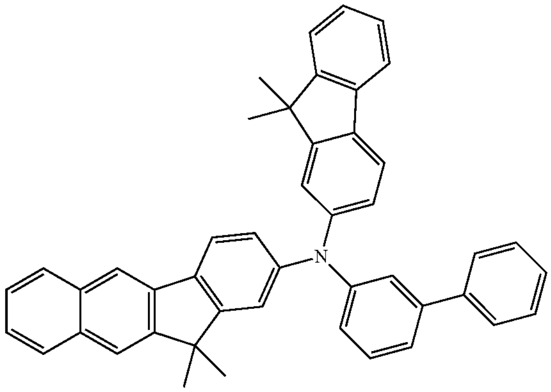

-continued
HT-33
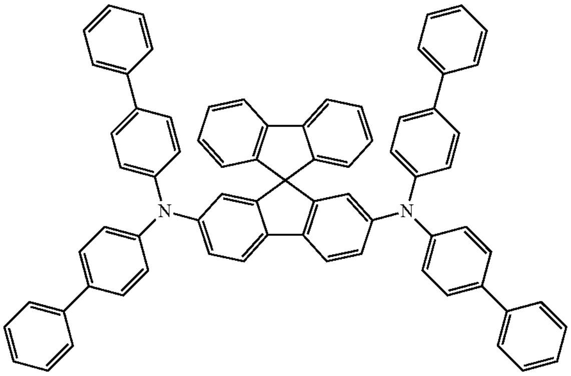
HT-34
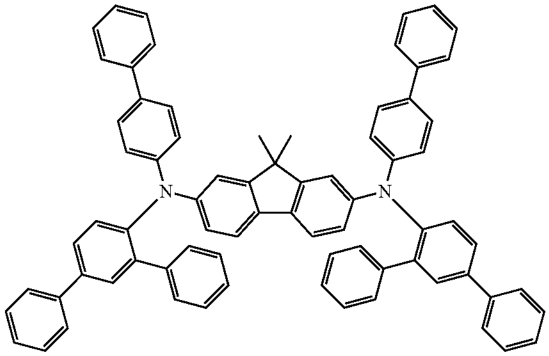
HT-35
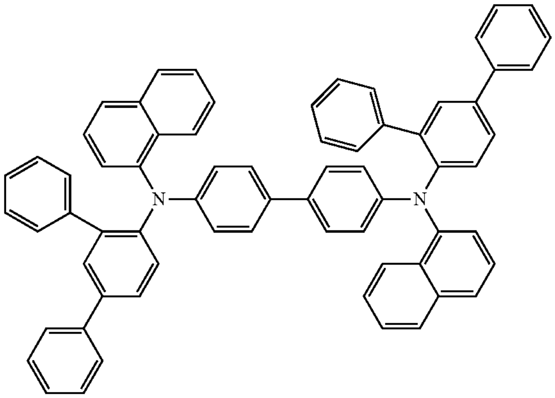
HT-36
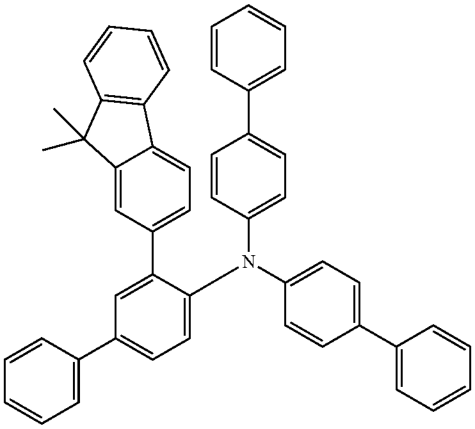
-continued
HT-37
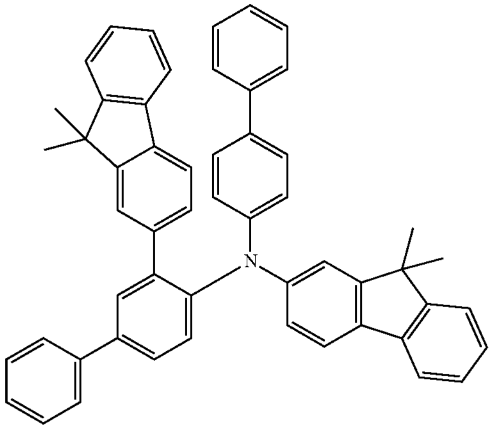
HT-38
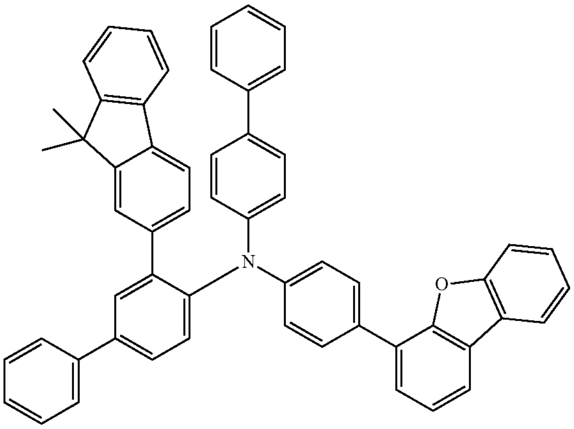
HT-39
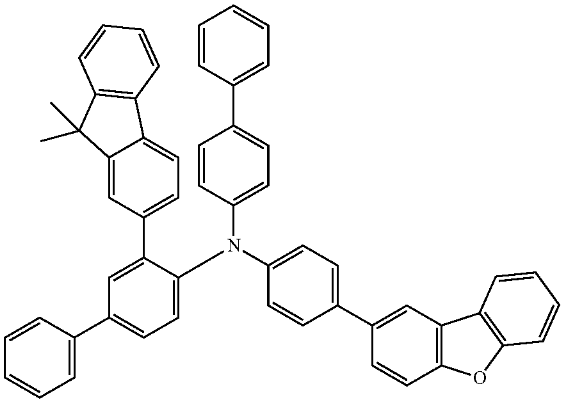

-continued
HT-40
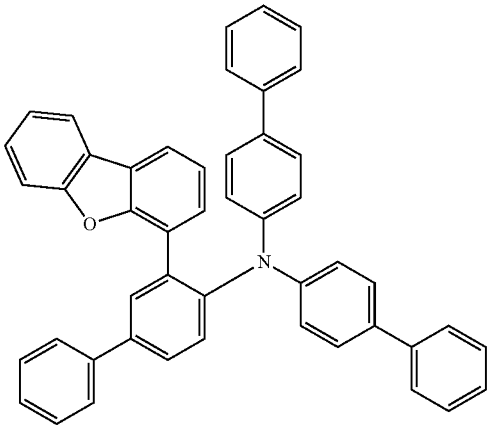
HT-41
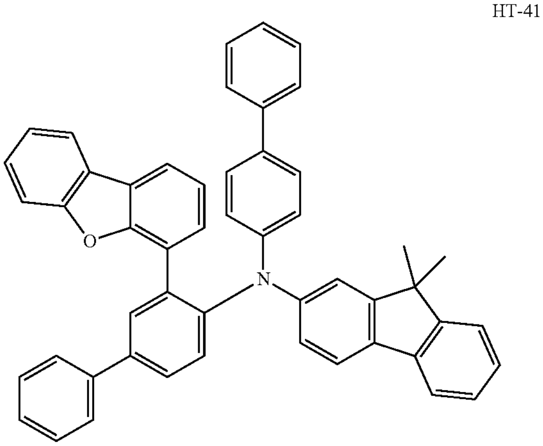
HT-42
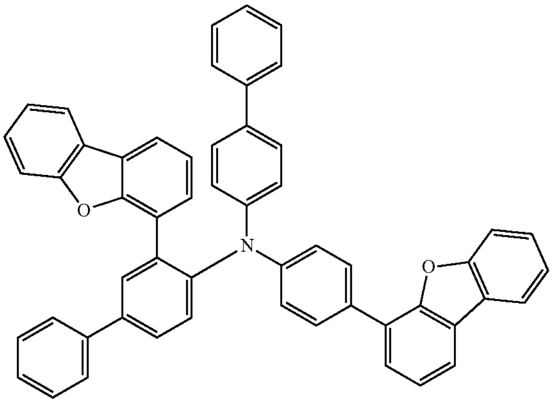
-continued
HT-43
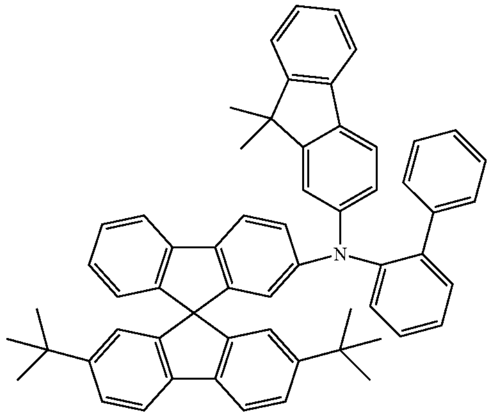
HT-44
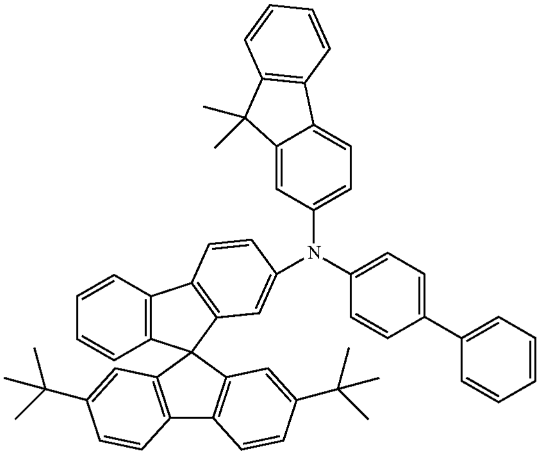
HT-45
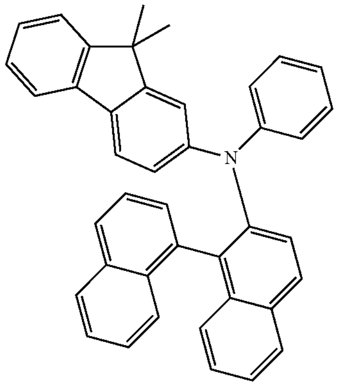
HT-46
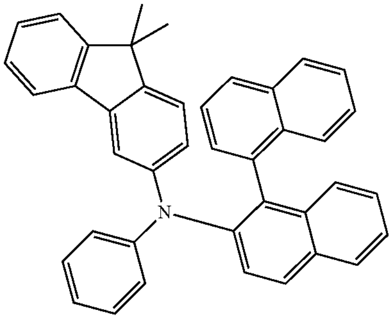

-continued
HT-47
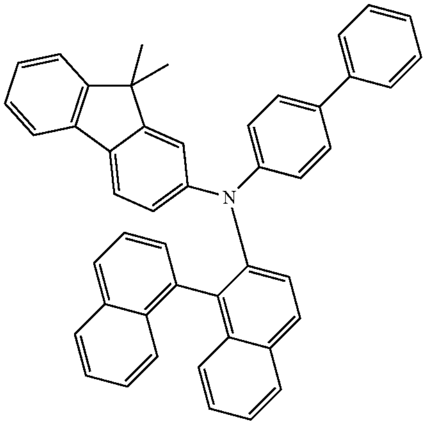
HT-48
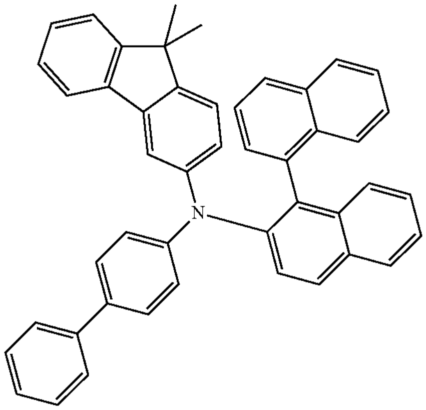
HT-49
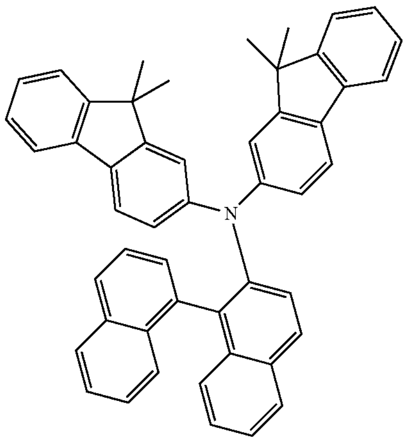
-continued
HT-50
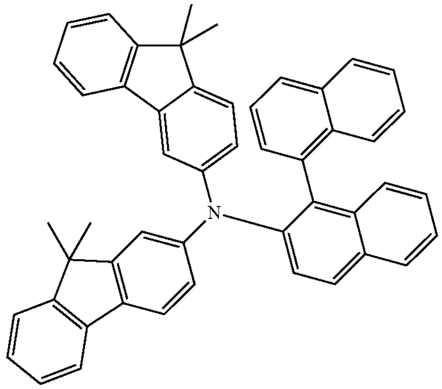
HT-51
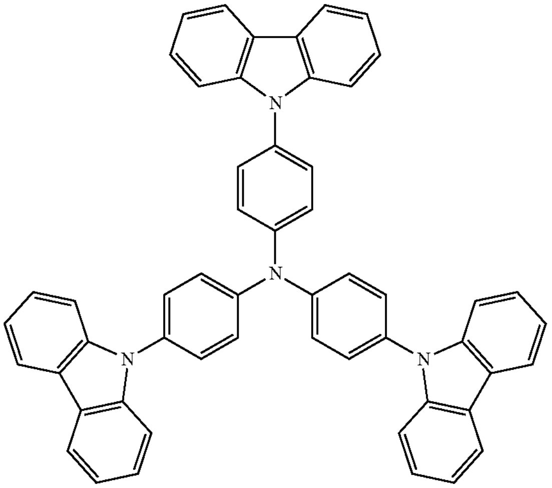
In an alternative embodiment, materials of the first electron blocking layer (EBL-1) and the second electron blocking layer (EBL-2) may be selected from any one or a combination of at least two of compounds EB-1 to EB-13 (for example, a combination of EB-3 and EB-2 or a combination of EB-6, EB-8 and EB-13):
EB-1
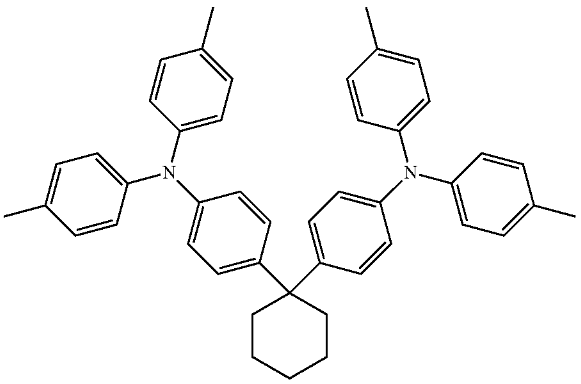

-continued
EB-2
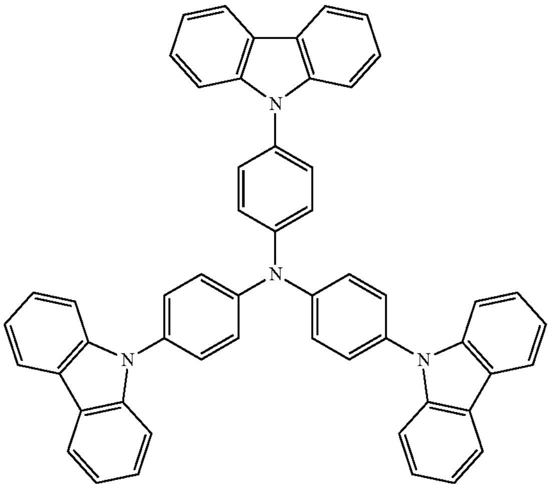
EB-3
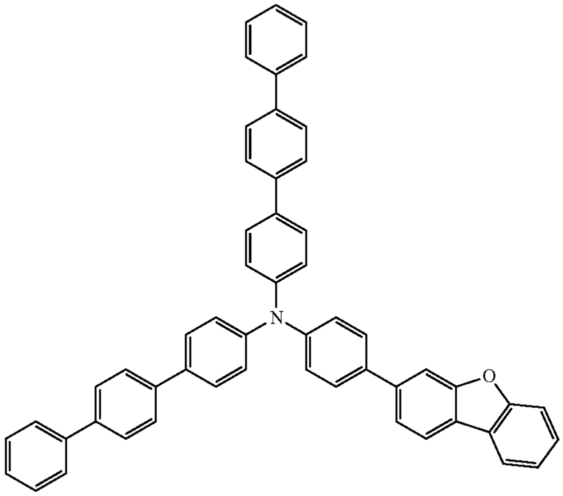
EB-4
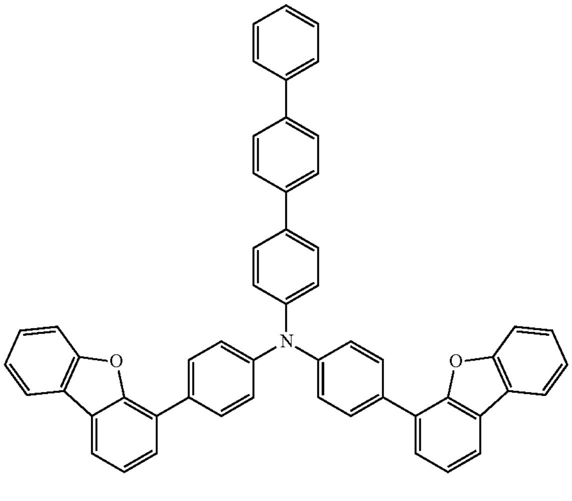
-continued
EB-5
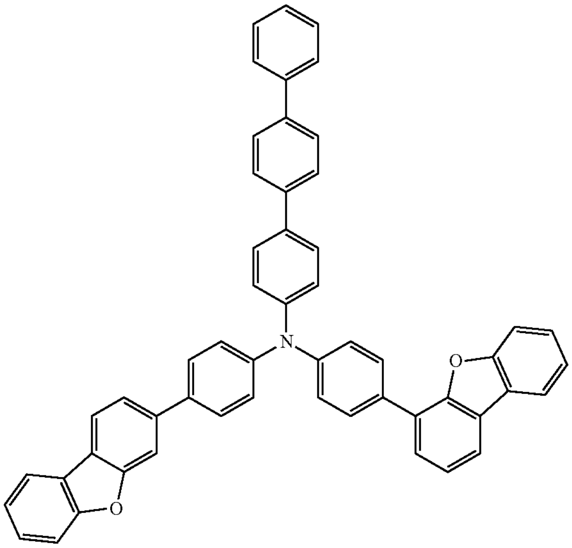
EB-6
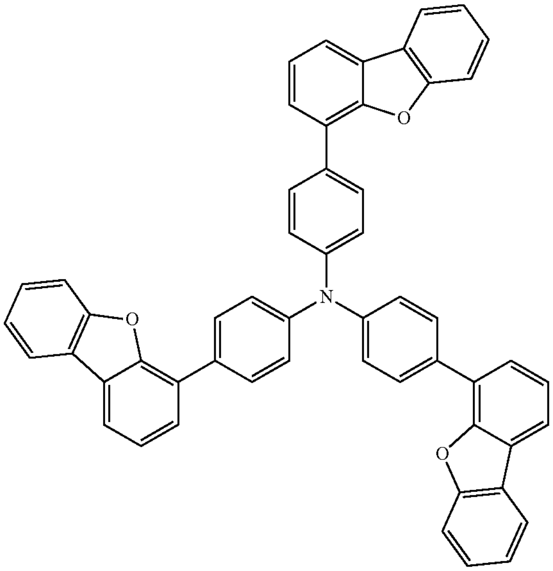
EB-7
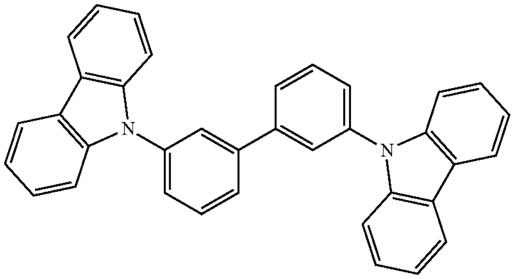

-continued
EB-8
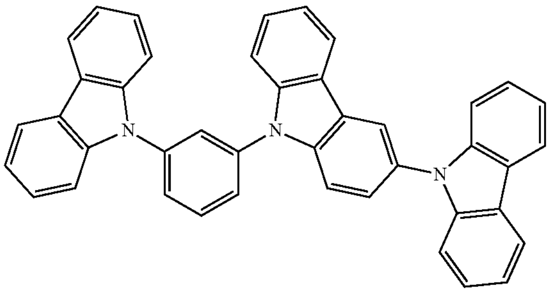
EB-9
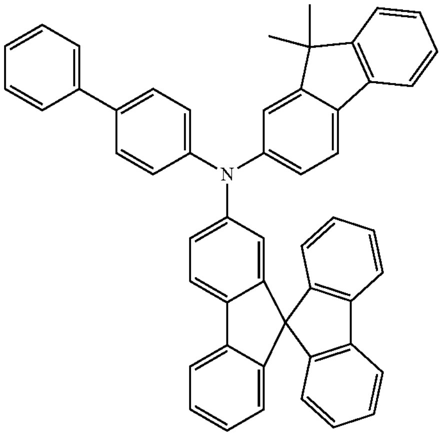
EB-10
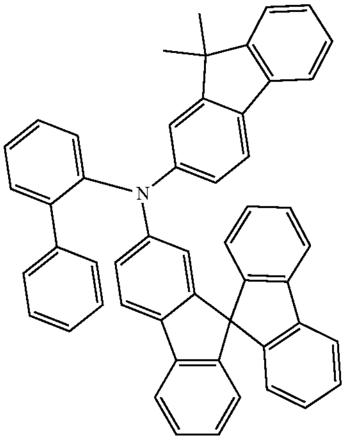
-continued
EB-11
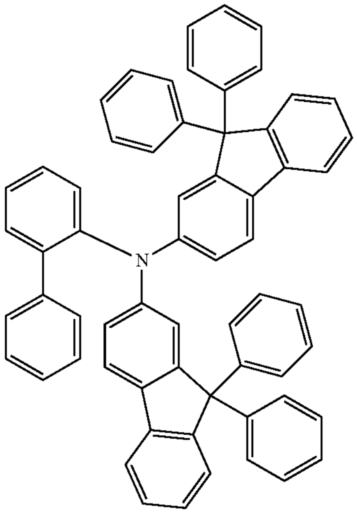
EB-12
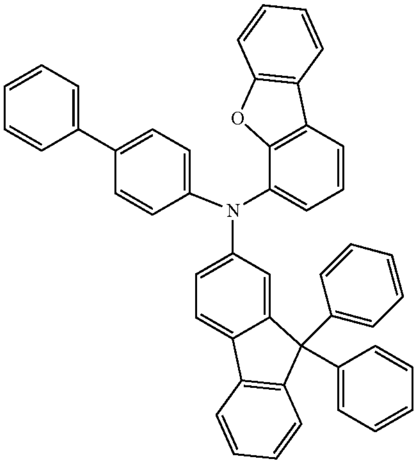
EB-13
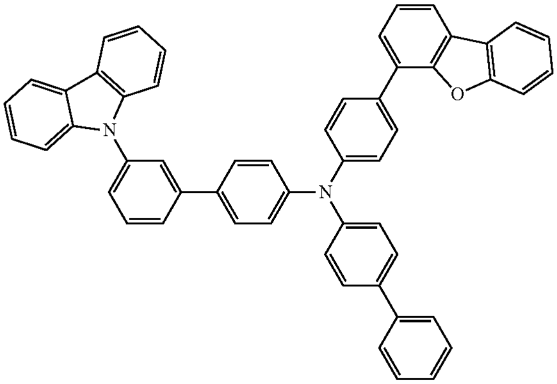
.

In an alternative embodiment, the first hole injection layer (HIL-1) and the second hole injection layer (HIL-1) each employ one or more of the compounds HT-1 to HT-51 above, one or more of the compounds HI-1 to HI-3 below or one or more of compounds HT-1 to HT-51 doping one or more of the compounds HI-1 to HI-3 below.

HI-1

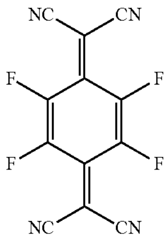

HI-2

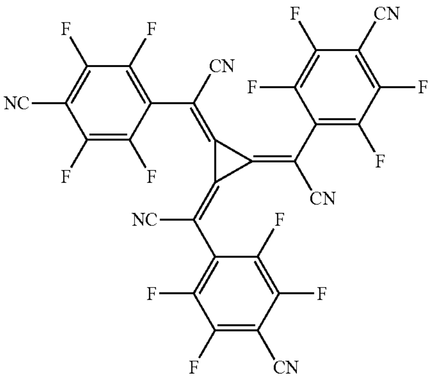

HI-3

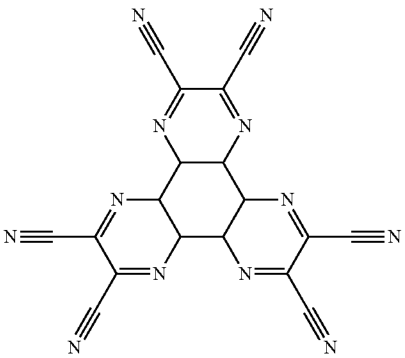

In an alternative embodiment, materials of the first electron transport layer (ETL-1) and the 10 second electron transport layer (ETL-2) are each selected from any one or a combination of at least two of compounds ET-1 to ET-65 (for example, a combination of ET-1 and ET-2, a combination of ET-5, ET-10 and ET-16 or a combination of ET-3, ET-30, ET-27 and ET-57):

ET-1

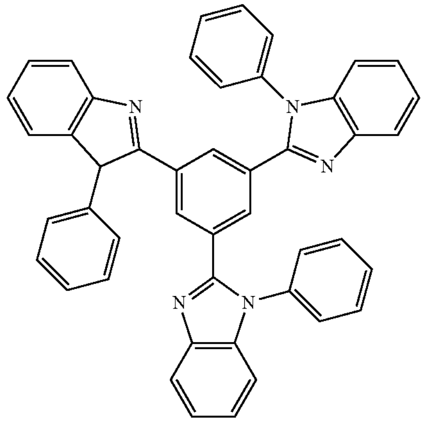

ET-2

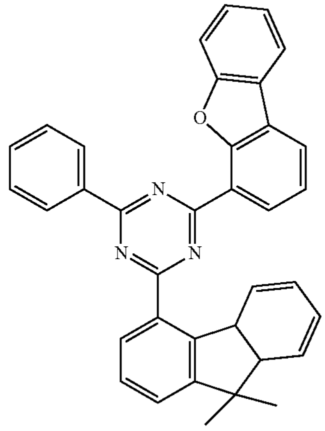

ET-3

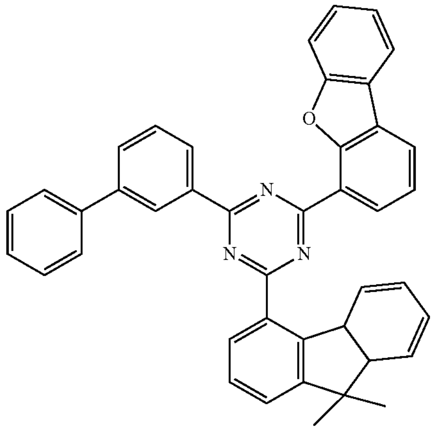

-continued
ET-4
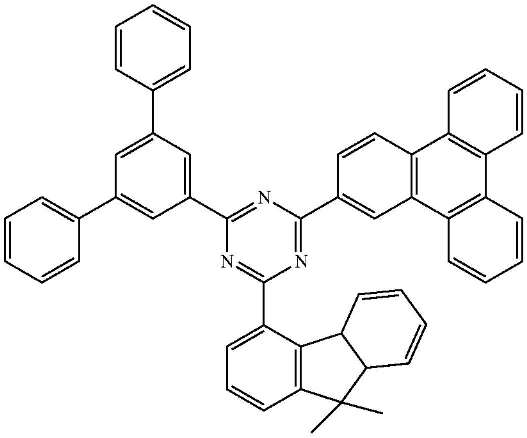
ET-5
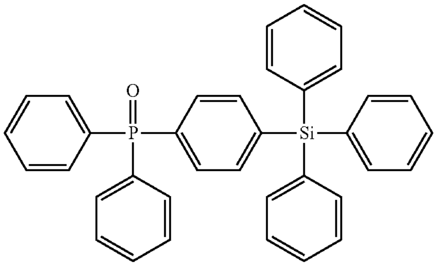
ET-6
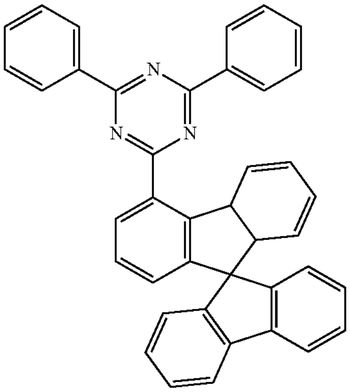
ET-7
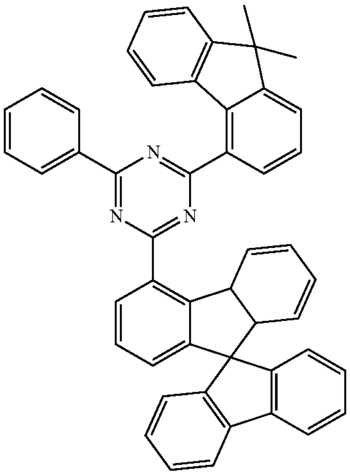
-continued
ET-8
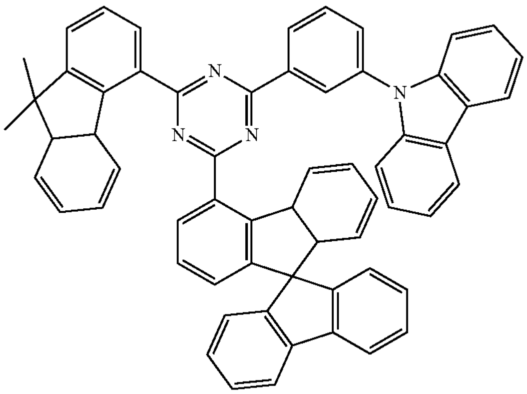
ET-9
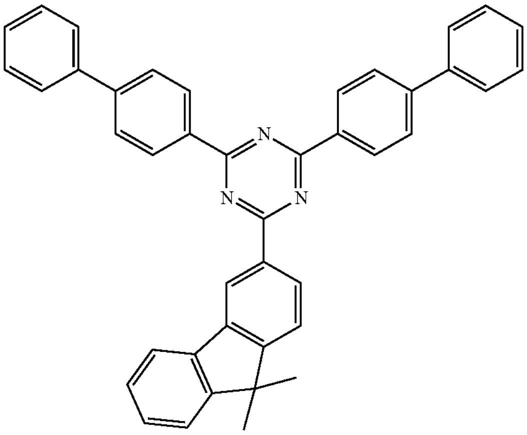
ET-10
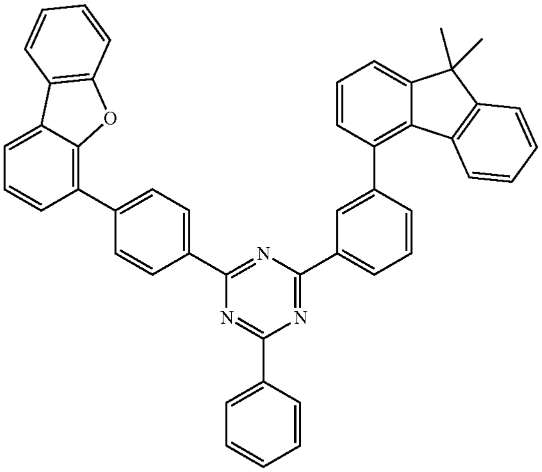

-continued
ET-11
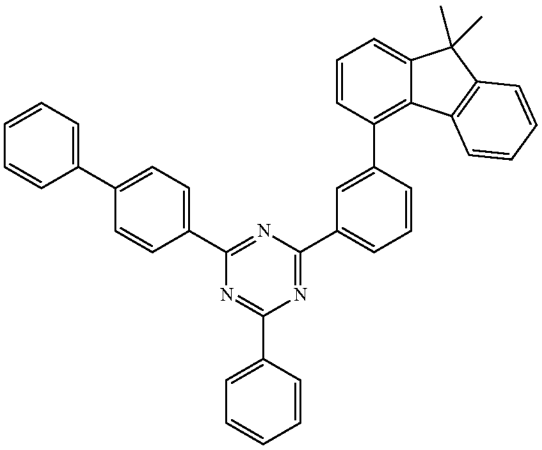
ET-12
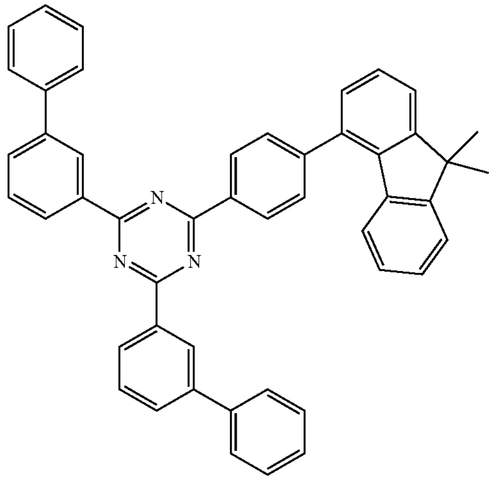
ET-13
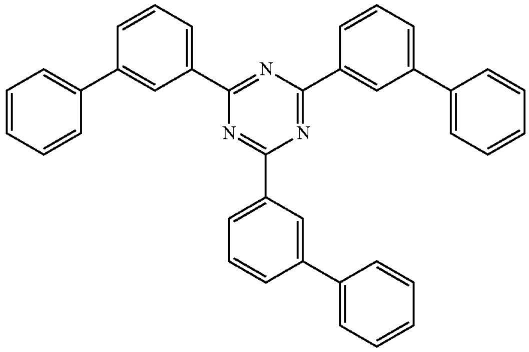
-continued
ET-14
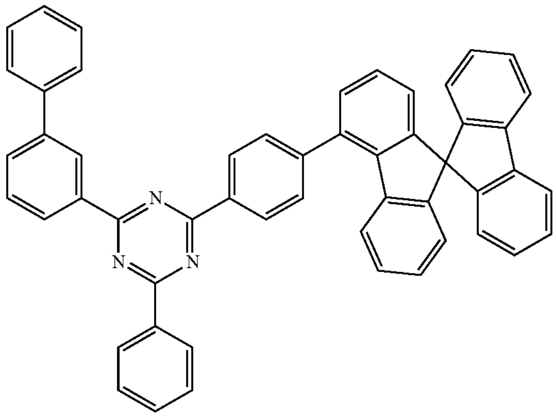
ET-15
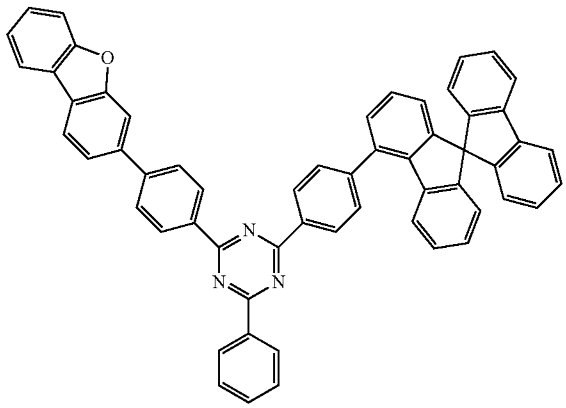
ET-16
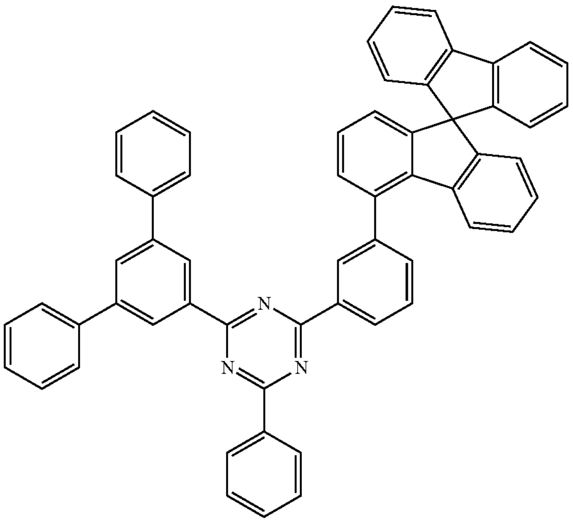

-continued
ET-17
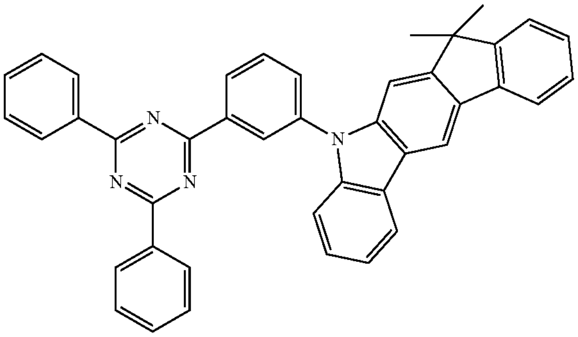
ET-18
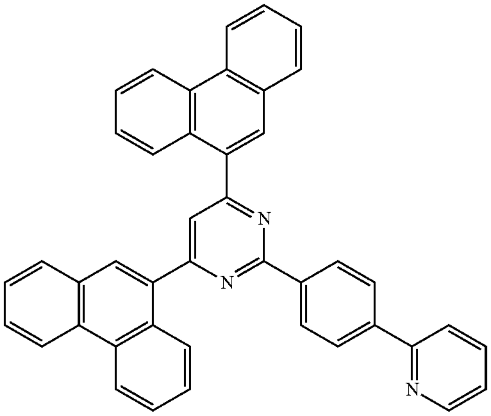
ET-19
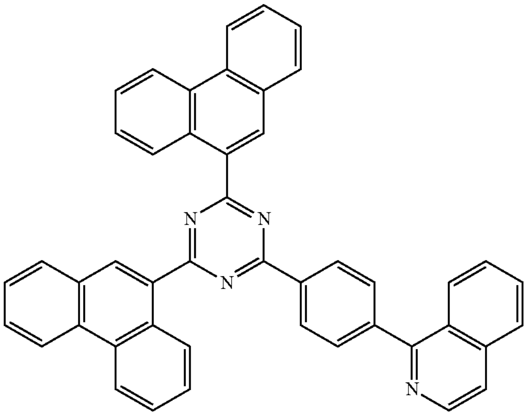
-continued
ET-20
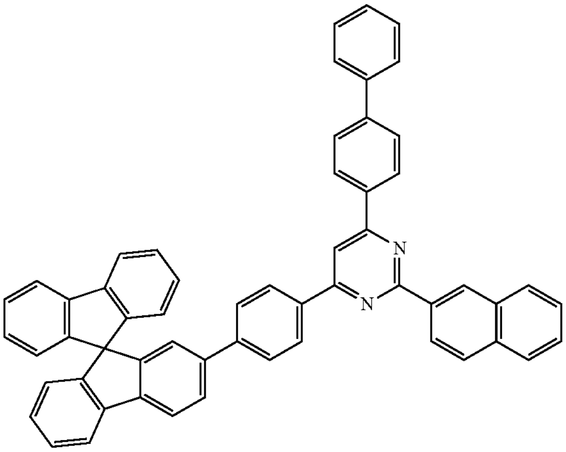
ET-21
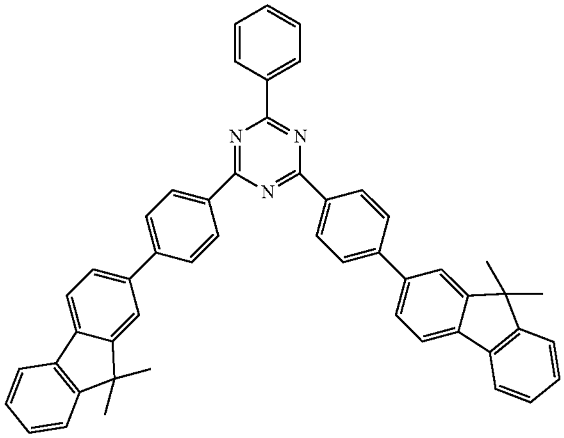
ET-22
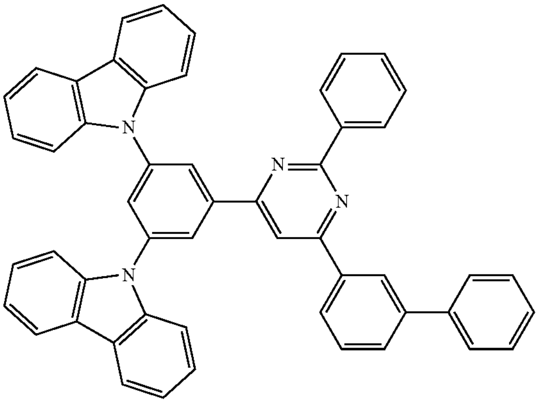

-continued
ET-23
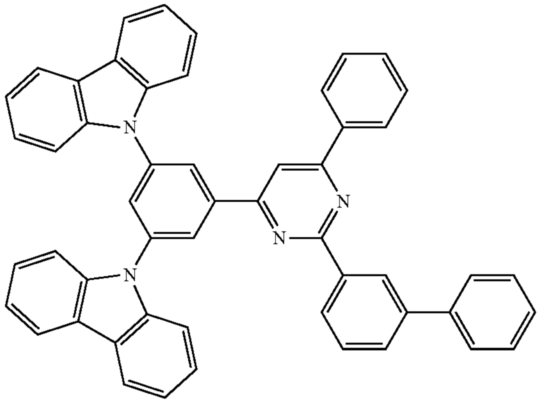
ET-24
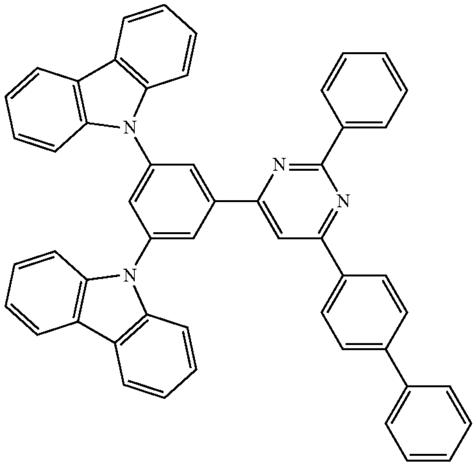
ET-25
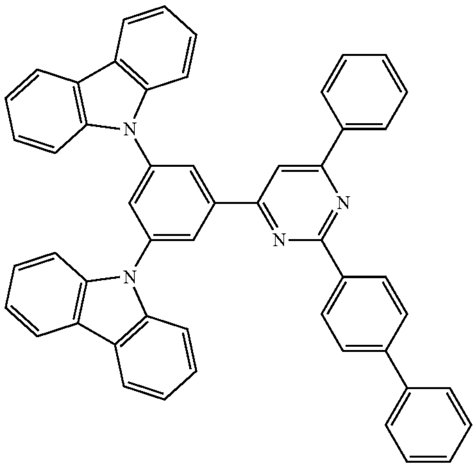
-continued
ET-26
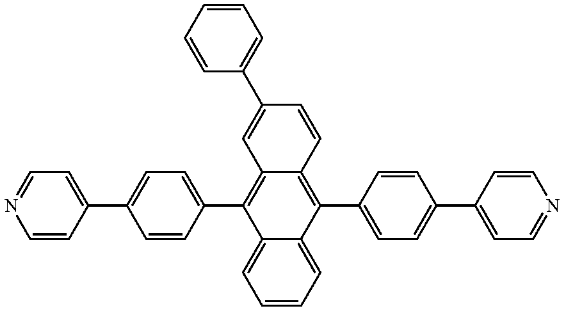
ET-27
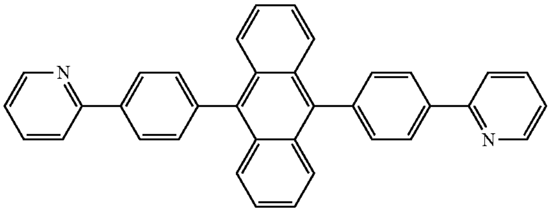
ET-28
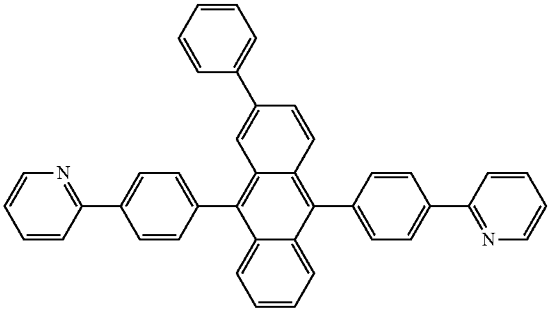
ET-29
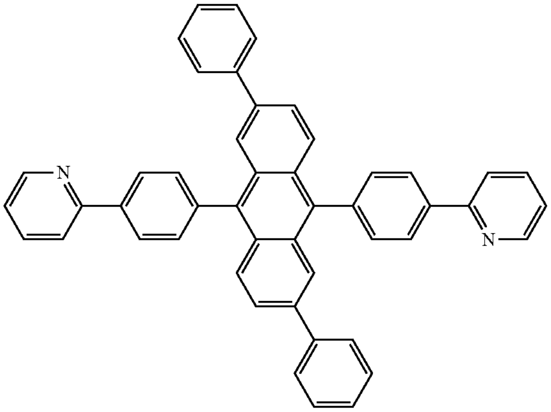
ET-30
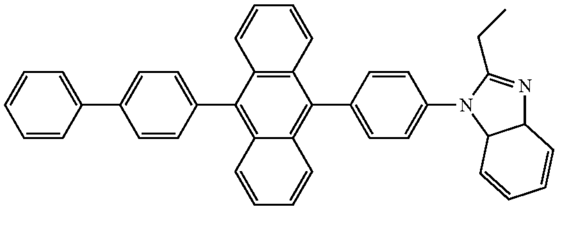

-continued
ET-31
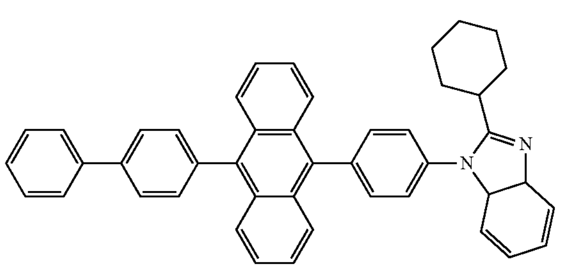
ET-32
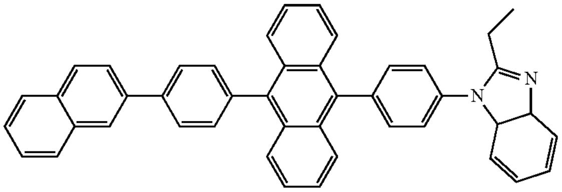
ET-33
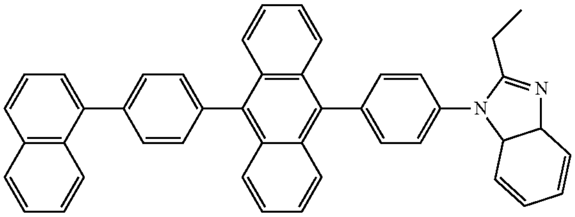
ET-34
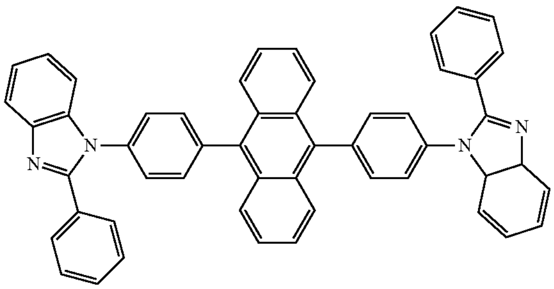
ET-35
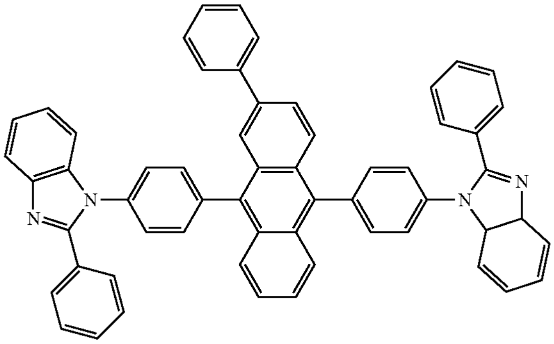
-continued
ET-36
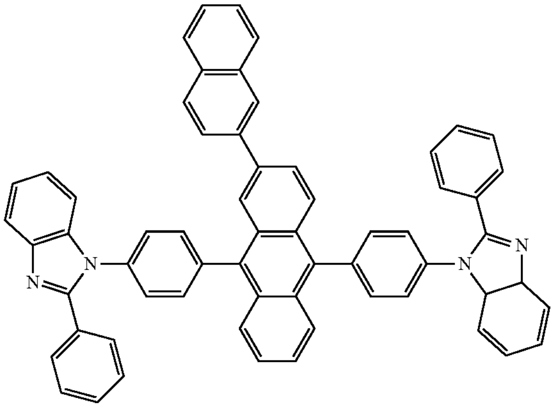
ET-37
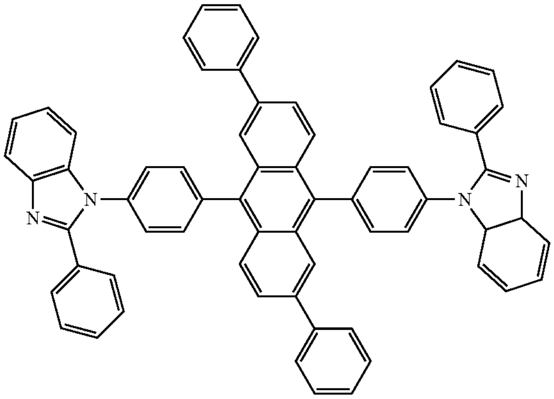
ET-38
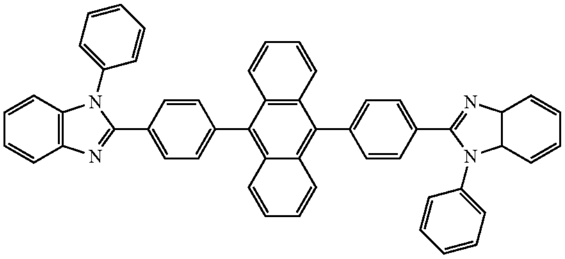
ET-39
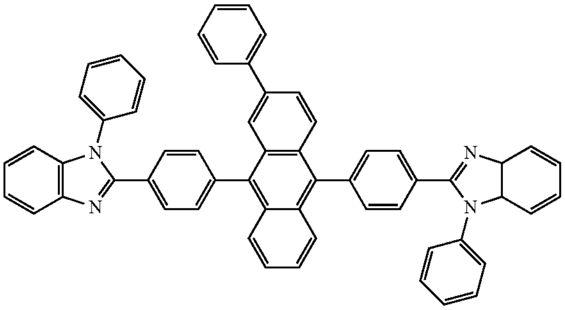

-continued
ET-40
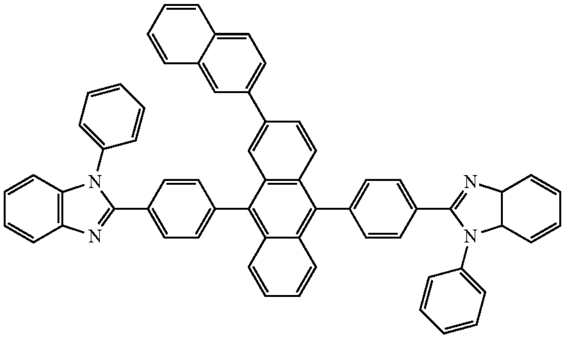
ET-41
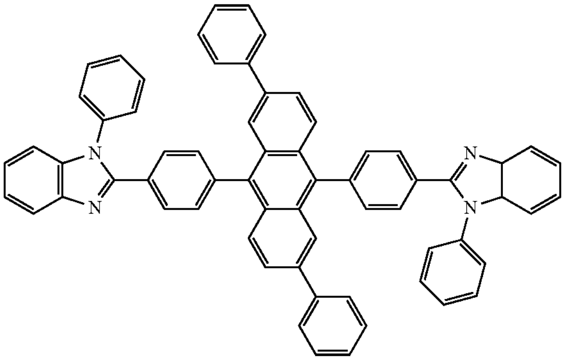
ET-42
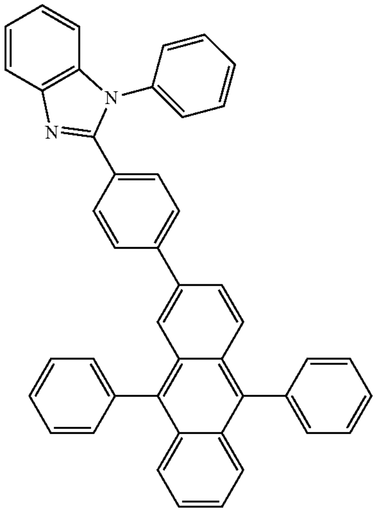
-continued
ET-43
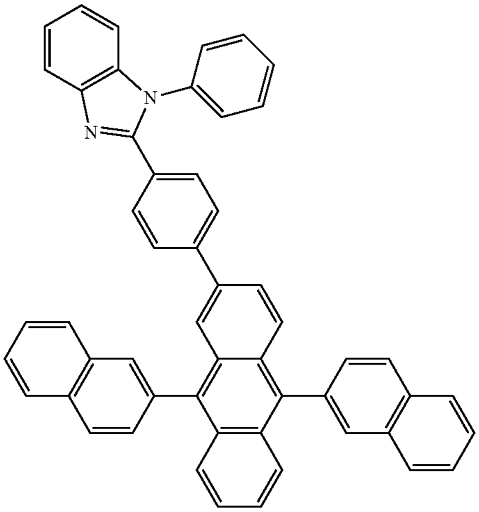
ET-44
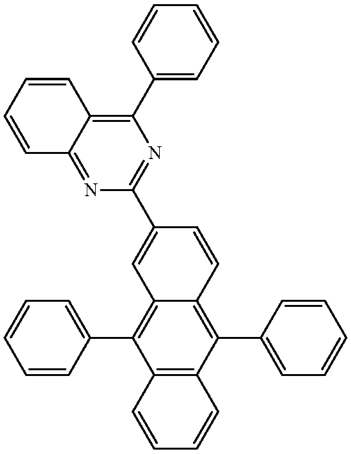
ET-45
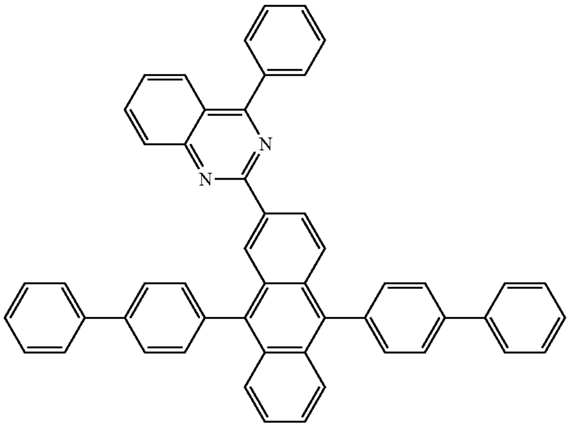

-continued
ET-46
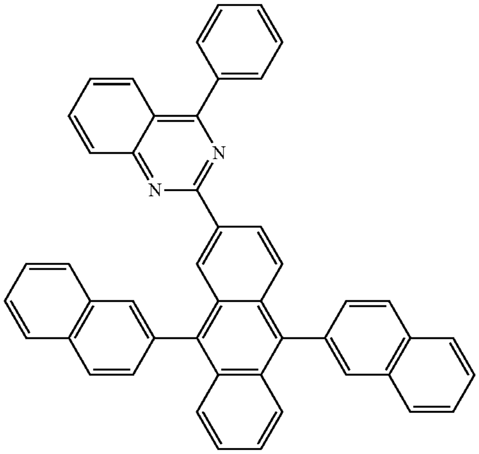
ET-47
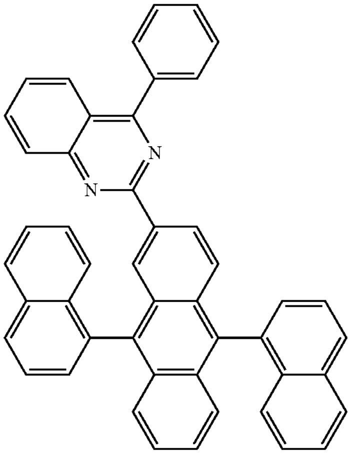
ET-48
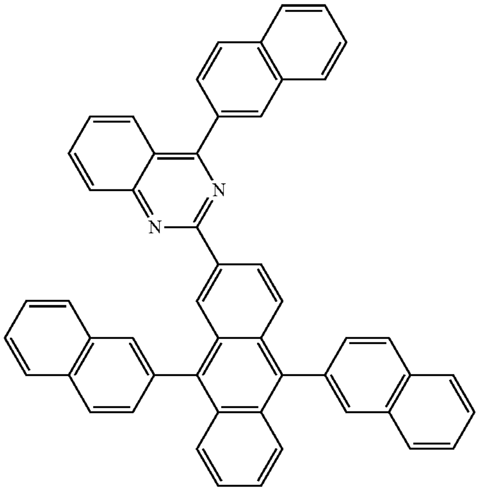
-continued
ET-49
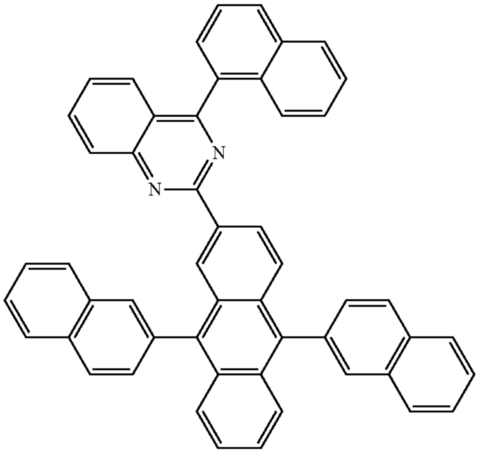
ET-50
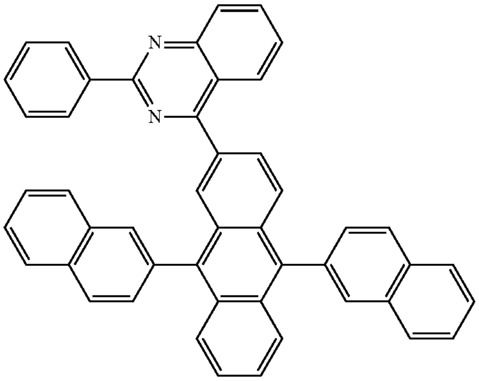
ET-51
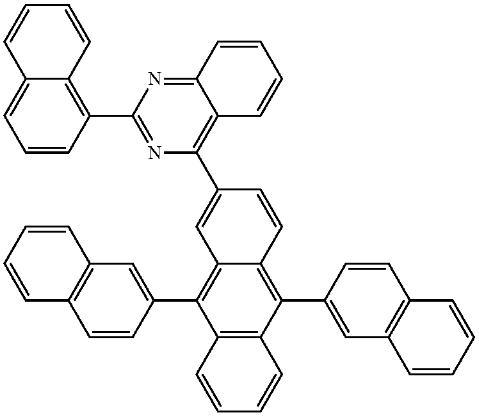

-continued
ET-52
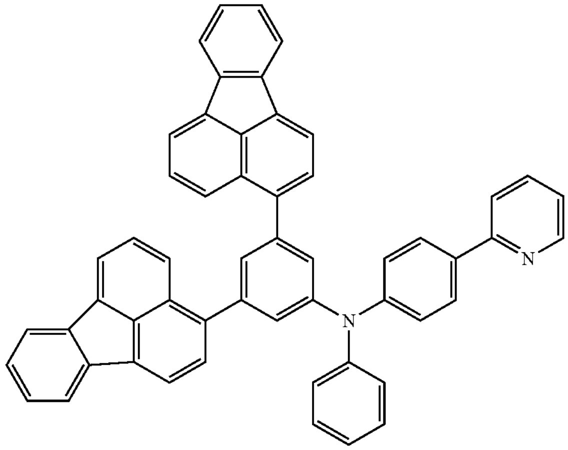
ET-53
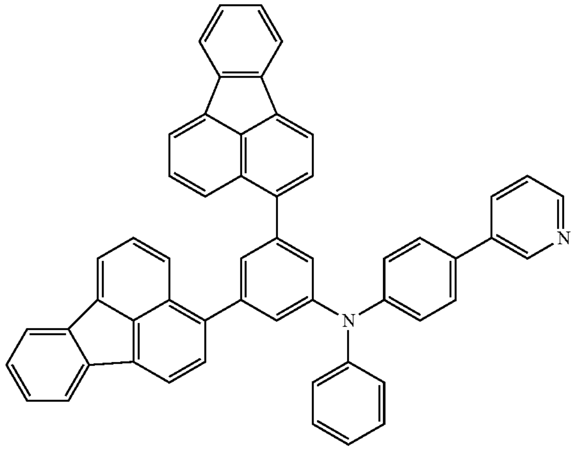
ET-54
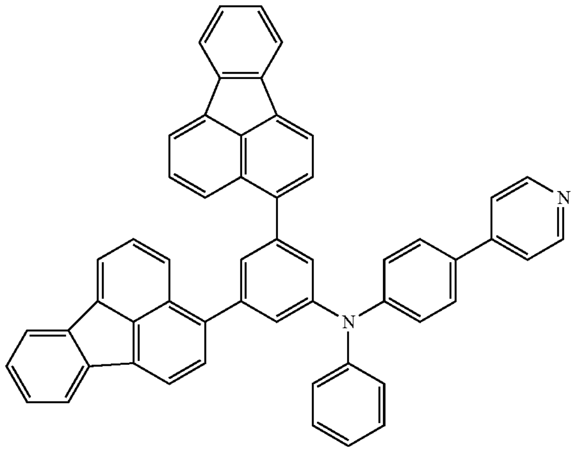
-continued
ET-55
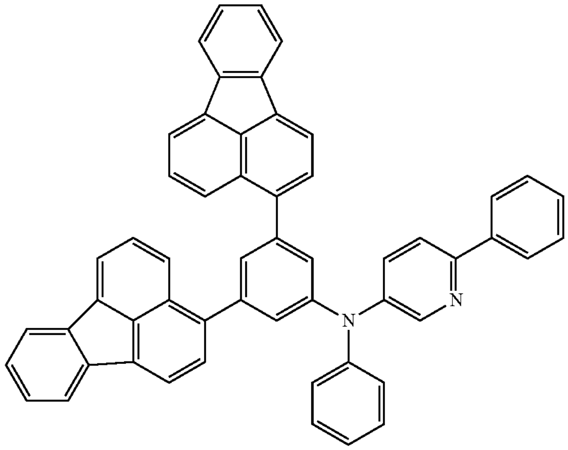
ET-56
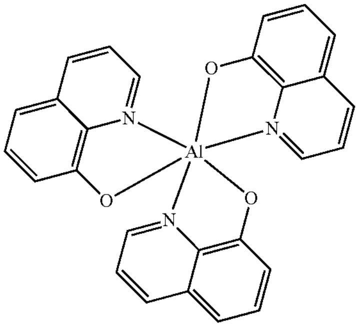
ET-57
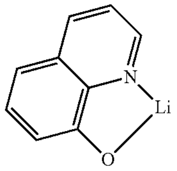
ET-58
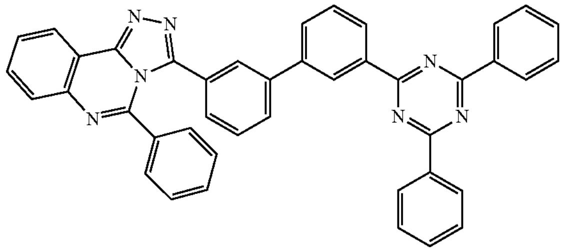
ET-59
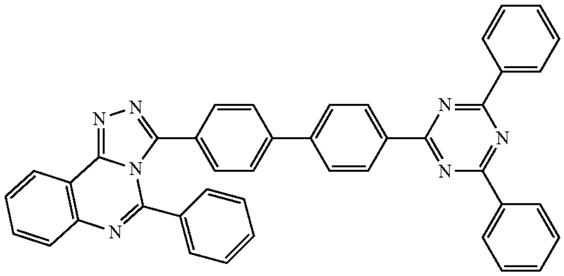

-continued

ET-60

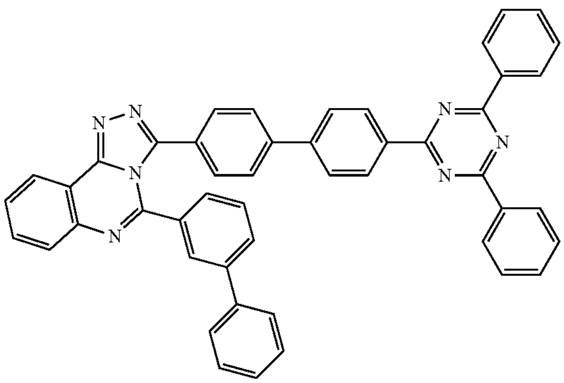

ET-61

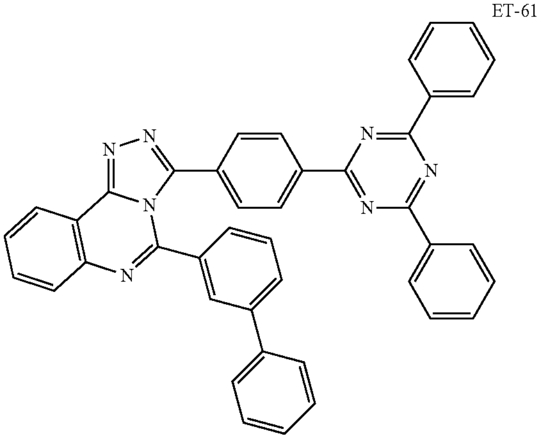

ET-62

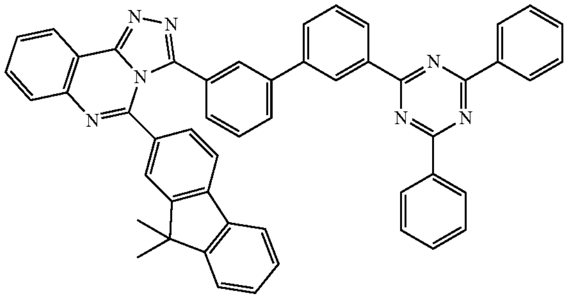

ET-63

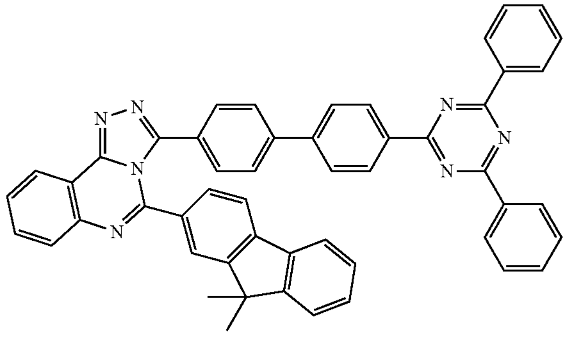

-continued

ET-64

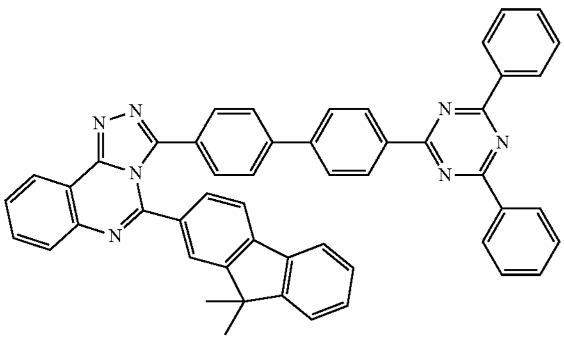

ET-65

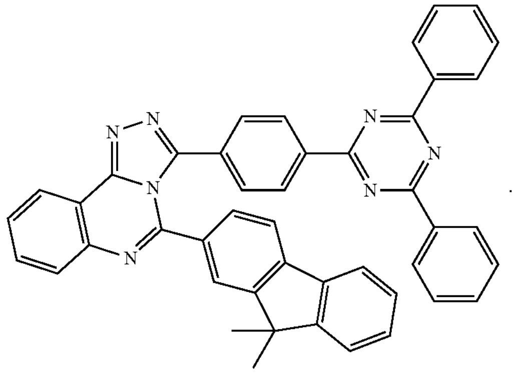

In an alternative embodiment, the first hole blocking layer (HBL-1) and the second hole blocking layer (HBL-2) may each employ, but not limited to, one or more of the compounds ET-1 to ET-65 above (for example, a combination of ET-4 and ET-7, a combination of ET-6, ET-14 and ET-18 or a combination of ET-20, ET-50, ET-3 and ET-59).

Alternatively, in an alternative embodiment, materials of the first hole blocking layer (HBL-1) and the second hole blocking layer (HBL-2) may be each selected from any one or a combination of at least two of compounds HB-1 to HB-6 (for example, a combination of HB-1 and HB-2, a combination of HB-5, HB-6 and HB-4, or a combination of HB-1, HB-3, HB-4 and HB-6):

HB-1

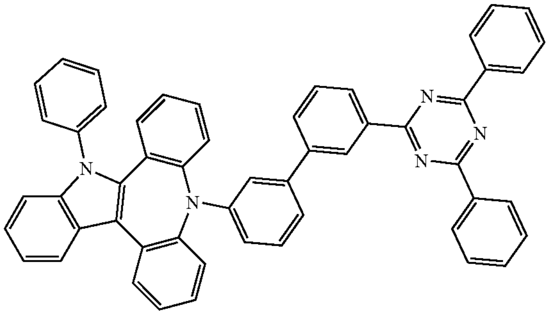

-continued

HB-2

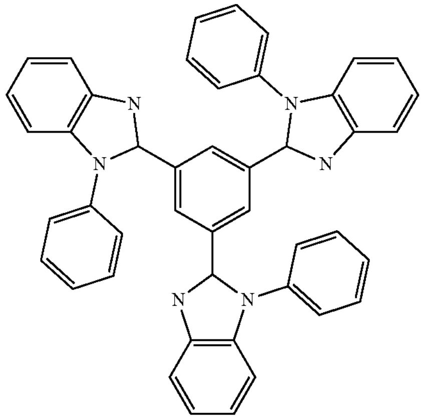

HB-3

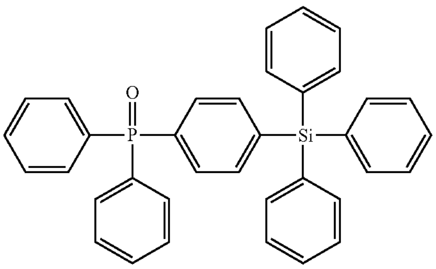

HB-4

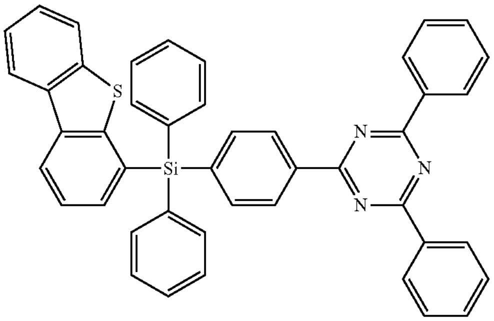

HB-5

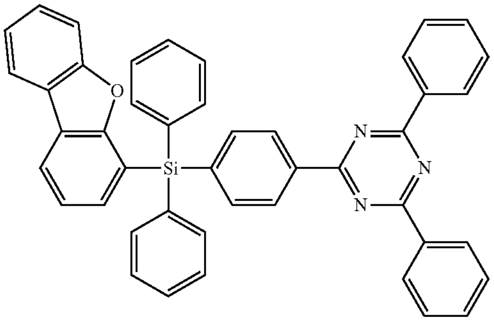

-continued

HB-6

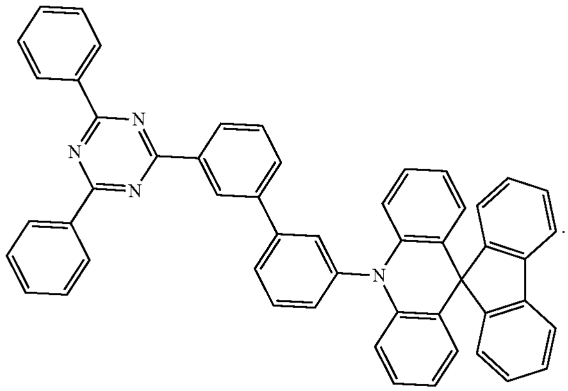

In an alternative embodiment, materials of the first electron injection layer (EIL-1) and the second electron injection layer (EIL-2) are each selected from any one or a combination of at least two of the following compounds (for example, a combination of Liq and CsF, a combination of $Cs_2CO_3$, BaO and $Li_2O$ or a combination of Mg, Ca, Yb and LiF): Liq, LiF, NaCl, CsF, $Li_2O$, $Cs_2CO_3$, BaO, Na, Li, Ca, Mg, Ag and Yb.

In an alternative embodiment, the material of the charge generation layer (CGL) includes any one or a combination of at least two of the following compounds CGL-1 to CGL-12 or a mixture of any one or at least two of CGL-1 to CGL-12 combined with Liq, LiF, NaCl, CsF, $Li_2O$, $Cs_2CO_3$, BaO, Na, Li, Ca, Mg, Ag, Yb and the like:

CGL-1

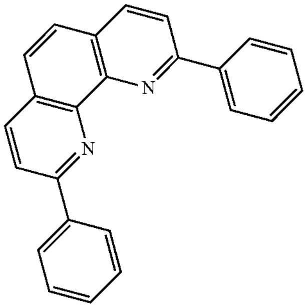

CGL-2

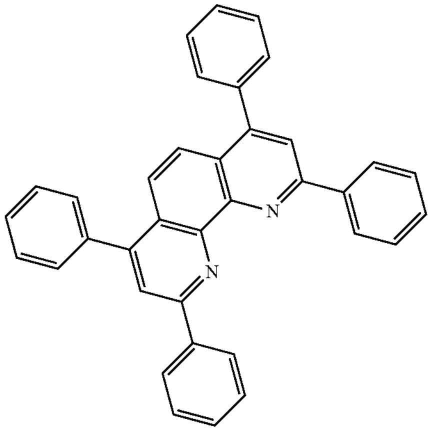

-continued
CGL-3
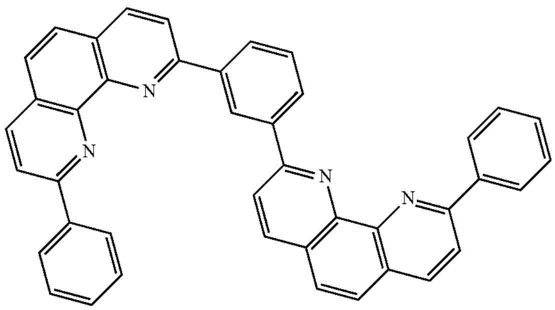
CGL-4
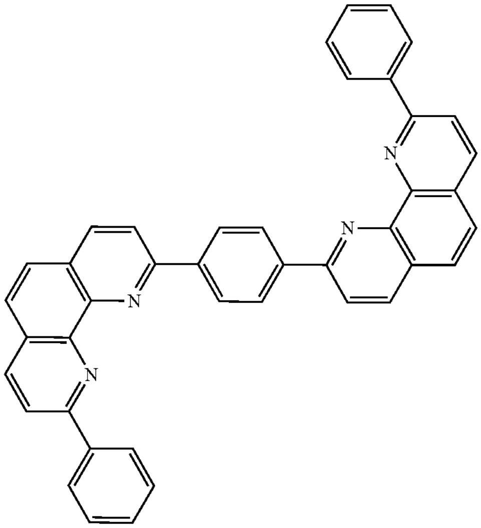
CGL-5
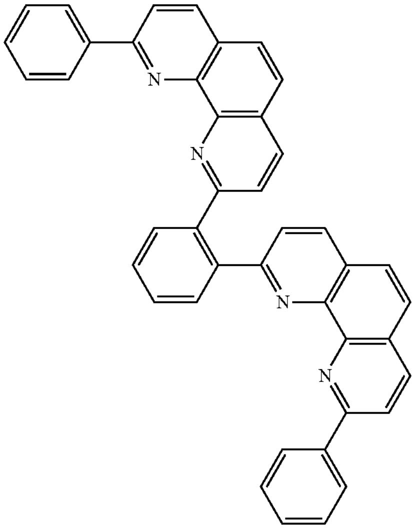
-continued
CGL-6
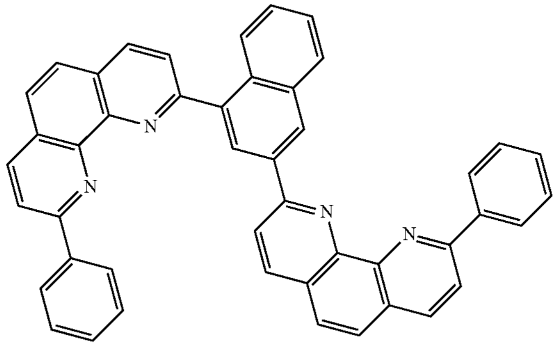
CGL-7
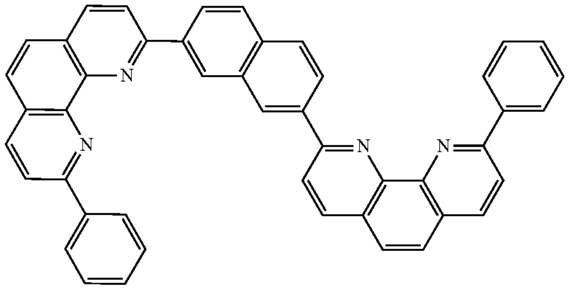
CGL-8
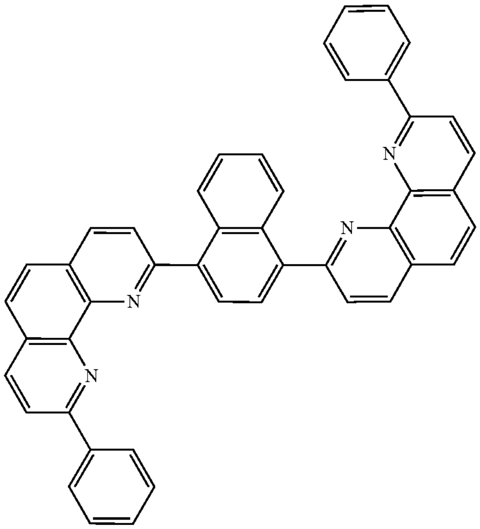

-continued

CGL-9

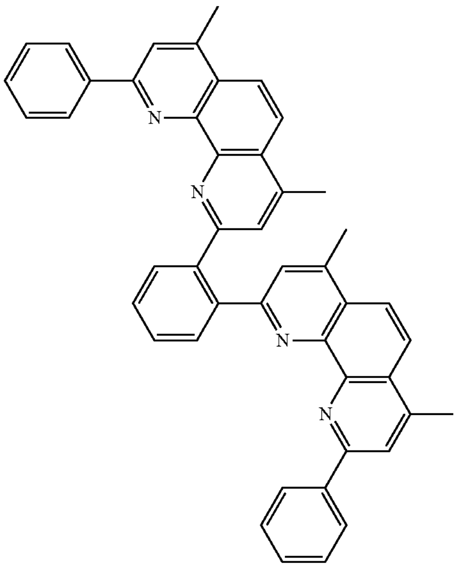

CGL-10

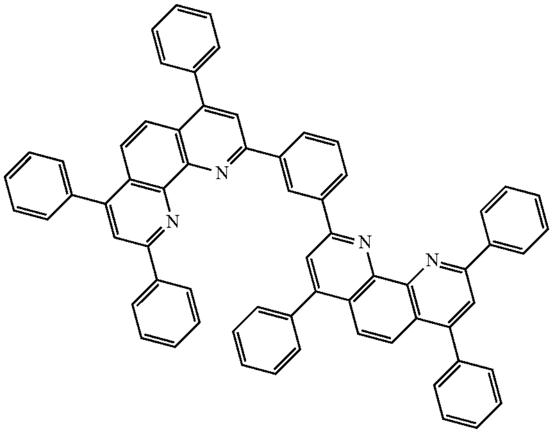

CGL-11

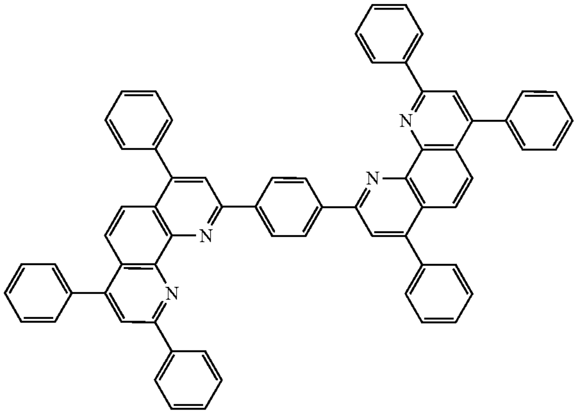

-continued

CGL-12

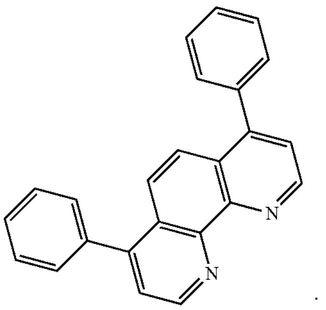

In an alternative embodiment, when a charge generation layer is disposed between the first organic electroluminescent unit and the second organic electroluminescent unit, no electron injection layer may be disposed in the first organic electroluminescent unit or the second organic electroluminescent unit. That is, the charge generation layer may function as an electron injection layer at the same time. These device structures are shown in FIG. 1 and FIG. 2.

In an alternative embodiment, a substrate may be used under the first electrode or over the second electrode. The substrate is made of glass or a polymer material with compressive strength, thermostability, waterproof property and excellent transparency. In addition, a thin-film transistor (TFT) may be disposed on a substrate for a display.

In an alternative embodiment, the first electrode may be formed by sputtering or depositing a material serving as the first electrode on a substrate. When the first electrode is used as the anode, an oxide transparent conductive material such as indium tin oxygen (ITO), indium zinc oxygen (IZO), tin (IV) oxide ($SnO_2$), zinc oxide (ZnO), or any combination thereof may be used. When the first electrode is used as the cathode, a metal or alloy such as magnesium (Mg), silver (Ag), aluminum (Al), aluminum-lithium (Al—Li), calcium (Ca), magnesium-indium (Mg—In), magnesium-silver (Mg—Ag), or any combination thereof may be used.

In an alternative embodiment, a capping layer (CPL) may be deposited on the second electrode of the device to play a role of improving the device efficiency, adjusting the optical microcavity and the like.

In an alternative embodiment, conventional thicknesses of the layers in the art may be used as the thicknesses of the layers above.

An alternative embodiment of the present disclosure provides a method for preparing the organic electroluminescent device. The method includes depositing a first electrode, functional layers in a second organic electroluminescent unit and a first organic electroluminescent unit, and a second electrode on a substrate sequentially and then encapsulating these components. When preparing a light-emitting layer, the deposition rate of the main material and the deposition rate of the auxiliary material can be adjusted to achieve a preset doping ratio by a multi-component co-deposition method using multiple deposition sources. The deposition method is the same as the existing method in the art.

An embodiment of the present disclosure provides a display apparatus. The display apparatus includes the organic electroluminescent device provided above. Specifically, the display apparatus may be a display device such as an OLED display, as well as any product or component with a display function such as a television, a digital camera, a mobile phone or a tablet computer including the display device. The advantages of the display apparatus over the existing art are the same as the advantages of the preceding organic electroluminescent device over the existing art and thus are not described herein again.

The organic electroluminescent device of the present disclosure is further described below through embodiments.

Embodiment One

The embodiment of the present disclosure provides a stacked organic electroluminescent device. The device structure is shown in FIG. 1, including a first electrode, a TTA unit, a charge generation layer (CGL), a TASF unit and a second electrode arranged in a stacked manner from bottom to top. The TASF unit includes a first hole injection layer (HIL-1), a first hole transport layer (HTL-1), a first electron blocking layer (EBL-1), a first light-emitting layer (EML-1), a first hole blocking layer (HBL-1), a first electron transport layer (ETL-1) and a first electron injection layer (EIL-1) stacked sequentially from bottom to top. The TTA unit includes a second hole injection layer (HIL-2), a second hole transport layer (HTL-2), a second electron blocking layer (EBL-2), a second light-emitting layer (EML-2), a second hole blocking layer (HBL-2) and a second electron transport layer (ETL-2) stacked sequentially from bottom to top.

The method for preparing the device in this embodiment is described below.

(1) A glass plate coated with an ITO conductive layer (first electrode, anode) is sonicated in a commercial abluent, rinsed in deionized water, washed by ultrasonic oil removal in an acetone: ethanol mixed solvent, baked in a clean environment to completely remove moisture, washed with ultraviolet and ozone and bombarded the surface with a low-energy cation beam.

(2) The glass plate with the ITO conductive layer (first electrode, anode) is placed in a vacuum chamber. The vacuum chamber is vacuumized to less than $1\times10^{-5}$ Pa. The HT-24 material and the HI-2 material are co-deposited on the anode layer film as the second hole injection layer. The proportion of the HI-2 material is 3%, the deposition rate of the HT-24 material is 0.1 nm/s, and the total thickness of the deposition film is 10 nm. 3% is obtained by calculation with the sum of the mass of HT-24 material and the mass of HI-2 material as 100% (that is, the total mass of the second hole injection layer is 100%). The following percentages are all based on the total mass of corresponding functional layers as 100%. Repetition will not be made.

(3) The second hole transport layer is deposited through vacuum evaporation on the second hole injection layer using the HT-24 material. The deposition rate is 0.1 nm/s, and the total thickness of deposition film is 30 nm.

(4) The second electron blocking layer is deposited through vacuum evaporation on the second hole transport layer using the EB-13 material. The deposition rate is 0.1 nm/s, and the total thickness of deposition film is 5 nm.

(5) The second light-emitting layer is co-deposited through vacuum evaporation on the second electron blocking layer. The second light-emitting layer includes a second host material H12 and a second fluorescent dye F-10. The multi-component co-deposition method is used. The dye is deposited according to the doping proportion of 1%. The deposition rate of the host material is 0.1 nm/s, and the thickness of deposition film is 20 nm.

(6) The second hole blocking layer is deposited through vacuum evaporation on the second light-emitting layer using the HB-1 material. The deposition rate is 0.1 nm/s, and the total thickness of deposition film is 5 nm.

(7) The ET-52 material and the ET-57 material are co-deposited through vacuum evaporation as the second electron transport layer on the second hole blocking layer. The ratio of the ET-52 material to the ET-57 material is 1:1. Both the deposition rates of the ET-52 material to the ET-57 material are 0.1 nm/s. The total thickness of deposition film is 25 nm.

(8) The CGL-3 material and the metal Yb are co-deposited as the charge generation layer (CGL) on the second electron transport layer. The proportion of the metal Yb is 3%. The total thickness is 10 nm.

(9) The HT-24 material and the HI-2 material are co-deposited as the first hole injection layer. The proportion of the HI-2 material is 10%. The deposition rate of the HT-24 material is 0.1 nm/s. The total thickness of deposition film is 10 nm.

(10) The first hole transport layer is deposited through vacuum evaporation on the first hole injection layer using the HT-24 material. The deposition rate is 0.1 nm/s, and the total thickness of deposition film is 30 nm.

(11) The first electron blocking layer is deposited through vacuum evaporation on the first hole transport layer using the EB-8 material. The deposition rate is 0.1 nm/s, and the total thickness of deposition film is 5 nm.

(12) The first light-emitting layer is co-deposited through vacuum evaporation on the first electron blocking layer. The first light-emitting layer includes a first host material TDH-2, a thermally activated delayed fluorescence sensitizer TDE32 and a first fluorescent dye F-10. By using the multi-component co-deposition method, the doping concentration of sensitizer is set to be 30%, and the doping concentration of dye is set to be 1% for deposition. The host deposition rate is 0.1 nm/s. The thickness of deposition film is 30 nm.

(13) The first hole blocking layer is deposited through vacuum evaporation on the first light-emitting layer using the HB-4 material. The deposition rate is 0.1 nm/s, and the total thickness of deposition film is 5 nm.

(14) The ET-52 material and the ET-57 material are co-deposited through vacuum evaporation as the first electron transport layer on the first hole blocking layer. The ratio of the ET-52 material to the ET-57 material is 1:1. Both the deposition rates of the ET-52 material and the ET-57 material are 0.1 nm/s. The total thickness of deposition film is 20 nm.

(15) The LiF material with a thickness of 1 nm is deposited through vacuum evaporation on the first electron transport layer as the first electron injection layer.

(16) A metal Al layer with a thickness of 100 nm is deposited on the first electron injection layer as the second electrode (cathode) of the device.

Comparative Embodiment One

The comparative embodiment provides an organic electroluminescent device. The preparation method is described below.

(1) A glass plate coated with an ITO conductive layer (first electrode, anode) is sonicated in a commercial abluent, rinsed in deionized water, washed by ultrasonic oil removal in an acetone: ethanol mixed solvent, baked in a clean environment to completely remove moisture, washed with ultraviolet and ozone and bombarded the surface with a low-energy cation beam.

(2) The glass plate with the ITO conductive layer (first electrode, anode) is placed in a vacuum chamber. The vacuum chamber is vacuumized to less than $1\times10^{-5}$ Pa. The HT-24 material and the HI-2 material are co-deposited on the anode layer film as a hole injection layer. The proportion of the HI-2 material is 3%, the deposition rate of the HT-24 material is 0.1 nm/s, and the total thickness of the deposition film is 10 nm.

(3) A hole transport layer is deposited through vacuum evaporation on the hole injection layer using the HT-24 material. The deposition rate is 0.1 nm/s, and the total thickness of deposition film is 30 nm.

(4) An electron blocking layer is deposited through vacuum evaporation on the hole transport layer using the EB-8 material. The deposition rate is 0.1 nm/s, and the total thickness of deposition film is 5 nm.

(5) A light-emitting layer is co-deposited through vacuum evaporation on the electron blocking layer. The light-emitting layer includes a host material TDH-2, a thermally activated delayed fluorescence sensitizer TDE32 and a fluorescent dye F-10. By using the multi-component co-deposition method, the doping concentration of sensitizer is set to be 30%, and the doping concentration of dye is set to be 1% for deposition. The host deposition rate is 0.1 nm/s. The thickness of deposition film is 30 nm.

(6) A hole blocking layer is deposited through vacuum evaporation on the light-emitting layer using the HB-4 material. The deposition rate is 0.1 nm/s, and the total thickness of deposition film is 5 nm.

(7) The ET-52 material and the ET-57 material are co-deposited through vacuum evaporation as an electron transport layer on the hole blocking layer. The ratio of the ET-52 material to the ET-57 material is 1:1. Both the deposition rates of the ET-52 material and the ET-57 material are 0.1 nm/s. The total thickness of deposition film is 20 nm.

(8) LiF with a thickness of 1 nm is deposited through vacuum evaporation on the electron transport layer as an electron injection layer.

(9) A metal Al layer with a thickness of 100 nm is deposited on the electron injection layer as a second electrode (cathode) of the device.

Embodiments Two to Nine and Embodiment Eleven

Embodiments two to nine and eleven differ from embodiment one only in that the material of the EML-1 layer and the material of the EML-2 layer are different. For details, see Table 1. The others are all the same.

Embodiment Ten

Embodiment ten differs from embodiment one only in that the thickness of the first light-emitting layer is 15 nm.

Embodiment Twelve

The embodiment of the present disclosure provides a stacked organic electroluminescent device. The device structure is shown in FIG. 2, including a first electrode, a TASF unit, a charge generation layer (CGL), a TTA unit and a second electrode arranged in a stacked manner from bottom to top. The TASF unit includes a first hole injection layer (HIL-1), a first hole transport layer (HTL-1), a first electron blocking layer (EBL-1), a first light-emitting layer (EML-1), a first hole blocking layer (HBL-1) and a first electron transport layer (ETL-1) stacked sequentially from bottom to top. The TTA unit includes a second hole injection layer (HIL-2), a second hole transport layer (HTL-2), a second electron blocking layer (EBL-2), a second light-emitting layer (EML-2), a second hole blocking layer (HBL-2), a second electron transport layer (ETL-2) and a second electron injection layer (EIL-2) stacked sequentially from bottom to top.

The method for preparing the device in this embodiment is described below.

(1) A glass plate coated with an ITO conductive layer (first electrode, anode) is sonicated in a commercial abluent, rinsed in deionized water, washed by ultrasonic oil removal in an acetone: ethanol mixed solvent, baked in a clean environment to completely remove moisture, washed with ultraviolet and ozone and bombarded the surface with a low-energy cation beam.

(2) The glass plate with the ITO conductive layer (first electrode, anode) is placed in a vacuum chamber. The vacuum chamber is vacuumized to less than $1\times10^{-5}$ Pa. The HT-24 material and the HI-2 material are co-deposited on the anode layer film as the first hole injection layer. The proportion of the HI-2 material is 3%, the deposition rate of the HT-24 material is 0.1 nm/s, and the total thickness of the deposition film is 10 nm.

(3) The first hole transport layer is deposited through vacuum evaporation on the first hole injection layer using the HT-24 material. The deposition rate is 0.1 nm/s, and the total thickness of deposition film is 30 nm.

(4) The first electron blocking layer is deposited through vacuum evaporation on the first hole transport layer using the EB-8 material. The deposition rate is 0.1 nm/s, and the total thickness of deposition film is 5 nm.

(5) The first light-emitting layer is deposited through vacuum evaporation on the first electron blocking layer. The first light-emitting layer includes a first host material TDH-2, a thermally activated delayed fluorescence sensitizer TDE32 and a first fluorescent dye F-10. By using the multi-component co-deposition method, the doping concentration of sensitizer is set to be 30%, and the doping concentration of dye is set to be 1% for deposition. The host deposition rate is 0.1 nm/s. The thickness of deposition film is 30 nm.

(6) The first hole blocking layer is deposited through vacuum evaporation on the first light-emitting layer using the HB-4 material. The deposition rate is 0.1 nm/s, and the total thickness of deposition film is 5 nm.

(7) The ET-52 material and the ET-57 material are co-deposited through vacuum evaporation as the first electron transport layer on the first hole blocking layer. The proportion of the ET-52 material to the ET-57 material is 1:1. Both the deposition rates of the ET-52 material and the ET-57 material are 0.1 nm/s. The total thickness of deposition film is 20 nm.

(8) The CGL-3 material and the metal Yb are co-deposited as the charge generation layer (CGL) on the first electron transport layer. The proportion of the metal Yb is 3%. The total thickness is 10 nm.

(9) The HT-24 material and the HI-2 material are co-deposited as the second hole injection layer. The proportion of the HI-2 material is 10%. The deposition rate of the HT-24 material is 0.1 nm/s. The total thickness of deposition film is 10 nm.

(10) The second hole transport layer is deposited through vacuum evaporation on the second hole injection layer using the HT-24 material. The deposition rate is 0.1 nm/s, and the total thickness of deposition film is 30 nm.

(11) The second electron blocking layer is deposited through vacuum evaporation on the second hole transport layer using the EB-13 material. The deposition rate is 0.1 nm/s, and the total thickness of deposition film is 5 nm.

(12) The second light-emitting layer is co-deposited through vacuum evaporation on the second electron blocking layer. The second light-emitting layer includes a second host material H12 and a second fluorescent dye F-10. The multi-component co-deposition method is used. The dye is deposited according to the doping ratio of 1%. The deposition rate of the host material is 0.1 nm/s, and the thickness of deposition film is 20 nm.

(13) The second hole blocking layer is deposited through vacuum evaporation on the second light-emitting layer using the HB-1 material. The deposition rate is 0.1 nm/s, and the total thickness of deposition film is 5 nm.

(14) The ET-52 material and the ET-57 material are co-deposited through vacuum evaporation as the second electron transport layer on the second hole blocking layer. The ratio of the ET-52 material to the ET-57 material is 1:1. Both the deposition rates of the ET-52 material to the ET-57 material is 0.1 nm/s, and the total thickness of deposition film is 25 nm.

(15) The LiF material with a thickness of 1 nm is deposited through vacuum evaporation on the second electron transport layer as the second electron injection layer.

(16) A metal Al layer with a thickness of 100 nm is deposited on the second electron injection layer as the second electrode (cathode) of the device.

Device Performance Test (1) Current Density and Device Efficiency Tests

Under the same luminance, the current efficiencies of the organic electroluminescent devices prepared in the embodiments and comparative embodiment are measured by using the PR-750 Crookes radiometer, the ST-86LA luminance meter (photoelectric instrument factory of Beijing Normal University) and the Keithley 4200 test system of Photo Research. Specifically, the voltage is increased at a rate of 0.1 V per second, and the current density is measured when the luminance of the organic electroluminescent device reaches 1,000 cd/$m^2$. At the same time, the external quantum efficiency (EQE) of the device at this time can be directly measured by the PR 650.

(2) Service Life Test

The service life test of LT90 is as follows: Using the luminance meter at a luminance of 1,000 cd/$m^2$, a constant current is kept, and the time, in hours, for the luminance of the organic electroluminescent device to drop to 900 cd/$m^2$ is measured.

Using the service life of LT80 in comparative embodiment one as a reference (100%), service lives of devices in other embodiments are compared with the reference in percentage.

Using the current density at 1,000 cd/$m^2$ in comparative embodiment one as a reference (100%), current densities in other embodiments are compared with the reference in percentage.

The results of the preceding tests are shown in Table 1.

TABLE 1

| | EML-1 | | | EML-2 | | Luminance | Current Density | External Quantum Efficiency | Service life |
|---|---|---|---|---|---|---|---|---|---|
| | Host | Sensitizer | Dye | Host | Dye | (cd/$m^2$) | mA/$cm^2$ | (EQE) | LT90 |
| Embodiment one | TDH-2 | TDE32 | F-10 | H12 | F-10 | 1,000 | 64% | 28.6% | 278% |
| Embodiment two | TDH-2 | TDE32 | F-10 | H12 | F-2 | 1,000 | 71% | 24.7% | 214% |
| Embodiment three | TDH-2 | TDE23 | F-4 | H12 | F-4 | 1,000 | 60% | 30.2% | 266% |
| Embodiment four | TDH-7 | TDE32 | F-14 | H4 | F-14 | 1,000 | 62% | 28.1% | 255% |
| Embodiment five | TDH-10 | TDE22 | F-22 | H12 | F-22 | 1,000 | 63% | 28.8% | 236% |
| Embodiment six | TDH-21 | TDE23 | F-29 | H4 | F-29 | 1,000 | 58% | 31.2% | 244% |
| Embodiment seven | TDH-24 | TDE32 | F-3 | H4 | F-3 | 1,000 | 59% | 27.6% | 259% |
| Embodiment eight | TDH-32 | TDE23 | F-3 | H4 | F-3 | 1,000 | 60.5% | 28.5% | 256% |
| Embodiment nine | TDH-43 | TDE32 | F-14 | H12 | F-14 | 1,000 | 58.2% | 30.6% | 271% |
| Embodiment ten | TDH-1 | TDE22 | F-3 | H4 | F-3 | 1,000 | 68.2% | 25.1% | 266% |
| Embodiment eleven | TDH-1 | TDE22 | F-3 | TDH-2 | F-3 | 1,000 | 86% | 22.7% | 167% |
| Embodiment twelve | TDH-2 | TDE32 | F-10 | H12 | F-10 | 1,000 | 67.5% | 27.1% | 265% |
| Comparative embodiment one | TDH-2 | TDE32 | F-10 | / | / | 1,000 | 100% | 19.5% | 100% |

In Table 1, / denotes that the device does not contain the corresponding material.

As can be seen from Table 1, the stacked organic electroluminescent device provided by the embodiments of the present disclosure includes the TASF unit and the TTA unit, compared with the single-layer (comparative embodiment one) device, the current density is significantly reduced at the same luminance, thereby improving the efficiency and service life of the device.

Figure 3:
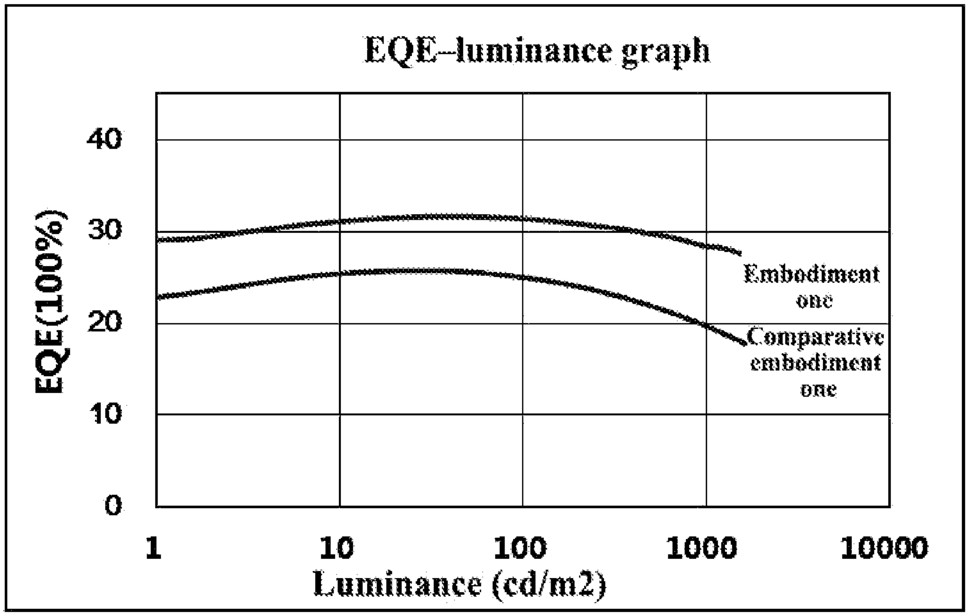
FIG. 3 is an external quantum efficiency (EQE)-luminance graph according to embodiment one and comparative embodiment one of the present disclosure.

FIG. 3 is an EQE-luminance graph according to embodiment one and comparative embodiment one. As can be seen from FIG. 3, under the same luminance, the efficiency of embodiment one is significantly higher than that of comparative embodiment one, and the efficiency roll-off of embodiment one is significantly improved with the luminance, and the efficiency roll-off of device is smaller.

Figure 4:
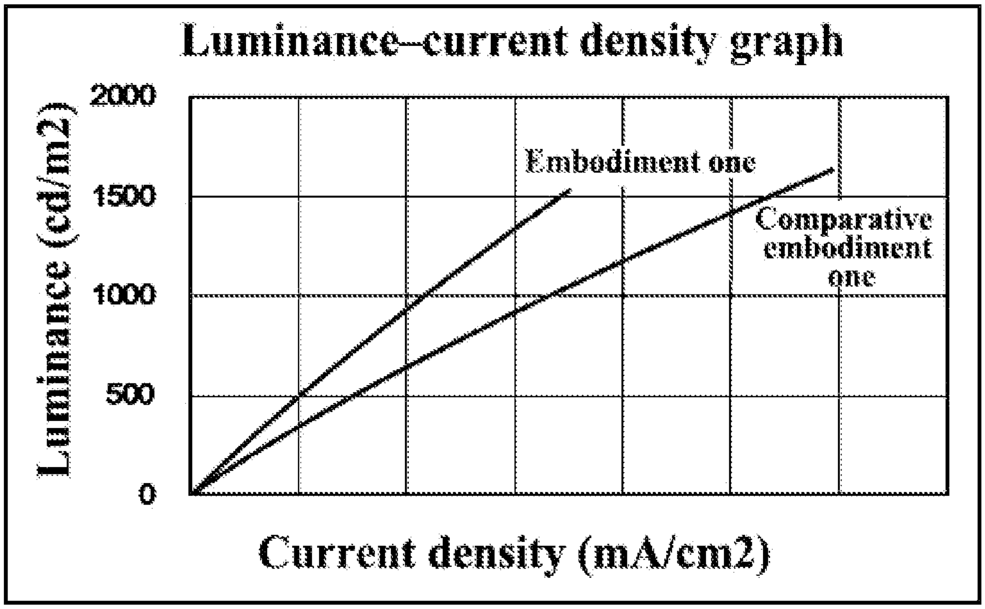
FIG. 4 is a luminance-current density graph according to embodiment one and comparative embodiment one of the present disclosure.

FIG. 4 is a luminance-current density graph according to embodiment one and comparative embodiment one. As can be seen from FIG. 4, under the same luminance, the current density of embodiment one is significantly lower than that of comparative embodiment one. It is proved that the stacked device structure in the embodiments of the present disclosure can significantly reduce the current density of the device at the same luminance.

Figure 5:
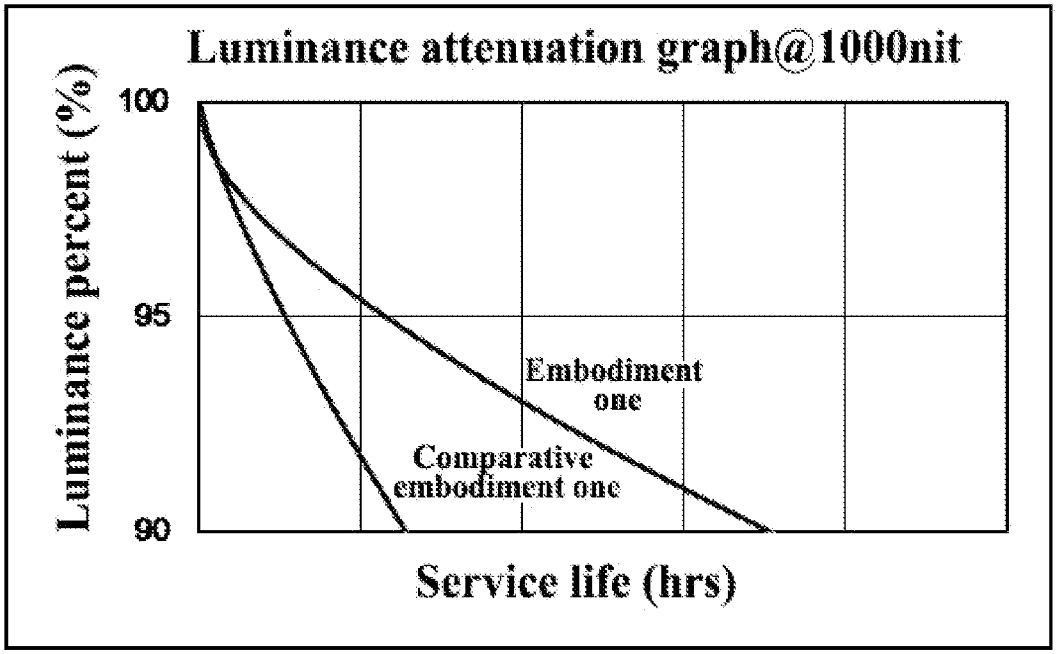
FIG. 5 is a luminance attenuation graph according to embodiment one and comparative embodiment one of the present disclosure.

FIG. 5 is a luminance attenuation graph according to embodiment one and comparative example 1. As can be seen from FIG. 5, the service life of device of embodiment one is significantly better than that of comparative embodiment one.

By comparing embodiment one with embodiment two, it can be seen that when the dye in the EML-1 layer is the same as the dye in the EML-2 layer (embodiment one), the device performance can be further improved.

By comparing embodiment one with embodiment ten, it can be seen that when the thickness of the EML-1 layer is greater than the thickness of the EML-2 layer (embodiment one), the device performance can be further improved.

By comparing embodiment one with embodiment eleven, it can be seen that the stacked layer of the TASF unit and the TTA unit (embodiment one) can further reduce the current density under the same luminance compared with the stacked layer of the TASF and other units (embodiment eleven), thereby improving efficiency and service life.

By comparing embodiment one with embodiment twelve, it can be seen that when the TASF unit is closer to the second electrode (embodiment one), the efficiency contribution to the stacked device is greater.

The applicant states that although the detailed method of the present disclosure is described through the embodiments above, the present disclosure is not limited to the detailed method above, that is, the implementation of the present disclosure does not necessarily depend on the detailed method above. It is apparent to those skilled in the art that any improvements made to the present disclosure, equivalent substitutions of various raw materials of the product of the present disclosure, the addition of adjuvant ingredients of the product of the present disclosure, and the selection of specific manners in the present disclosure all fall within the protection scope and the disclosure scope of the present disclosure.

What is claimed is:

1. An organic electroluminescent device, comprising a first electrode, a second electrode and at least two organic electroluminescent units located between the first electrode and the second electrode, wherein:

the at least two organic electroluminescent units are arranged in a stacked manner; and the at least two organic electroluminescent units comprise a first organic electroluminescent unit;

the first organic electroluminescent unit comprises a first light-emitting layer; and the first light-emitting layer consists of a first host material, a thermally activated delayed fluorescence sensitizer and a first fluorescent dye;

the at least two organic electroluminescent units further comprise a second organic electroluminescent unit;

the second organic electroluminescent unit comprises a second light-emitting layer;

the second light-emitting layer consists of a second host material and a second fluorescent dye; and the second host material is a triplet-triplet annihilation material; wherein:

the first fluorescent dye and the second fluorescent dye are selected from a same material; and a triplet energy level of the first host material is greater than a triplet energy level of the first fluorescent dye.

2. The organic electroluminescent device according to claim 1, wherein the first fluorescent dye and the second fluorescent dye are respectively selected from any one of compounds F-1 to F-58:

(F-1)

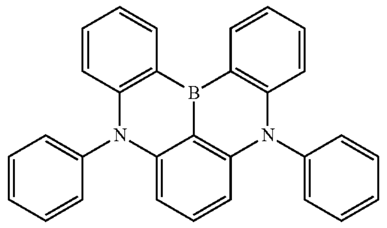

(F-2)

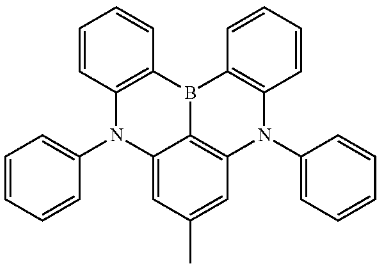

-continued
(F-3)
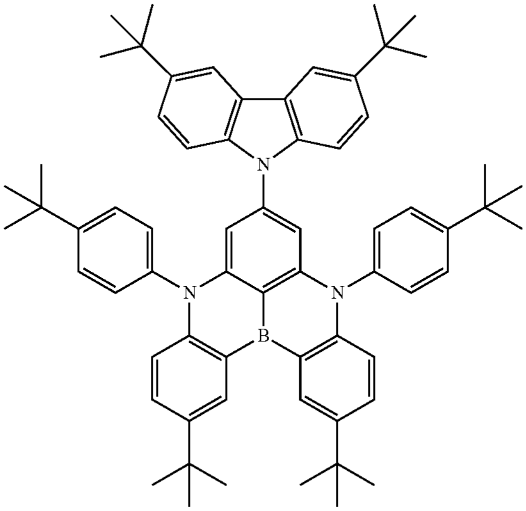
(F-4)
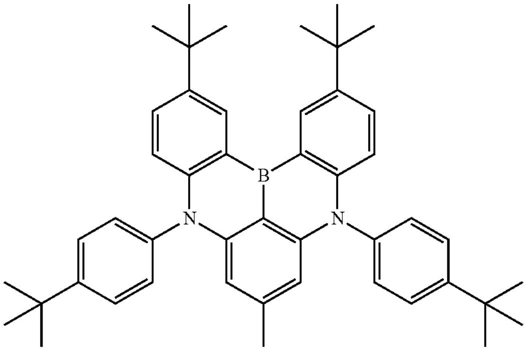
(F-5)
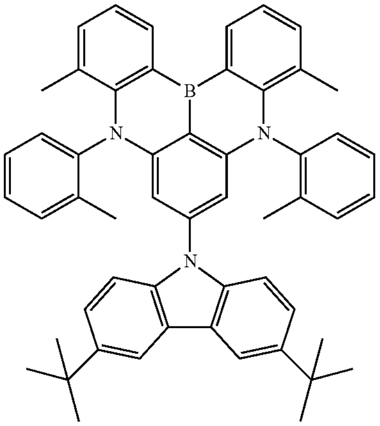
(F-6)
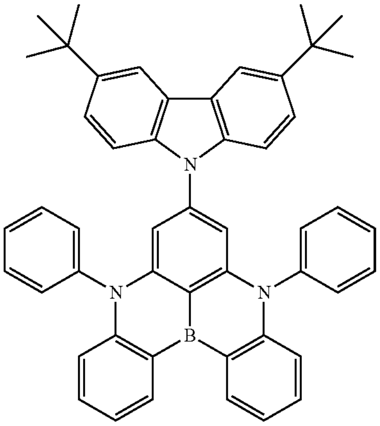
(F-7)
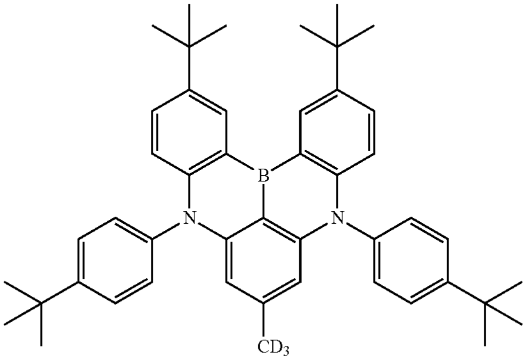
(F-8)
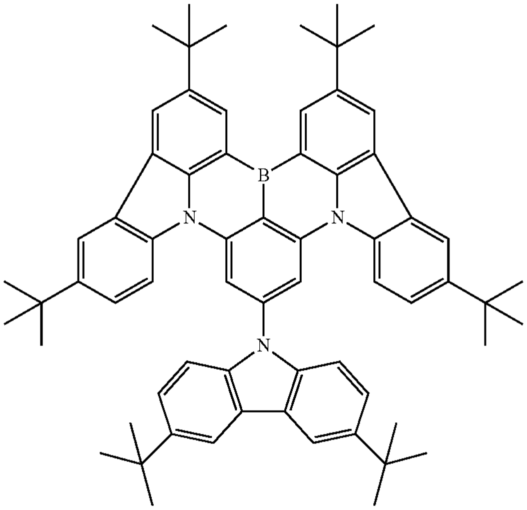

-continued
(F-9)
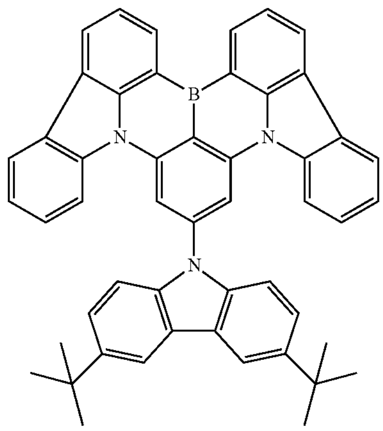
(F-10)
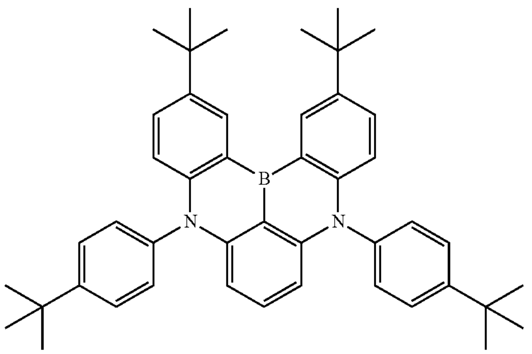
(F-11)
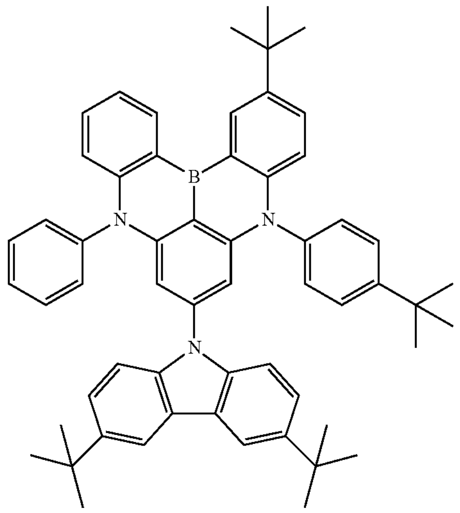
(F-12)
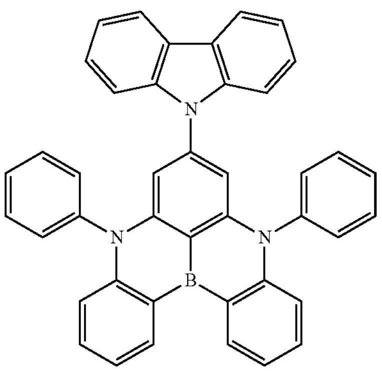
(F-13)
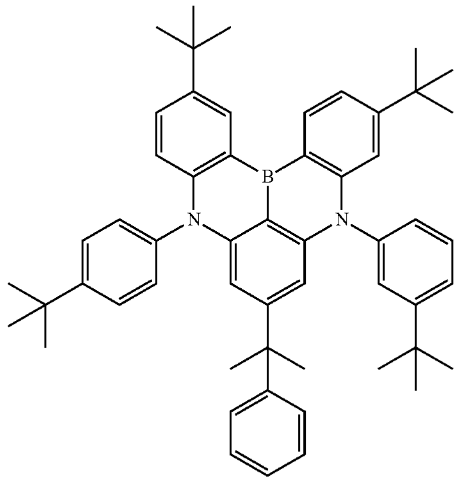
(F-14)
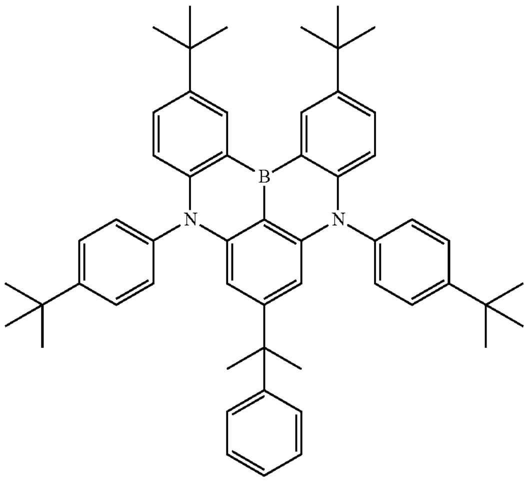

-continued
(F-15)
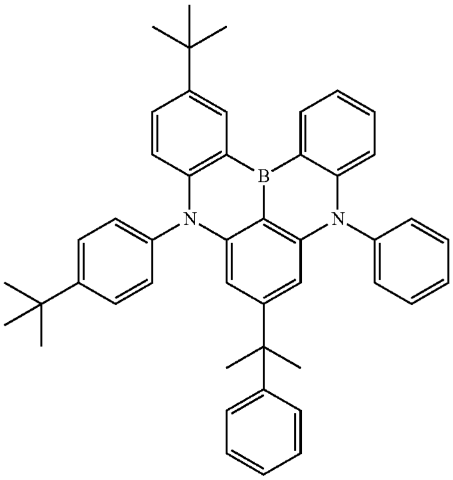
(F-16)
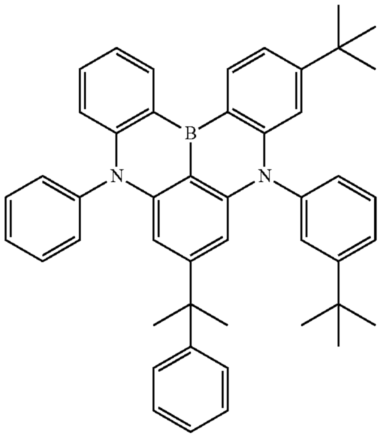
(F-17)
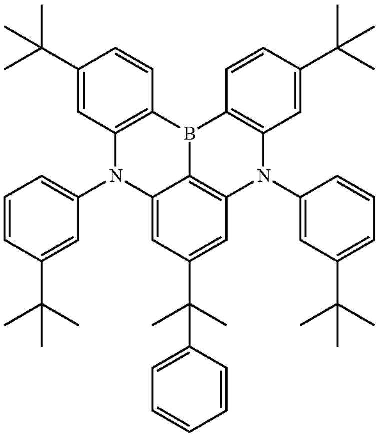
(F-18)
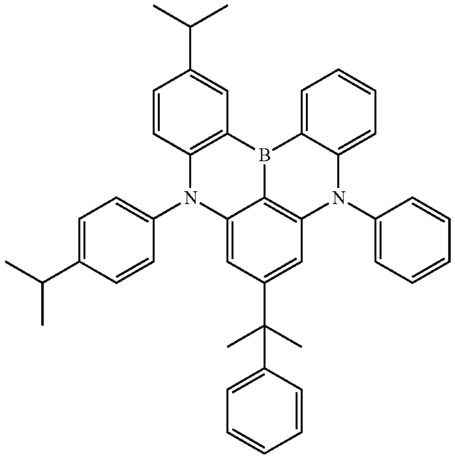
(F-19)
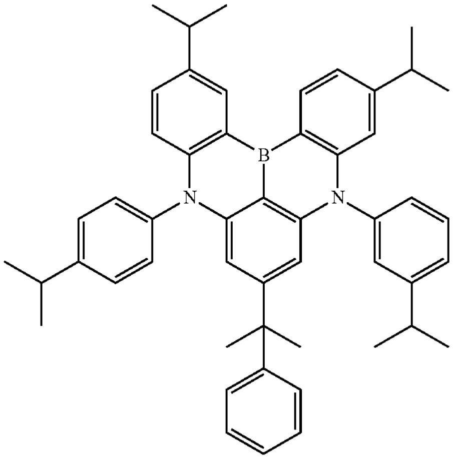
(F-20)
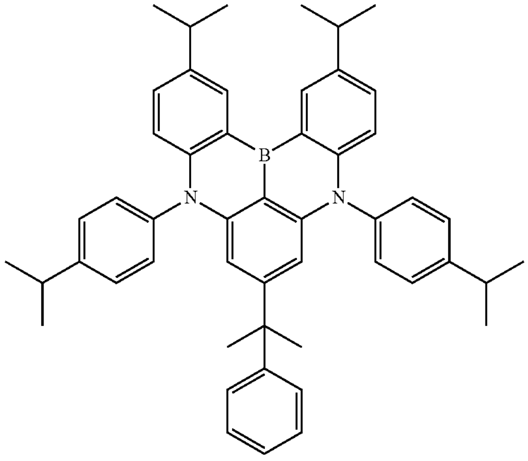

-continued
(F-21)
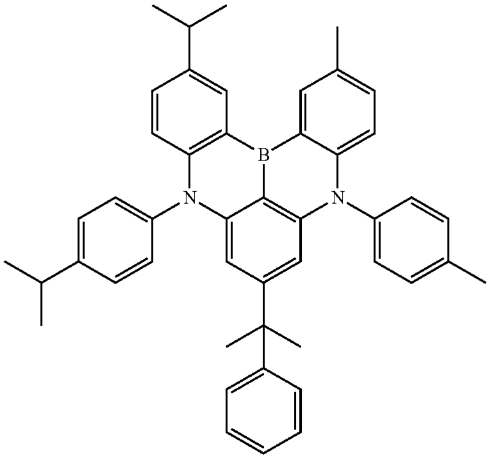
(F-22)
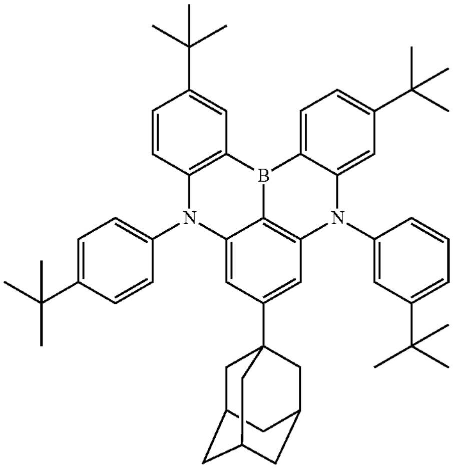
(F-23)
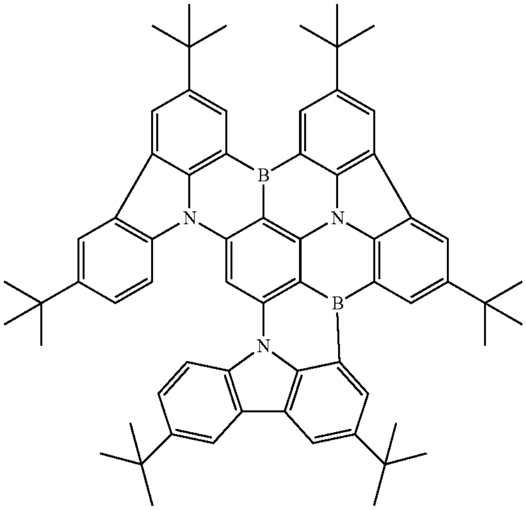
(F-24)
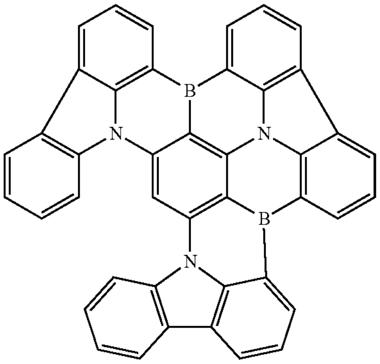
(F-25)
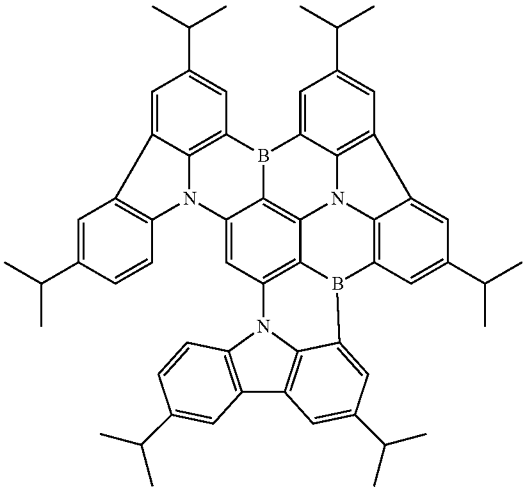
(F-26)
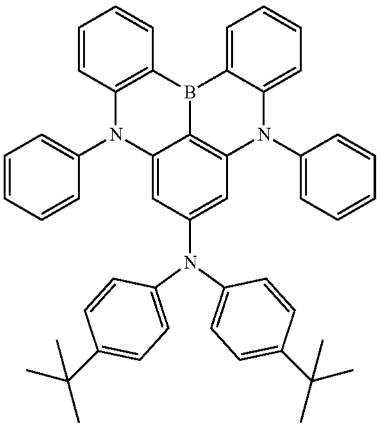

-continued
(F-27)
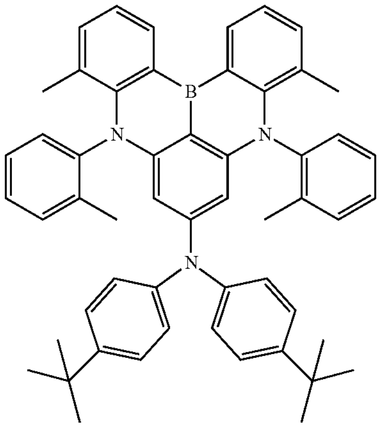
(F-28)
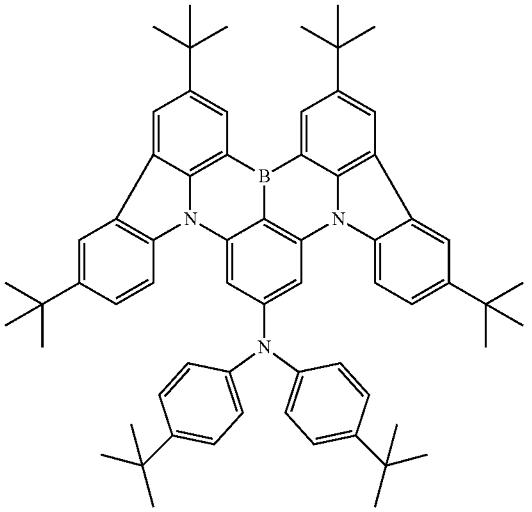
(F-29)
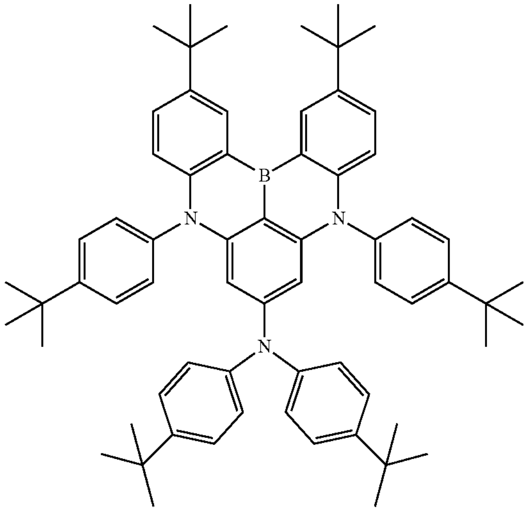
(F-30)
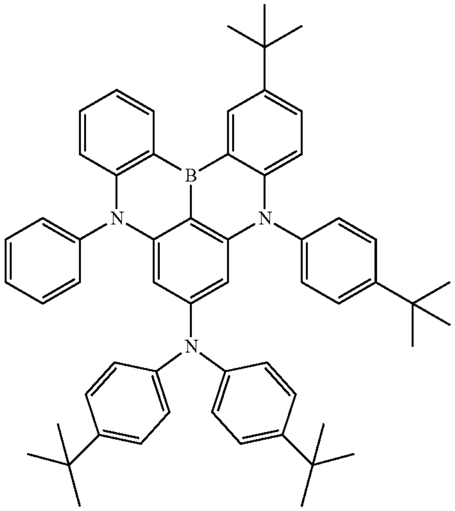
(F-31)
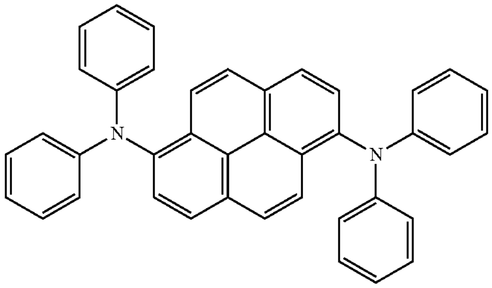
(F-32)
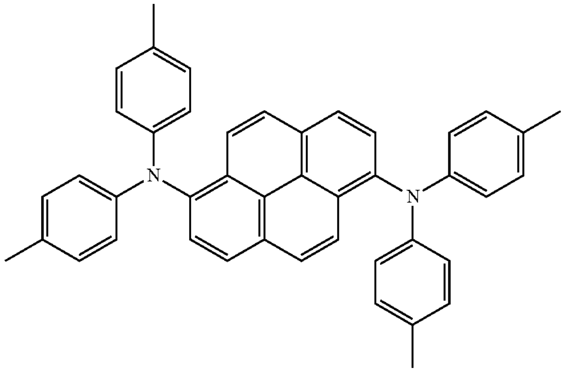

-continued
(F-33)
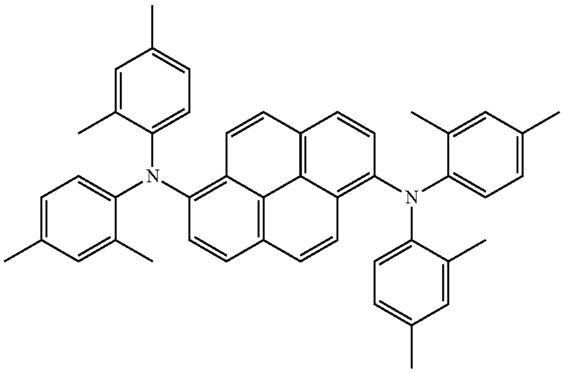
(F-34)
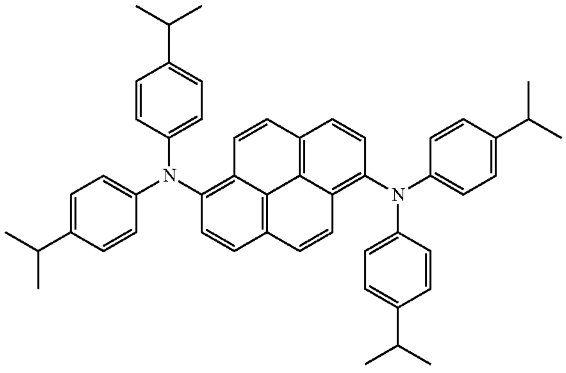
(F-35)
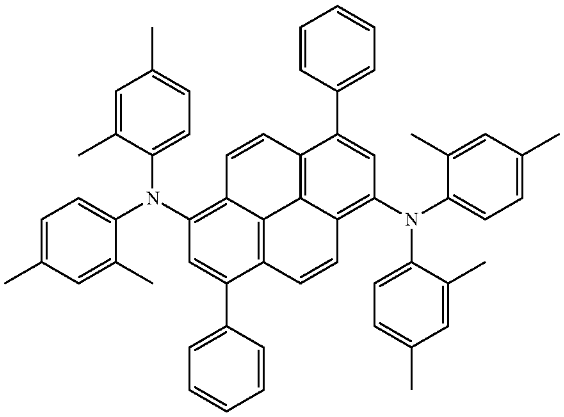
(F-36)
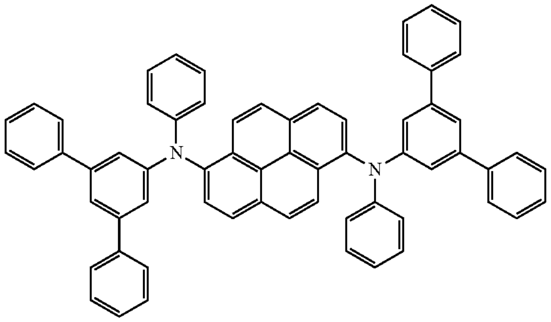
(F-37)
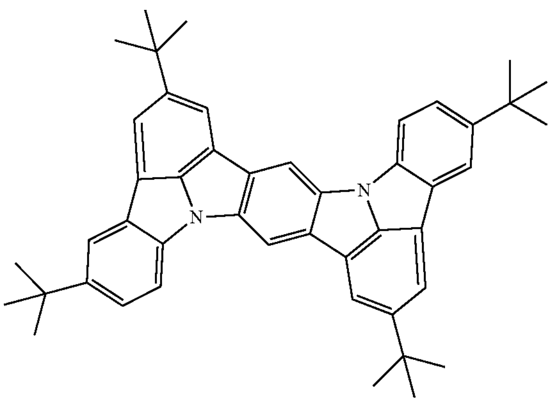
(F-38)
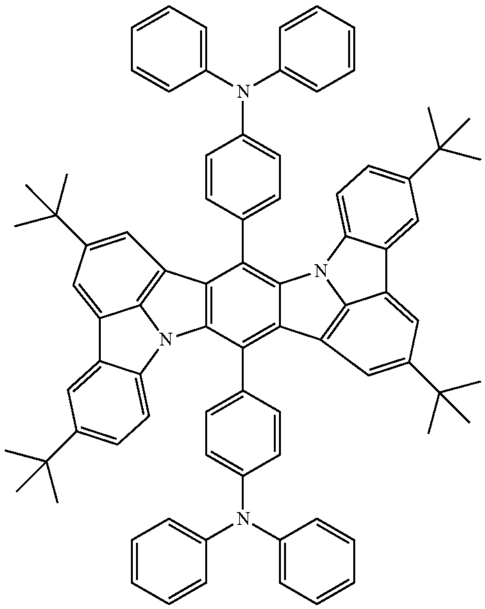

-continued
(F-39)
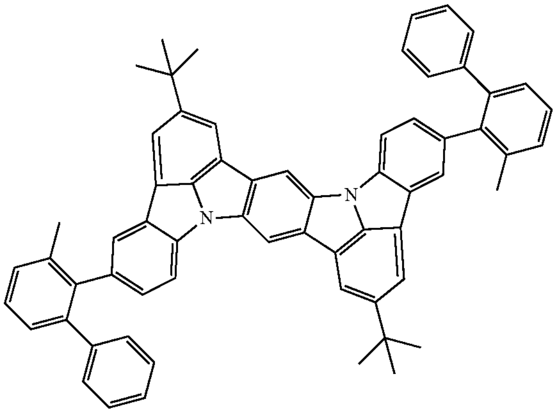
(F-40)
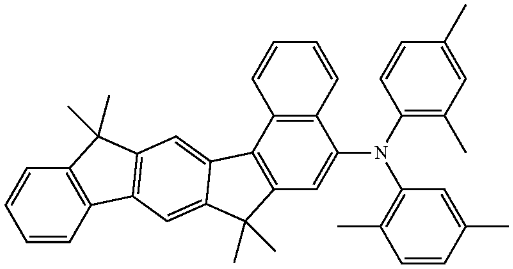
(F-41)
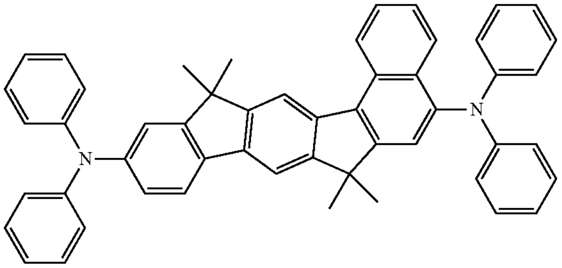
(F-42)
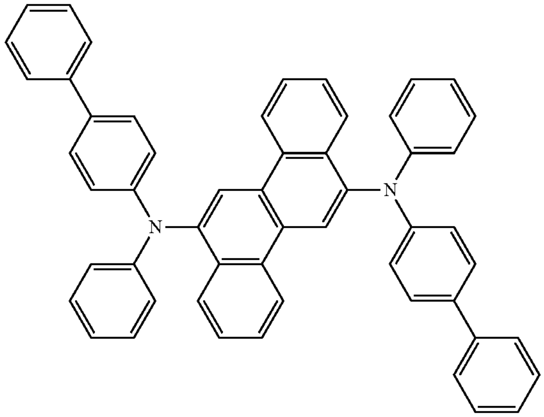
(F-43)
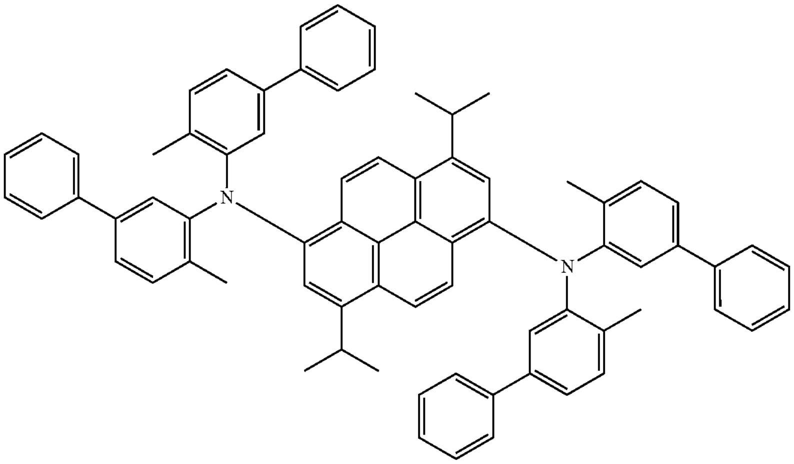

-continued
(F-44)
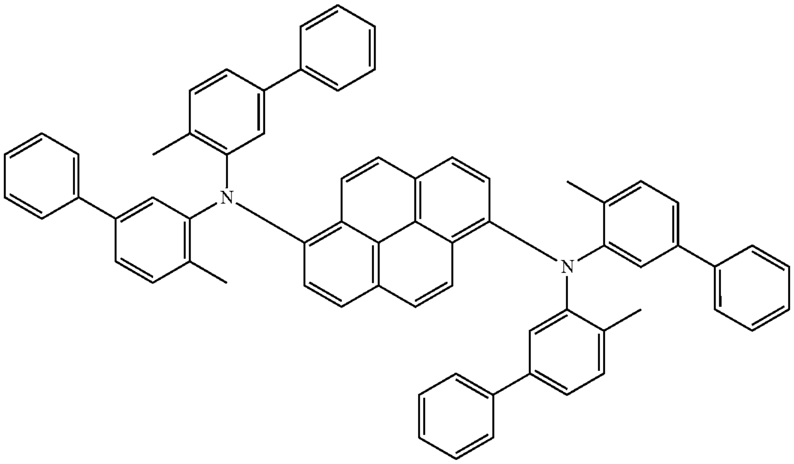
(F-45)
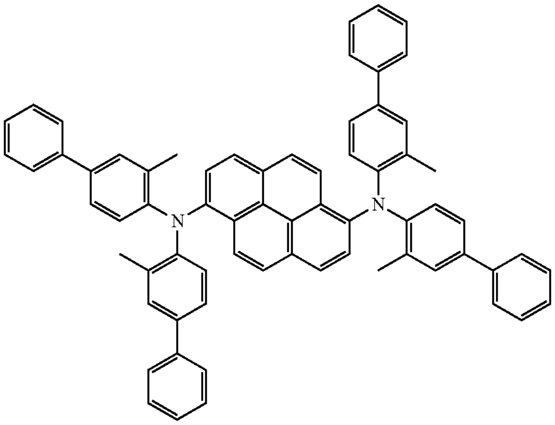
(F-46)
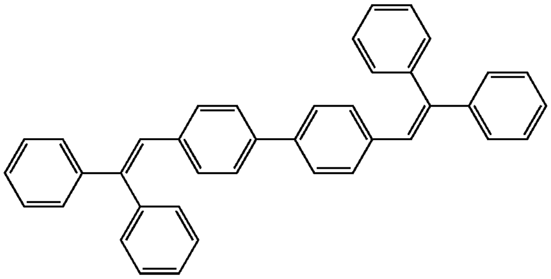
(F-47)
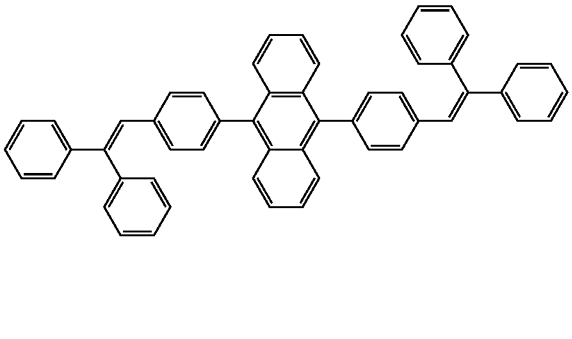
(F-48)
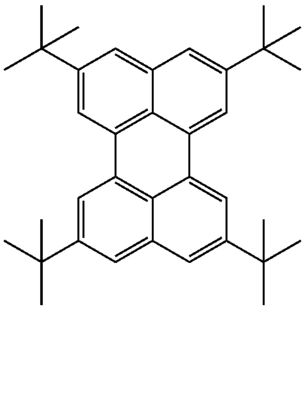

-continued
(F-49)
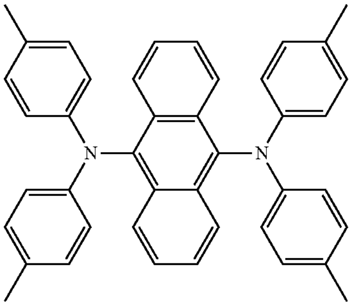
(F-50)
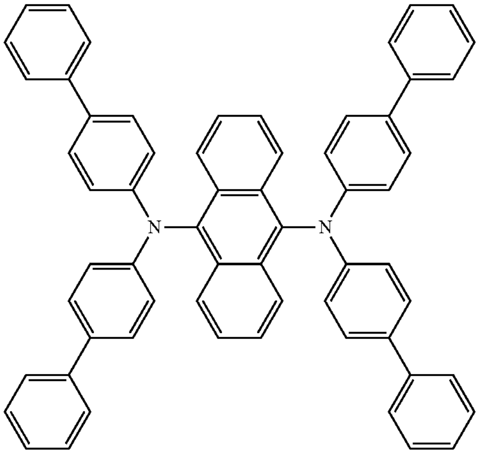
(F-51)
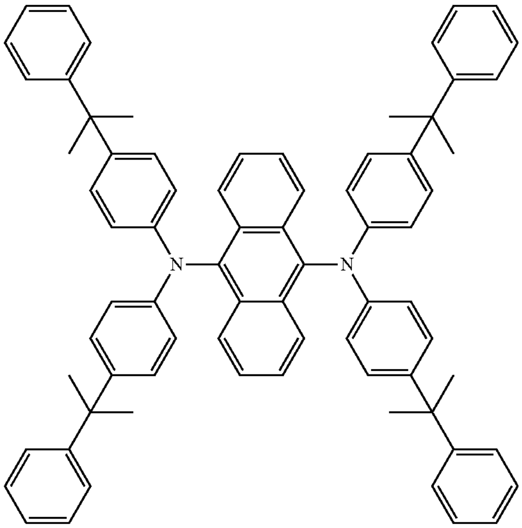
(F-52)
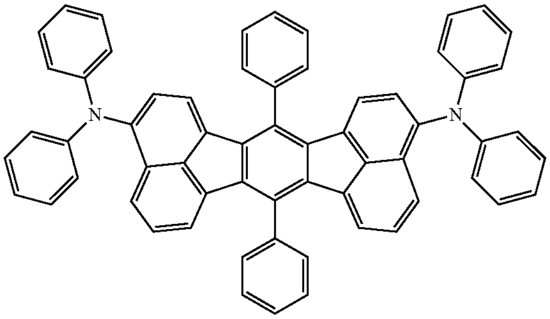
(F-53)
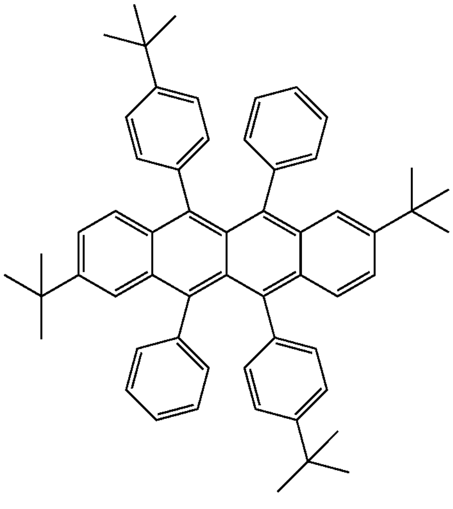
(F-54)
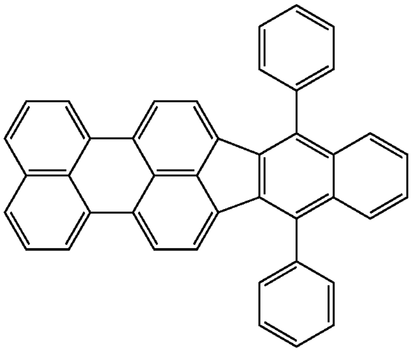

-continued

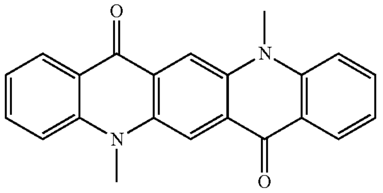

(F-55)

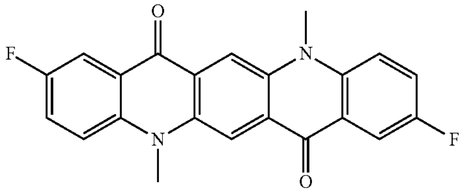

(F-56)

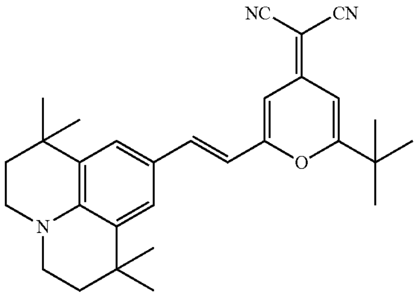

(F-57)

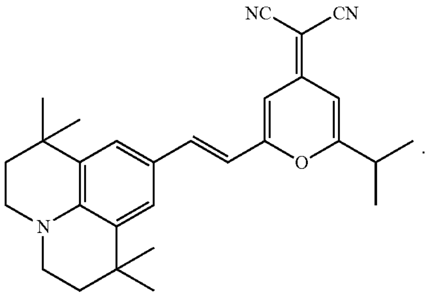

(F-58)

3. The organic electroluminescent device according to claim 1, wherein a charge generation layer is disposed between the first organic electroluminescent unit and the second organic electroluminescent unit.

4. The organic electroluminescent device according to claim 1, wherein the first electrode is an anode, and the second electrode is a cathode; and the first organic electroluminescent unit is closer to the second electrode than the second organic electroluminescent unit, and the second organic electroluminescent unit is closer to the first electrode than the first organic electroluminescent unit.

5. The organic electroluminescent device according to claim 1, wherein a thickness of the first light-emitting layer is greater than or equal to a thickness of the second light-emitting layer.

6. The organic electroluminescent device according to claim 1, wherein the first organic electroluminescent unit further comprises any one or at least two of a first hole injection layer, a first hole transport layer, a first electron blocking layer, a first hole blocking layer, a first electron transport layer or a first electron injection layer.

7. The organic electroluminescent device according to claim 1, further comprising:

a capping layer disposed on the second electrode.

8. A display apparatus, comprising the organic electroluminescent device according to claim 1.

9. The organic electroluminescent device according to claim 1, wherein a triplet energy level of the second host material is less than a triplet energy level of the second fluorescent dye.

10. The organic electroluminescent device according to claim 1, wherein a triplet energy level of the first host material is greater than a triplet energy level of the second host material.

11. The organic electroluminescent device according to claim 1, wherein the second organic electroluminescent unit further comprises any one or at least two of a second hole injection layer, a second hole transport layer, a second electron blocking layer, a second hole blocking layer, a second electron transport layer or a second electron injection layer.

12. The organic electroluminescent device according to claim 1, wherein the first organic electroluminescent unit further comprises any one or at least two of a first hole injection layer, a first hole transport layer, a first electron blocking layer, a first hole blocking layer, a first electron transport layer or a first electron injection layer; and the second organic electroluminescent unit further comprises any one or at least two of a second hole injection layer, a second hole transport layer, a second electron blocking layer, a second hole blocking layer, a second electron transport layer or a second electron injection layer.

* * * * *